(12) United States Patent
Yoon et al.

(10) Patent No.: US 10,811,622 B2
(45) Date of Patent: Oct. 20, 2020

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: Samsung Electronics Co., Ltd., Suwon-si, Gyeonggi-do (KR)

(72) Inventors: Seongjun Yoon, Yongin-si (KR); Seungyeon Kwak, Suwon-si (KR); Soyeon Kim, Seoul (KR); Chul Baik, Suwon-si (KR); Jungin Lee, Hwaseong-si (KR); Hwayoung Cho, Hwaseong-si (KR); Kyuyoung Hwang, Anyang-si (KR); Ohyun Kwon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 363 days.

(21) Appl. No.: 15/910,201

(22) Filed: Mar. 2, 2018

(65) Prior Publication Data

US 2018/0254418 A1 Sep. 6, 2018

(30) Foreign Application Priority Data

Mar. 2, 2017 (KR) .................. 10-2017-0027331

(51) Int. Cl.
*C09K 11/06* (2006.01)
*H05B 33/14* (2006.01)
(Continued)

(52) U.S. Cl.
CPC ...... *H01L 51/0087* (2013.01); *C07F 15/0086* (2013.01); *C09K 11/06* (2013.01);
(Continued)

(58) Field of Classification Search
CPC ............. H01L 51/0087; H01L 51/5016; H01L 2251/552; C07F 15/0086; C09K 11/06;
(Continued)

(56) References Cited

U.S. PATENT DOCUMENTS

2013/0274473 A1 10/2013 Che et al.
2016/0240800 A1* 8/2016 Ma ..................... C07F 15/0033
(Continued)

FOREIGN PATENT DOCUMENTS

KR 10-2018-0005128 A 1/2018

*Primary Examiner* — William K Cheung
(74) *Attorney, Agent, or Firm* — Cantor Colburn LLP

(57) ABSTRACT

An organometallic compound represented by Formula 1:

Formula 1

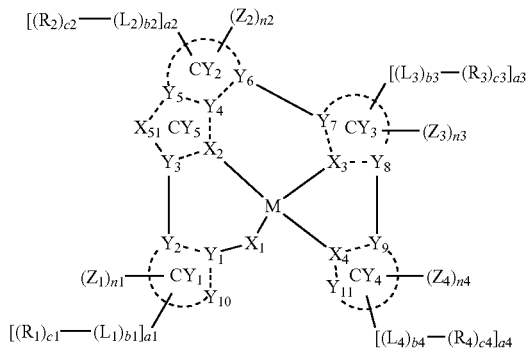

wherein, in Formula 1, groups and variables are the same as described in the specification.

20 Claims, 1 Drawing Sheet

| 10 |
|---|
| 19 |
| 15 |
| 11 |

(51) Int. Cl.
  *H01L 51/00* (2006.01)
  *C07F 15/00* (2006.01)
  *H01L 51/50* (2006.01)
(52) U.S. Cl.
  CPC .............. *C09K 2211/1044* (2013.01); *C09K 2211/185* (2013.01); *H01L 51/5016* (2013.01); *H01L 2251/552* (2013.01)
(58) Field of Classification Search
  CPC ...... C09K 2211/1044; C09K 2211/185; H05B 33/14
  USPC ........................................................ 428/690
  See application file for complete search history.

(56) References Cited

U.S. PATENT DOCUMENTS

2018/0013078 A1    1/2018  Lee et al.
2018/0244706 A1*   8/2018  Lee .................... C07F 15/0086

\* cited by examiner

10

| |
|---|
| 19 |
| 15 |
| 11 |

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims priority to Korean Patent Application No. 10-2017-0027331, filed on Mar. 2, 2017, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have superior characteristics in terms of a viewing angle, a response time, a brightness, a driving voltage, and a response speed, and which produce full-color images.

A typical organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

One or more embodiments include an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to one or more embodiments, an organometallic compound is represented by Formula 1:

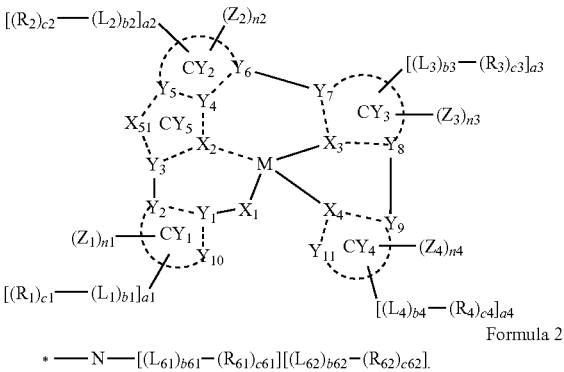

Formula 1

$$* \text{---} N \text{---} [(L_{61})_{b61}\text{-}(R_{61})_{c61}][(L_{62})_{b62}\text{-}(R_{62})_{c62}].$$

Formula 2

In Formulae 1 and 2,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ may be O or S, and a bond between $X_1$ and M may be a covalent bond, $X_2$ to $X_4$ may each independently be N or C, one bond selected from a bond between $X_2$ and M, a bond between $X_3$ and M, and a bond between $X_4$ and M may be a covalent bond, and the others thereof may each be a coordinate bond, $Y_1$ to $Y_9$ may each independently be C or N, $Y_{10}$ and $Y_{11}$ may each independently be C, N, O, Si, or S, $Y_1$ and $Y_{10}$, $Y_1$ and $Y_2$, $X_2$ and $Y_3$, $X_2$ and $Y_4$, $Y_4$ and $Y_5$, $X_{51}$ and $Y_3$, $X_{51}$ and $Y_5$, $Y_4$ and $Y_6$, $X_3$ and $Y_7$, $X_3$ and $Y_5$, $X_4$ and $Y_9$, and $X_4$ and $Y_{11}$ may each be linked via a chemical bond, a bond between $Y_2$ and $Y_3$, a bond between $Y_6$ and $Y_7$, and a bond between $Y_8$ and $Y_9$ may each be a single bond, $CY_1$ to $CY_5$ may each independently be a $C_5$-$C_{30}$ carbocyclic group or a $C_1$-$C_{30}$ heterocyclic group, a cyclometallated ring formed by $CY_5$, $CY_2$, $CY_3$, and M may be a 6-membered ring, $X_{51}$ may be O, S, N[$(L_7)_{b7}$-$(R_7)_{c7}$], C[$(L_7)_{b7}$-$(R_7)_{c7}$] [$(L_8)_{b8}$-$(R_8)_{c8}$], Si[$(L_7)_{b7}$-$(R_7)_{c7}$][$(L_8)_{b8}$-$(R_8)_{c8}$], C(=O), N, C[$(L_7)_{b7}$-$(R_7)_{c7}$], or Si[$(L_7)_{b7}$-$(R_7)_{c7}$], $R_7$ and $R_8$ may optionally be linked via a first linking group to form a substituted or unsubstituted $C_5$-$C_{30}$ carbocyclic group or a substituted or unsubstituted $C_1$-$C_{30}$ heterocyclic group, $L_1$ to $L_4$, $L_7$, $L_8$, $L_{61}$, and $L_{62}$ may each independently be selected from a single bond, a substituted or unsubstituted $C_5$-$C_{30}$ carbocyclic group, and a substituted or unsubstituted $C_1$-$C_{30}$ heterocyclic group, b1 to b4, b7, b8, b61, and b62 may each independently be an integer from 1 to 5, $R_1$ to $R_4$, $R_7$, $R_8$, $R_{61}$, and $R_{62}$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_3$)($Q_4$)($Q_5$), —B($Q_6$)($Q_7$), and —P(=O)($Q_8$)($Q_9$), c1 to c4, c7, c8, c61, and c62 may each independently be an integer from 1 to 5, $Z_1$ to $Z_4$ may each independently be a group represented by Formula 2, a1 to a4 and n1 to n4 may each independently be an integer from 0 to 20, two in a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two in a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two in a plurality of groups $R_3$ may optionally be linked to form a substituted or unsubstituted $C_5$-$C_{30}$ carbocyclic group or a substituted or unsubstituted $C_1$-$C_{30}$ heterocyclic group, two in a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, two or more in $R_1$ to $R_4$ may optionally be linked to form a substituted or unsubstituted $C_5$-$C_{30}$ carbocyclic group or a substituted or unsubstituted $C_1$-$C_{30}$ heterocyclic group, i) when $X_{51}$ is O, S, C(=O), or N, the sum of n1, n2, n3, and n4 may be one or more, ii) when $X_{51}$ is N[($L_7$)$_{b7}$-($R_7$)$_{c7}$], C[($L_7$)$_{b7}$-($R_7$)$_{c7}$], or Si[($L_7$)$_{b7}$-($R_7$)$_{c7}$], $R_7$ may be a group represented by Formula 2 or the sum of n1, n2, n3, and n4 may be one or more, and iii) when $X_{51}$ is C[($L_7$)$_{b7}$-($R_7$)$_{c7}$][($L_8$)$_{b8}$-($R_8$)$_{c8}$] or Si[($L_7$)$_{b7}$-($R_7$)$_{c7}$][($L_8$)$_{b8}$-($R_8$)$_{c8}$], at least one of $R_7$ and $R_8$ may be a group represented by Formula 2 or the sum of n1, n2, n3, and n4 may be one or more,

* indicates a binding site to a neighboring atom, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_3$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

According to one or more embodiments, an organic light-emitting device includes:
a first electrode;
a second electrode; and
an organic layer that is disposed between the first electrode and the second electrode,
wherein the organic layer includes an emission layer and at least one organometallic compound described above.

The organometallic compound may act as a dopant in the organic layer.

According to one or more embodiments, a diagnostic composition includes at least one organometallic compound represented by Formula 1.

BRIEF DESCRIPTION OF THE DRAWING

These and/or other aspects will become apparent and more readily appreciated from the following description of the embodiments, taken in conjunction with the FIGURE is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section.

Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided. The organometallic compound according to an embodiment may be represented by Formula 1:

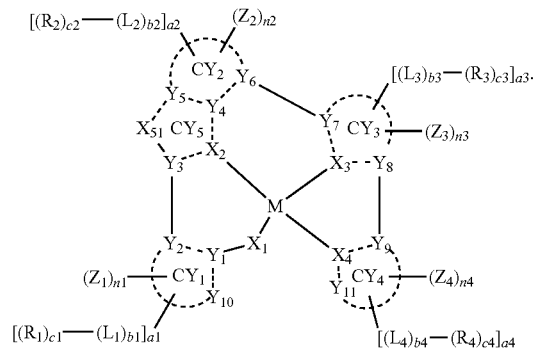

Formula 1

$Z_1$ to $Z_4$ in Formula 1 may each independently be a group represented by Formula 2:

$$*-N-[(L_{61})_{b61}-(R_{61})_{c61}][(L_{62})_{b62}-(R_{62})_{c62}].$$  Formula 2

Formula 2 is the same as described herein.

M in Formula 1 may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

For example, M in Formula 1 may be platinum, but embodiments of the present disclosure are not limited thereto.

The organometallic compound represented by Formula 1 may be a neutral compound that does not consist of an ion pair of an anion and a cation.

In Formula 1, $X_1$ may be O or S, and a bond between $X_1$ and M may be a covalent bond.

For example, $X_1$ in Formula 1 may be O, but embodiments of the present disclosure are not limited thereto.

In Formula 1, $X_2$ to $X_4$ may each independently be N or C, one bond selected from a bond between $X_2$ and M, a bond between $X_3$ and M, and a bond between $X_4$ and M may be a covalent bond, and the others thereof may each be a coordinate bond.

For example, in Formula 1, i) $X_2$ and $X_4$ may be N, $X_3$ may be C, a bond between $X_2$ and M and a bond between $X_4$ and M may each be a coordinate bond, and a bond between $X_3$ and M may be a covalent bond;

ii) $X_2$ and $X_3$ may be N, $X_4$ may be C, a bond between $X_2$ and M and a bond between $X_3$ and M may each be a coordinate bond, and a bond between $X_4$ and M may be a covalent bond; or iii) $X_3$ and $X_4$ may be N, $X_2$ may be C, a bond between $X_3$ and M and a bond between $X_4$ and M may each be a coordinate bond, and a bond $X_2$ and M may be a covalent bond.

In Formula 1, $Y_1$ to $Y_9$ may each independently be C or N, and $Y_{10}$ and $Y_{11}$ may each independently be C, N, O, Si, or S.

For example, in Formula 1, $Y_1$ to $Y_9$ may each be C, and $Y_{10}$ and $Y_{11}$ may each independently be C or N, but embodiments of the present disclosure are not limited thereto.

In Formula 1, $Y_1$ and $Y_{10}$, $Y_1$ and $Y_2$, $X_2$ and $Y_3$, $X_2$ and $Y_4$, $Y_4$ and $Y_5$, $X_{51}$ and $Y_3$, $X_{51}$ and $Y_5$, $Y_4$ and $Y_6$, $X_3$ and $Y_7$, $X_3$ and $Y_5$, $X_4$ and $Y_9$, and $X_4$ and $Y_{11}$ may each be linked via a chemical bond.

$CY_1$ to $CY_5$ in Formula 1 may each independently be a $C_5$-$C_{30}$ carbocyclic group or a $C_1$-$C_{30}$ heterocyclic group.

In an embodiment, in Formula 1, $CY_1$, $CY_2$, and $CY_4$ may each independently be a 6-membered ring group, $CY_3$ may be selected from a 6-membered ring group, a fluorene group, a carbazole group, a dibenzofuran group, a dibenzothiophene group, a dibenzosilole group, an azafluorene group, an azacarbazole group, an azadibenzofuran group, an azadibenzothiophene group, and an azadibenzosilole group, and $CY_5$ may be a 5-membered ring group.

In one or more embodiments, $CY_1$ to $CY_4$ in Formula 1 may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, but embodiments of the present disclosure are not limited thereto.

A cyclometallated ring formed by $CY_5$, $CY_2$, $CY_3$, and M in Formula 1 may be a 6-membered ring.

In Formula 1, $X_{51}$ may be selected from O, S, N[$(L_7)_{b7}$-$(R_7)_{c7}$], C[$(L_7)_{b7}$-$(R_7)_{c7}$][$(L_8)_{b8}$-$(R_8)_{c8}$], Si[$(L_7)_{b7}$-$(R_7)_{c7}$][$(L_8)_{b8}$-$(R_8)_{c8}$], C(=O), N, C[$(L_7)_{b7}$-$(R_7)_{c7}$], and Si[$(L_7)_{b7}$-$(R_7)_{c7}$], and $R_7$ and $R_8$ may optionally be linked via a first linking group to form a substituted or unsubstituted $C_5$-$C_{30}$ carbocyclic group or a substituted or unsubstituted $C_1$-$C_{30}$ heterocyclic group (for example, a $C_5$-$C_6$ 5-membered to 7-membered cyclic group; or a $C_5$-$C_6$ 5-membered to 7-membered cyclic group substituted with at least one selected from deuterium, a cyano group, —F, $C_1$-$C_{10}$ alkyl group, and a $C_6$-$C_{14}$ aryl group). $L_7$, $L_8$, b7, b8, $R_7$, $R_8$, c7, and c8 are each independently the same as described below.

The first linking group may be selected from a single bond, *—O—*', *—S—*', —C($R_5$)($R_6$)—*', *—C($R_5$)=*', *=C($R_6$)—*', *—C($R_5$)=C($R_6$)—*', *—C(=O)—*', *—C(=S)—*', *—C≡C—*', *—N($R_5$)—*', *—Si($R_5$)($R_6$)—*', and *—P($R_5$)($R_6$)—*', $R_5$ and $R_6$ are each independently the same as described in connection with $R_1$, and * and *' each indicate a binding site to a neighboring atom.

$L_1$ to $L_4$, $L_7$, $L_8$, $L_{61}$, and $L_{62}$ in Formulae 1 and 2 may each independently be selected from a single bond, a substituted or unsubstituted $C_5$-$C_{30}$ carbocyclic group, and a substituted or unsubstituted $C_1$-$C_{30}$ heterocyclic group.

For example, $L_1$ to $L_4$, $L_7$, $L_8$, $L_{61}$, and $L_{62}$ in Formulae 1 and 2 may each independently be selected from:

a single bond, a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group; and a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_{31}$ to $Q_{39}$ may each independently be selected from:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, a biphenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, a biphenyl group, and a naphthyl group, each substituted with at least one selected from deuterium, a $C_1$-$C_{10}$ alkyl group, and a phenyl group, but embodiments of the present disclosure are not limited thereto.

In an embodiment, $L_1$ to $L_4$, $L_7$, $L_8$, $L_{61}$, and $L_{62}$ in Formulae 1 and 2 may each independently be selected from:

a single bond, a benzene group, a pyridine group, and a pyrimidine group; and a benzene group, a pyridine group, and a pyrimidine group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pyridinyl group, a pyrimidinyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$) (wherein $Q_{31}$ to $Q_{39}$ are each independently the same as described herein), but embodiments of the present disclosure are not limited thereto.

b1, b2, b3, b4, b7, b8, b61, and b62 in Formulae 1 and 2 respectively indicate the number of groups $L_1$, the number of groups $L_2$, the number of groups $L_3$, the number of groups $L_4$, the number of groups $L_7$, the number of groups $L_8$, the number of groups $L_{61}$, and the number of groups $L_{62}$, and may each independently be an integer from 1 to 5. b1 to b4, b7, b8, b61, and b62 may each independently be 1 or 2, but embodiments of the present disclosure are not limited thereto.

$R_1$ to $R_4$, $R_7$, $R_8$, $R_{61}$, and $R_{62}$ in Formulae 1 and 2 may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_3$)($Q_4$)($Q_5$), —B($Q_6$)($Q_7$), and —P(=O)($Q_8$)($Q_9$).

For example, $R_1$ to $R_4$, $R_7$, $R_8$, $R_{61}$, and $R_{62}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si(Q$_{33}$)(Q$_{34}$)(Q$_{35}$); and —Si(Q$_3$)(Q$_4$)(Q$_5$), —B(Q$_6$)(Q$_7$), and —P(=O)(Q$_8$)(Q$_9$), and $Q_3$ to $Q_9$ and $Q_{33}$ to $Q_{35}$ are each independently the same as described herein.

In an embodiment, $R_1$ to $R_4$, $R_7$, $R_8$, $R_{61}$, and $R_{62}$ may each independently be selected from:

hydrogen, deuterium, —F, a cyano group, a nitro group, —SF$_5$, a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group;

a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group, each substituted with at least one selected from deuterium, —F, —CD$_3$, —CD$_2$H, —CDH$_2$, —CF$_3$, —CF$_2$H, —CFH$_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, a dibenzosilolyl group, and —Si(Q$_{33}$)(Q$_{34}$)(Q$_{35}$); and —Si(Q$_3$)(Q$_4$)(Q$_5$), —B(Q$_6$)(Q$_7$), and —P(=O)(Q$_8$)(Q$_9$), and $Q_3$ to $Q_9$ and $Q_{33}$ to $Q_{35}$ are each independently the same as described herein, but embodiments of the present disclosure are not limited thereto.

In one or more embodiments, $R_1$ to $R_4$, $R_7$, $R_8$, $R_{61}$, and $R_{62}$ may each independently be selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, groups represented by Formulae 9-1 to 9-19, groups represented by Formulae 10-1 to 10-139, and —Si(Q$_3$)(Q$_4$)(Q$_5$) (wherein $Q_3$ to $Q_9$ are each independently the same as described herein), but embodiments of the present disclosure are not limited thereto:

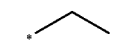

Formula 9-1

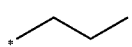

Formula 9-2

-continued

| Formula 9-3 |
| Formula 9-4 |
| Formula 9-5 |
| Formula 9-6 |
| Formula 9-7 |
| Formula 9-8 |
| Formula 9-9 |
| Formula 9-10 |
| Formula 9-11 |
| Formula 9-12 |
| Formula 9-13 |
| Formula 9-14 |
| Formula 9-15 |
| Formula 9-16 |
| Formula 9-17 |
| Formula 9-18 |

-continued

| Formula 9-19 |
| Formula 10-1 |
| Formula 10-2 |
| Formula 10-3 |
| Formula 10-4 |
| Formula 10-5 |
| Formula 10-6 |
| Formula 10-7 |
| Formula 10-8 |
| Formula 10-9 |
| Formula 10-10 |
| Formula 10-11 |

-continued
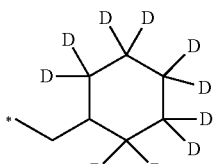
Formula 10-12
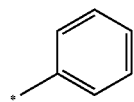
Formula 10-13
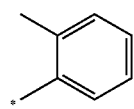
Formula 10-14
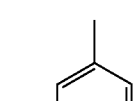
Formula 10-15
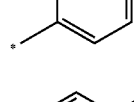
Formula 10-16
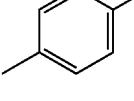
Formula 10-17
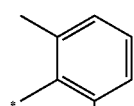
Formula 10-18
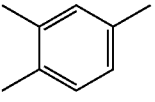
Formula 10-19
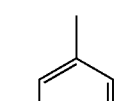
Formula 10-20
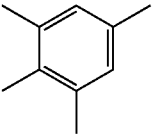
Formula 10-21
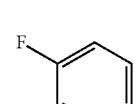
Formula 10-22
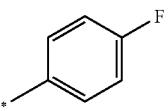
Formula 10-23
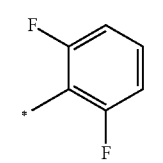
Formula 10-24
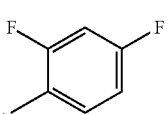
Formula 10-25
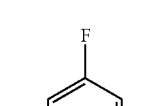
Formula 10-26
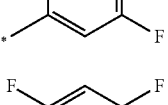
Formula 10-27
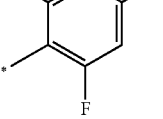
Formula 10-28
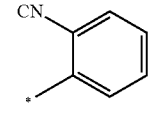
Formula 10-29
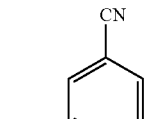
Formula 10-30
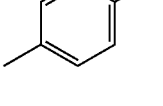
Formula 10-31
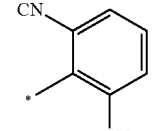
Formula 10-32
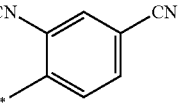
Formula 10-33
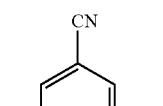

-continued
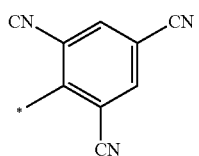
Formula 10-34
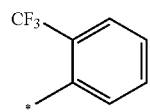
Formula 10-35
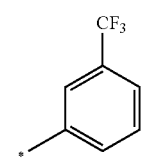
Formula 10-36
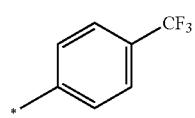
Formula 10-37
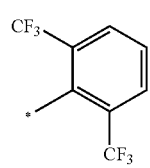
Formula 10-38
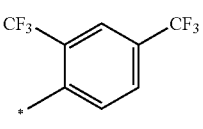
Formula 10-39
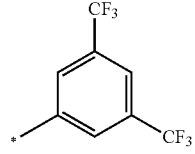
Formula 10-40
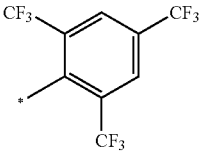
Formula 10-41
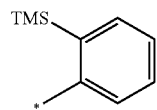
Formula 10-42
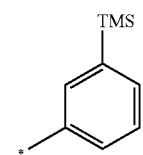
Formula 10-43
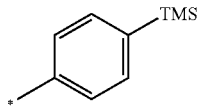
Formula 10-44
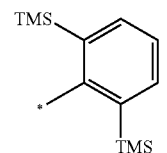
Formula 10-45
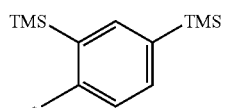
Formula 10-46
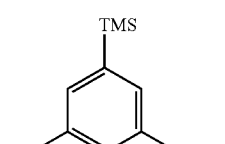
Formula 10-47
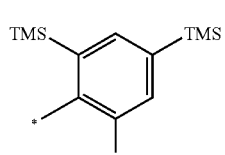
Formula 10-48
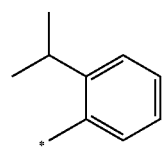
Formula 10-49
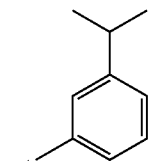
Formula 10-50
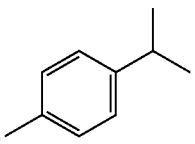
Formula 10-51
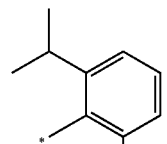
Formula 10-52
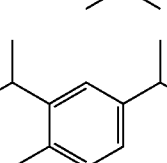
Formula 10-53

-continued
Formula 10-54
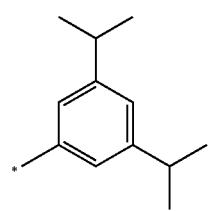
Formula 10-55
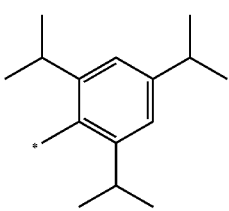
Formula 10-56
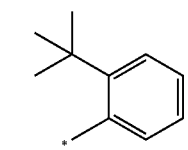
Formula 10-57
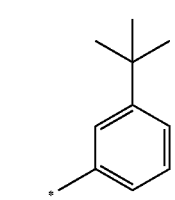
Formula 10-58
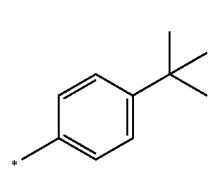
Formula 10-59
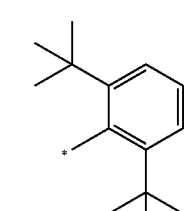
Formula 10-60
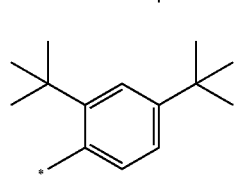
Formula 10-61
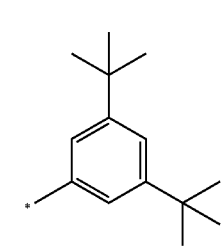
-continued
Formula 10-62
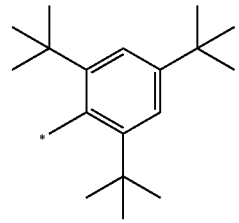
Formula 10-63
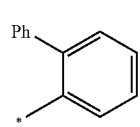
Formula 10-64
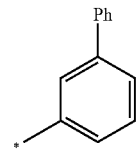
Formula 10-65
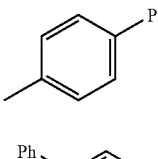
Formula 10-66
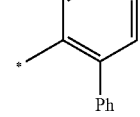
Formula 10-67
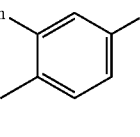
Formula 10-68
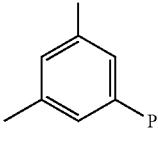
Formula 10-69
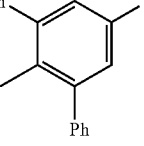
Formula 10-70
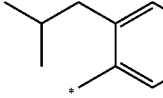
Formula 10-71

-continued
Formula 10-72
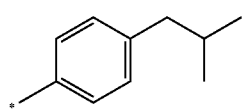
Formula 10-73
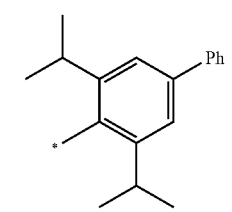
Formula 10-74
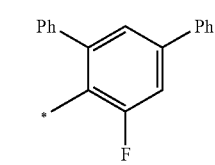
Formula 10-75
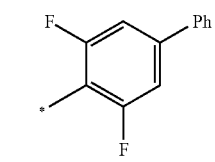
Formula 10-76
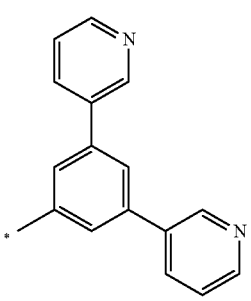
Formula 10-77
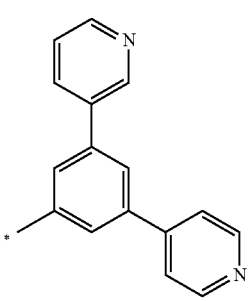
Formula 10-78
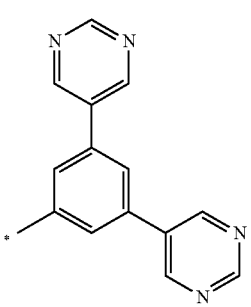
-continued
Formula 10-79
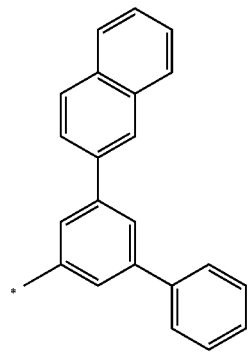
Formula 10-80
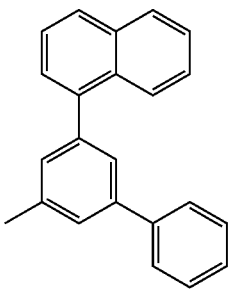
Formula 10-81
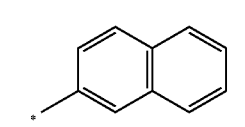
Formula 10-82
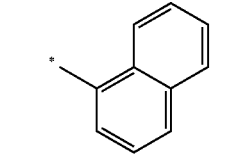
Formula 10-83
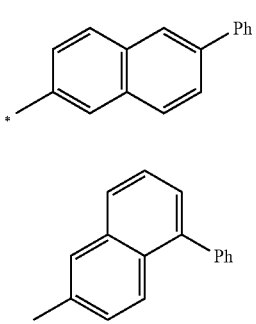
Formula 10-84
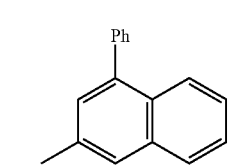
Formula 10-85
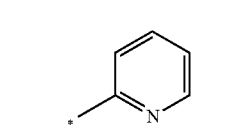
Formula 10-86

Formula 10-87
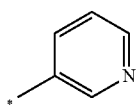
Formula 10-88
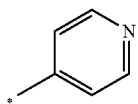
Formula 10-89
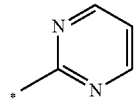
Formula 10-90
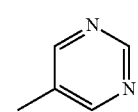
Formula 10-91
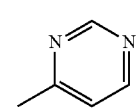
Formula 10-92
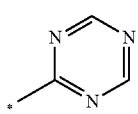
Formula 10-93
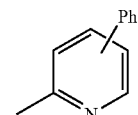
Formula 10-94
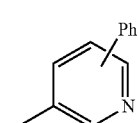
Formula 10-95
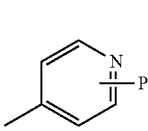
Formula 10-96
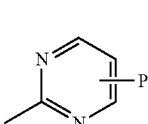
Formula 10-97
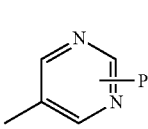
Formula 10-98
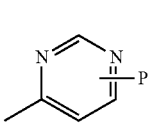
Formula 10-99
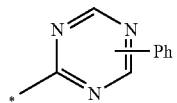
Formula 10-100
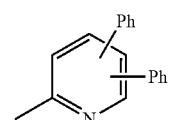
Formula 10-101
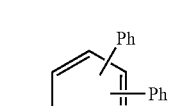
Formula 10-102
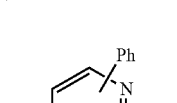
Formula 10-103
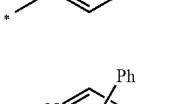
Formula 10-104
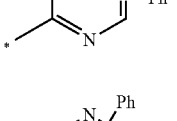
Formula 10-105
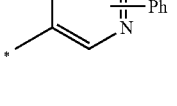
Formula 10-106
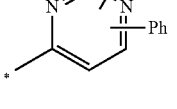
Formula 10-107
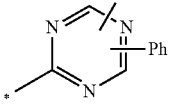
Formula 10-108
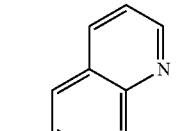

-continued
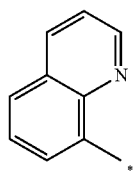
Formula 10-109
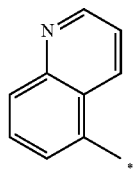
Formula 10-110
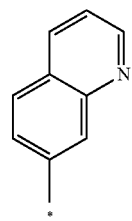
Formula 10-111
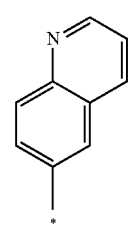
Formula 10-112
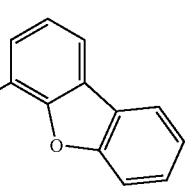
Formula 10-113
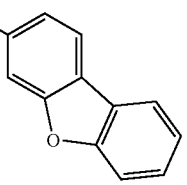
Formula 10-114
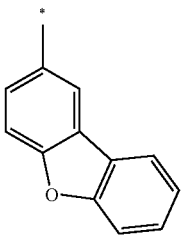
Formula 10-115
-continued
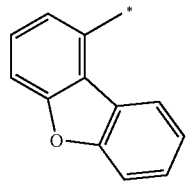
Formula 10-116
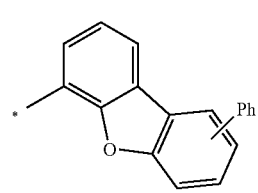
Formula 10-117
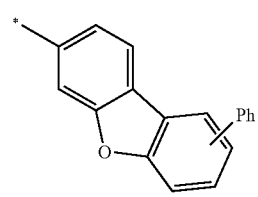
Formula 10-118
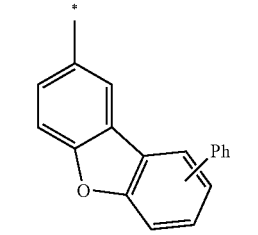
Formula 10-119
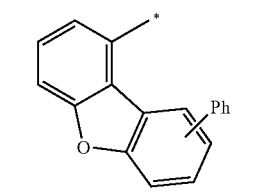
Formula 10-120
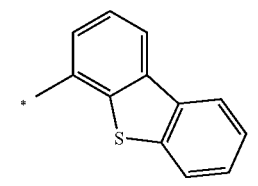
Formula 10-121
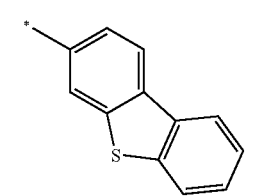
Formula 10-122

-continued
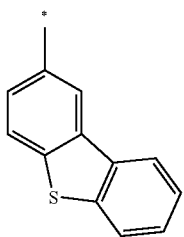
Formula 10-123
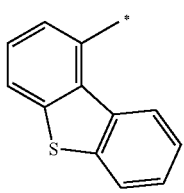
Formula 10-124
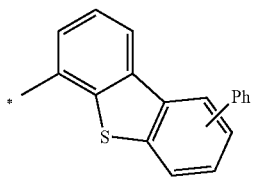
Formula 10-125
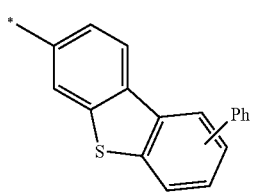
Formula 10-126
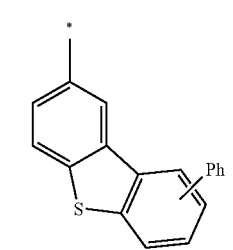
Formula 10-127
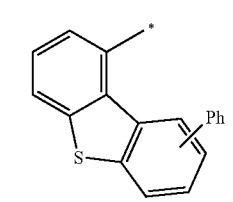
Formula 10-128
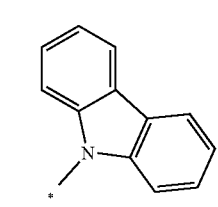
Formula 10-129
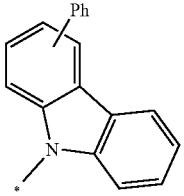
Formula 10-130
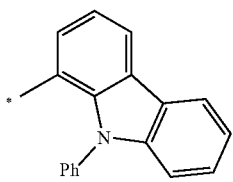
Formula 10-131
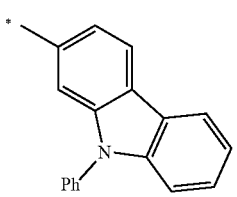
Formula 10-132
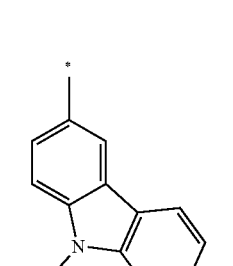
Formula 10-133
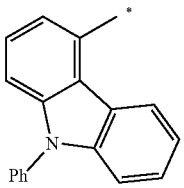
Formula 10-134
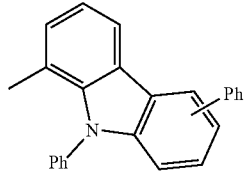
Formula 10-135
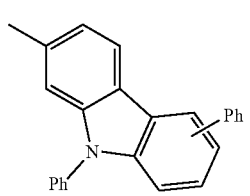
Formula 10-136

-continued

Formula 10-137

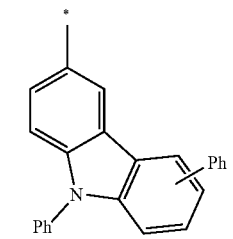

Formula 10-138

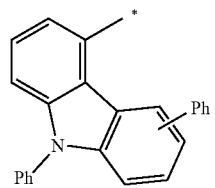

Formula 10-139

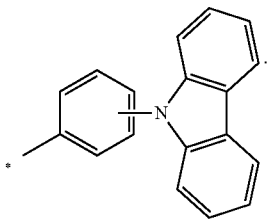

In Formulae 9-1 to 9-19 and 10-1 to 10-139, "Ph" indicates a phenyl group, "TMS" indicates a trimethylsilyl group, and "*" indicates a binding site to a neighboring atom.

c1, c2, c3, c4, c7, c8, c61, and c62 respectively indicate the number of groups $R_1$, the number of groups $R_2$, the number of groups $R_3$, the number of groups $R_4$, the number of groups $R_7$, the number of groups $R_8$, the number of groups $R_{61}$, and the number of groups $R_{62}$, and may each independently be an integer from 1 to 5. When c1 is two or more, two or more groups $R_1$ may be identical to or different from each other. c2 to c4, c7, c8, c61, and c62 are each independently the same as described in connection with c1.

In one or more embodiments, c1 to c4 Formula 1 may each independently be 1 or 2, but embodiments of the present disclosure are not limited thereto.

$Z_1$ to $Z_4$ in Formula 1 may each independently be a group represented by Formula 2.

a1, a2, a3, a4, n1, n2, n3, and n4 in Formula 1 respectively indicate the number of groups $*-[(L_1)_{b1}-(R_1)_{c1}]$, the number of groups $*-[(L_2)_{b2}-(R_2)_{c2}]$, the number of groups $*-[(L_3)_{b3}-(R_3)_{c3}]$, the number of groups $*-[(L_4)_{b4}-(R_4)_{c4}]$, the number of groups $Z_1$, the number of groups $Z_2$, the number of groups $Z_3$, and the number of groups $Z_4$, and may each independently be selected from 0 to 20 (for example, from 0 to 10). When a1 is two or more, two or more groups $*-[(L_1)_{b1}-(R_1)_{c1}]$ may be identical to or different from each other, when a2 is two or more, two or more groups $*-[(L_2)_{b2}-(R_2)_{c2}]$ may be identical to or different from each other, when a3 is two or more, two or more groups $*-[(L_3)_{b3}-(R_3)_{c3}]$ may be identical to or different from each other, when a4 is two or more, two or more groups $*-[(L_4)_{b4}-(R_4)_{c4}]$ may be identical to or different from each other, when n1 is two or more, two or more groups $Z_1$ may be identical to or different from each other, when n2 is two or more, two or more groups $Z_2$ may be identical to or different from each other, when n3 is two or more, two or more groups $Z_3$ may be identical to or different from each other, and when n4 is two or more, two or more groups $Z_4$ may be identical to or different from each other.

a1 to a4 and n1 to n4 in Formula 1 may each independently be 0, 1, 2, or 3.

The sum of n1, n2, n3, and n4 in Formula 1 may be 1 or 2.

For example, in Formula 1, i) n1=1 and n2=n3=n4=0; ii) n2=1 and n1=n3=n4=0; iii) n3=1 and n1=n2=n4=0; or iv) n4=1 and n1=n2=n4=0, but embodiments of the present disclosure are not limited thereto.

In Formula 1, two in a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two in a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two in a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two in a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, and two or more in $R_1$ to $R_4$ may optionally be linked to form a substituted or unsubstituted $C_5$-$C_{30}$ carbocyclic group or a substituted or unsubstituted $C_1$-$C_{30}$ heterocyclic group.

For example, i) a substituted or unsubstituted $C_5$-$C_{30}$ carbocyclic group or a substituted or unsubstituted $C_1$-$C_{30}$ heterocyclic group, formed by linking two in the plurality of neighboring groups $R_1$, ii) a substituted or unsubstituted $C_5$-$C_{30}$ carbocyclic group or a substituted or unsubstituted $C_1$-$C_{30}$ heterocyclic group, formed by linking two in the plurality of neighboring groups $R_2$, iii) a substituted or unsubstituted $C_5$-$C_{30}$ carbocyclic group or a substituted or unsubstituted $C_1$-$C_{30}$ heterocyclic group, formed by linking two in the plurality of neighboring groups $R_3$, iv) a substituted or unsubstituted $C_5$-$C_{30}$ carbocyclic group or a substituted or unsubstituted $C_1$-$C_{30}$ heterocyclic group, formed by linking two in the plurality of neighboring groups $R_4$, and v) a substituted or unsubstituted $C_5$-$C_{30}$ carbocyclic group or a substituted or unsubstituted $C_1$-$C_{30}$ heterocyclic group, formed by linking two or more in $R_1$ to $R_4$ in Formula 1, may each independently be selected from:

a pentadiene group, a cyclohexane group, a cycloheptane group, an adamantane group, a bicycloheptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group;

a pentadiene group, a cyclohexane group, a cycloheptane group, an adamantane group, a bicycloheptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{10}$, but embodiments of the present disclosure are not limited thereto.

$R_{10}$ is the same as described in connection with $R_1$.

"Azabenzothiophene, azabenzofuran, azaindene, azaindole, azabenzosilole, azadibenzothiophene, azadibenzofuran, azafluorene, azacarbazole, and azadibenzosilole" as used herein may mean hetero-rings that respectively have the same backbones as "benzothiophene, benzofuran, indene, indole, azabenzosilole, dibenzothiophene, dibenzofuran, fluorene, carbazole, and dibenzosilole", provided that at least one of carbons forming rings thereof is substituted with nitrogen.

In Formula 1, i) when $X_{51}$ is O, S, C(=O), or N, the sum of n1, n2, n3, and n4 may be one or more, ii) when $X_{51}$ is $N[(L_7)_{b7}\text{-}(R_7)_{c7}]$, $C[(L_7)_{b7}\text{-}(R_7)_{c7}]$, or $Si[(L_7)_{b7}\text{-}(R_7)_{c7}]$, $R_7$ may be a group represented by Formula 2 or the sum of n1, n2, n3, and n4 may be one or more, or iii) when $X_{51}$ is $C[(L_7)_{b7}\text{-}(R_7)_{c7}][(L_8)_{b8}\text{-}(R_8)_{c8}]$ or $Si[(L_7)_{b7}\text{-}(R_7)_{c7}][(L_8)_{b8}\text{-}(R_8)_{c8}]$, at least one of $R_7$ and $R_8$ may be a group represented by Formula 2 or the sum of n1, n2, n3, and n4 may be one or more.

That is, Formula 1 essentially includes at least one group represented by Formula 2.

In one or more embodiments, $X_{51}$ in Formula 1 may be $N\text{-}[(L_7)_{b7}\text{-}(R_7)_{c7}]$, provided that $R_7$ is selected from a substituted or unsubstituted $C_3\text{-}C_{10}$ cycloalkyl group, a substituted or unsubstituted $C_1\text{-}C_{10}$ heterocycloalkyl group, a substituted or unsubstituted $C_3\text{-}C_{10}$ cycloalkenyl group, a substituted or unsubstituted $C_1\text{-}C_{10}$ heterocycloalkenyl group, a substituted or unsubstituted $C_6\text{-}C_{60}$ aryl group, a substituted or unsubstituted $C_6\text{-}C_{60}$ aryloxy group, a substituted or unsubstituted $C_6\text{-}C_{60}$ arylthio group, a substituted or unsubstituted $C_1\text{-}C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, $X_{51}$ in Formula 1 may be $N\text{-}[(L_7)_{b7}\text{-}(R_7)_{c7}]$, provided that $R_7$ is selected from groups represented by Formulae 10-1 to 10-128 and 10-131 to 10-139, but embodiments of the present disclosure are not limited thereto.

In an embodiment, a moiety represented by

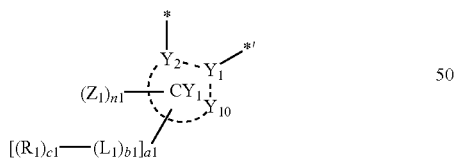

in Formula 1 may be selected from groups represented by Formulae CY1-1 to CY1-26:

Formula CY1-1

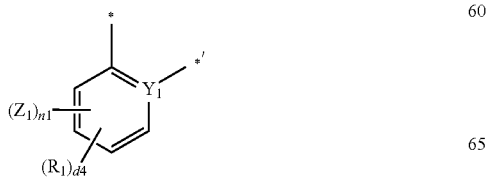

Formula CY1-2

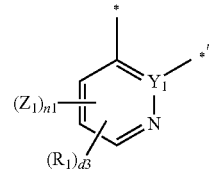

Formula CY1-3

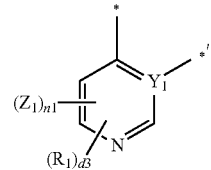

Formula CY1-4

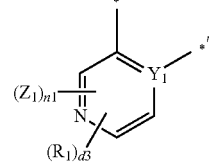

Formula CY1-5

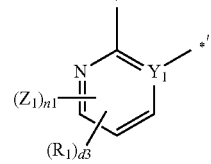

Formula CY1-6

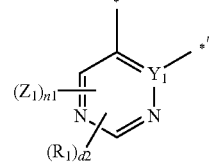

Formula CY1-7

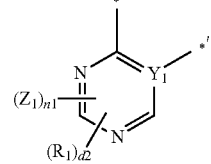

Formula CY1-8

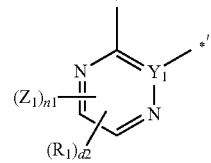

Formula CY1-9

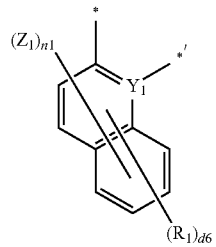

Formula CY1-10
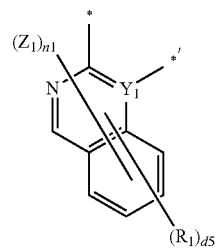
Formula CY1-11
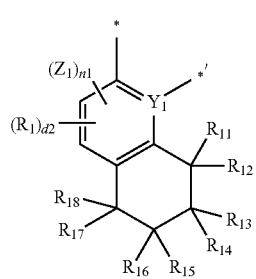
Formula CY1-12
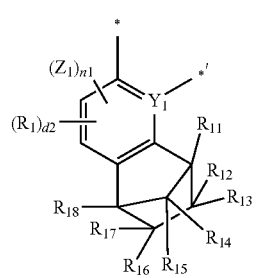
Formula CY1-13
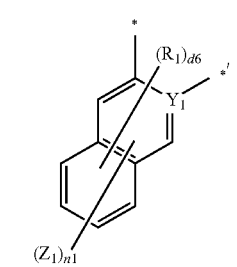
Formula CY1-14
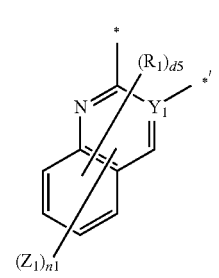
Formula CY1-15
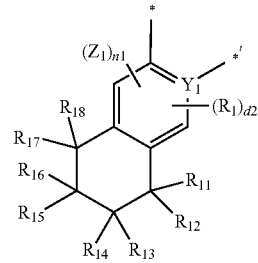
Formula CY1-16
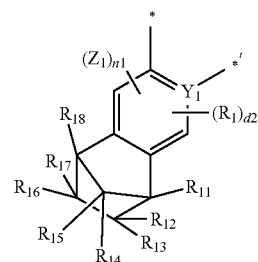
Formula CY1-17
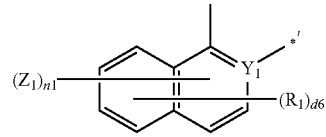
Formula CY1-18
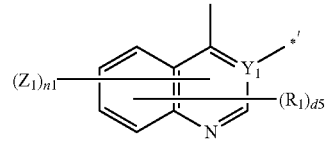
Formula CY1-19
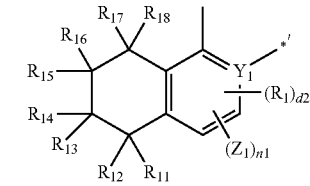
Formula CY1-20
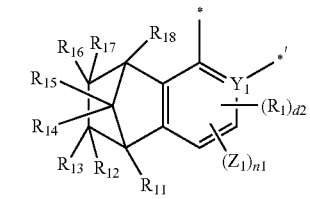
Formula CY1-21
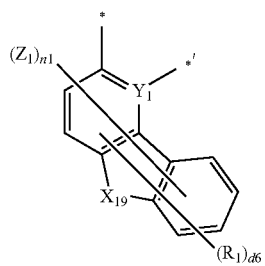

-continued

Formula CY1-22
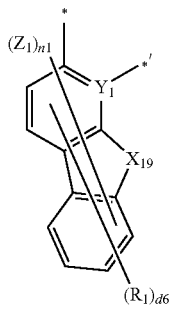

Formula CY1-23
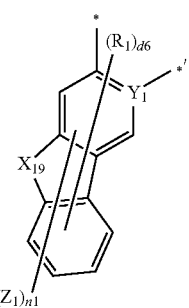

Formula CY1-24
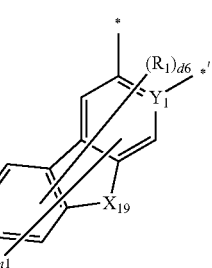

Formula CY1-25
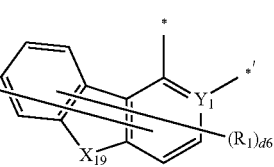

Formula CY1-26
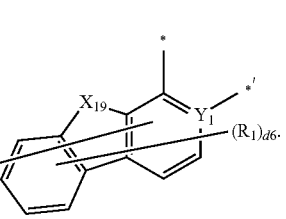

In Formulae CY1-1 to CY1-26, $Y_1$, $R_1$, $Z_1$, and n1 are each independently the same as described herein, provided that n1 is 0, 1, or 2, $X_{19}$ may be $C(R_{19a})(R_{19b})$, $N[(L_{19})_{b19}\text{-}(R_{19})_{c19}]$, O, S, or $Si(R_{19a})(R_{19b})$, $L_{19}$ is the same as described in connection with $L_1$, b19 and c19 are each independently the same as described in connection with b1 and c1, $R_{11}$ to $R_{19}$, $R_{19a}$, and $R_{19b}$ are each independently the same as described in connection with $R_1$, d2 may be an integer from 0 to 2, d3 may be an integer from 0 to 3, d4 may be an integer from 0 to 4, d5 may be an integer from 0 to 5, d6 may be an integer from 0 to 6, and

* and *' each indicate a binding site to a neighboring atom.

In one or more embodiments, a moiety represented by

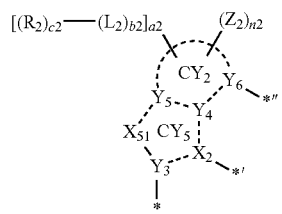

in Formula 1 may be selected from groups represented by Formulae CY2-1 to CY2-12:

Formula CY2-1
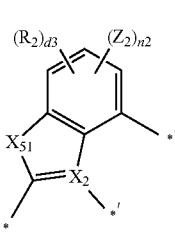

Formula CY2-2
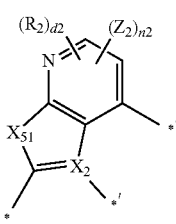

Formula CY2-3
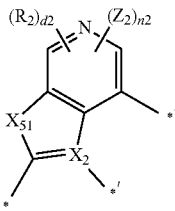

Formula CY2-4
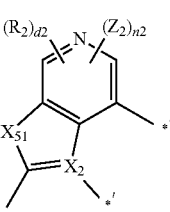

Formula CY2-5
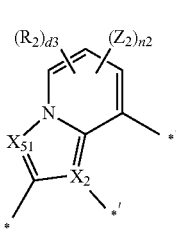

Formula CY2-6

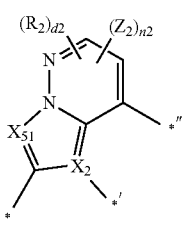

Formula CY2-7

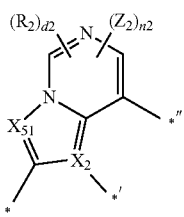

Formula CY2-8

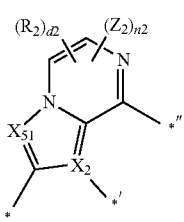

Formula CY2-9

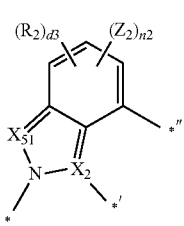

Formula CY2-10

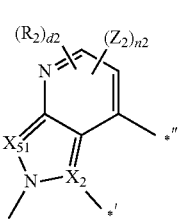

Formula CY2-11

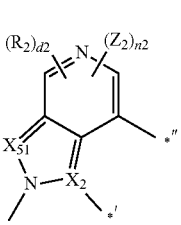

Formula CY2-12

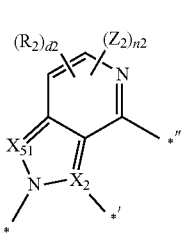

In Formulae CY2-1 to CY2-12, $X_2$, $R_2$, $Z_2$, and n2 are each independently the same as described herein, provided that n2 is 0, 1, or 2, $X_{51}$ in Formulae CY2-1 to CY2-4 may be O, S, $N[(L_7)_{b7}\text{-}(R_7)_{c7}]$, $C[(L_7)_{b7}\text{-}(R_7)_{c7}][(L_8)_{b8}\text{-}(R_8)_{c8}]$, $Si[(L_7)_{b7}\text{-}(R_7)_{c7}][(L_8)_{b8}\text{-}(R_8)_{c8}]$, or C(=O), $X_{51}$ in Formulae CY2-5 to CY2-12 may be N, $C[(L_7)_{b7}\text{-}(R_7)_{c7}]$, or $Si[(L_7)_{b7}\text{-}(R_7)_{c7}]$, $L_7$, $L_8$, b7, b8, $R_7$, $R_8$, c7, and c8 are each independently the same as described herein, d2 may be an integer from 0 to 2, d3 may be an integer from 0 to 3, and

*, *', and *" each indicate a binding site to a neighboring atom.

In one or more embodiments, a moiety represented by

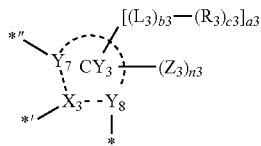

in Formula 1 may be selected from groups represented by Formulae CY3-1 to CY3-12:

Formula CY3-1

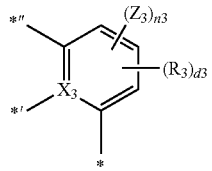

Formula CY3-2

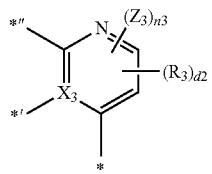

Formula CY3-3

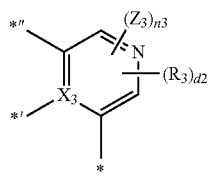

Formula CY3-4

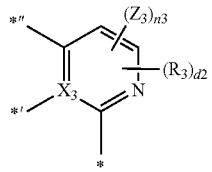

-continued

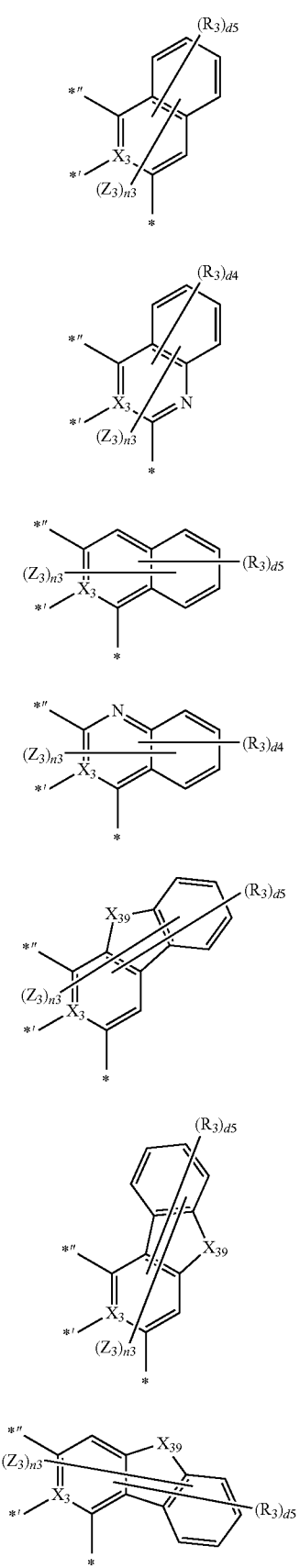

Formula CY3-5
Formula CY3-6
Formula CY3-7
Formula CY3-8
Formula CY3-9
Formula CY3-10
Formula CY3-11

-continued

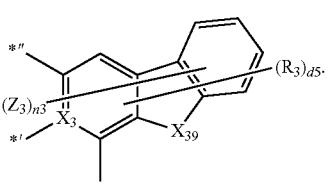

Formula CY3-12

In Formulae CY3-1 to CY3-12, $X_3$, $R_3$, $Z_3$, and n3 are each independently the same as described herein, provided that n3 is 0, 1, or 2, $X_{39}$ may be $C(R_{39a})(R_{39b})$, $N[(L_{39})_{b39}\text{-}(R_{39})_{c39}]$, O, S, or $Si(R_{39a})(R_{39b})$, $L_{39}$ is the same as described in connection with $L_3$, b39 and c39 are each independently the same as described in connection with b3 and c3, $R_{39a}$ and $R_{39b}$ are each independently the same as in connection with $R_3$, d2 may be an integer from 0 to 2,
d3 may be an integer from 0 to 3,
d4 may be an integer from 0 to 4,
d5 may be an integer from 0 to 5, and

*, *', and *" each indicate a binding site to a neighboring atom.

In one or more embodiments, a moiety represented by

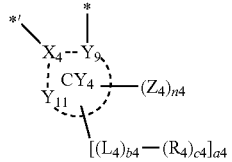

in Formula 1 may be selected from groups represented by Formulae CY4-1 to CY4-26:

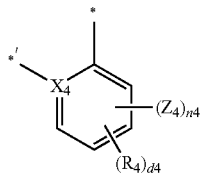

Formula CY4-1

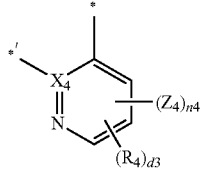

Formula CY4-2

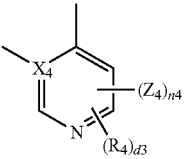

Formula CY4-3

Formula CY4-4
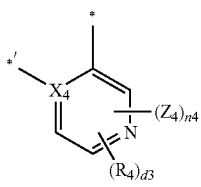
Formula CY4-5
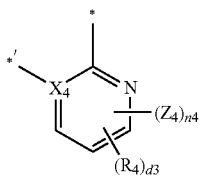
Formula CY4-6
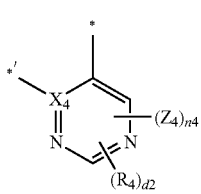
Formula CY4-7
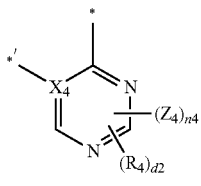
Formula CY4-8
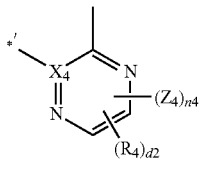
Formula CY4-9
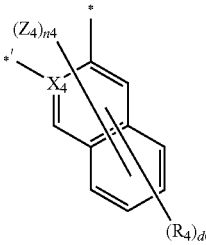
Formula CY4-10
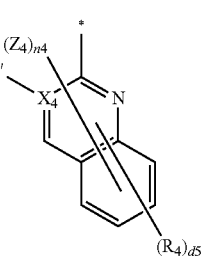
Formula CY4-11
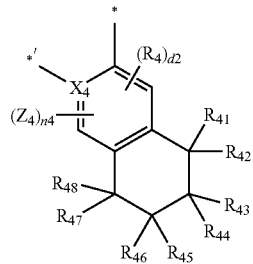
Formula CY4-12
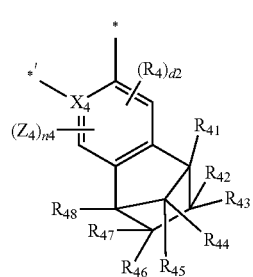
Formula CY4-13
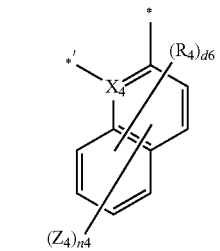
Formula CY4-14
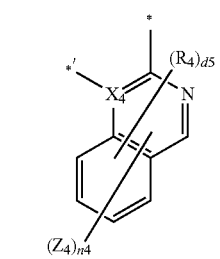
Formula CY4-15
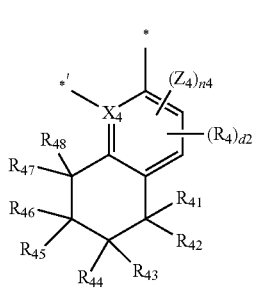

Formula CY4-16

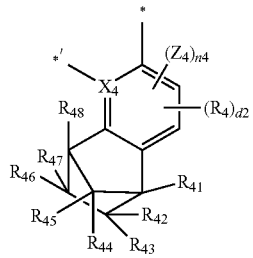

Formula CY4-17

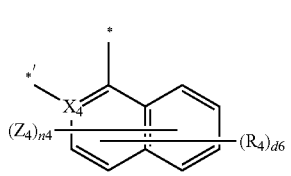

Formula CY4-18

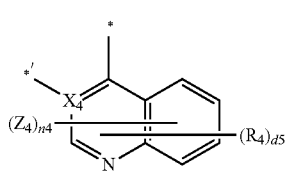

Formula CY4-19

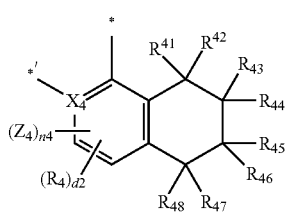

Formula CY4-20

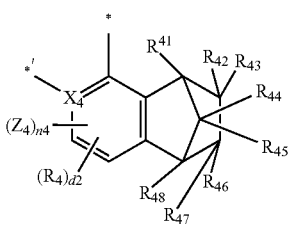

Formula CY4-21

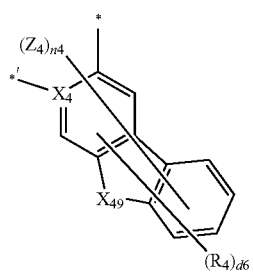

Formula CY4-22

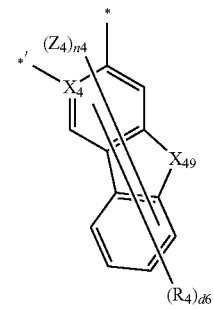

Formula CY4-23

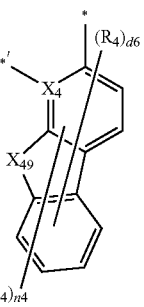

Formula CY4-24

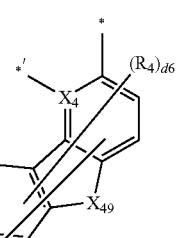

Formula CY4-25

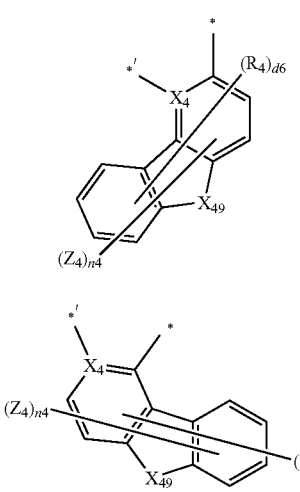

Formula CY4-26

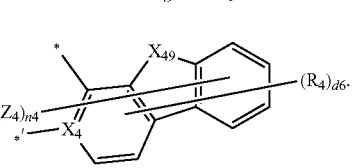

In Formulae CY4-1 to CY4-26, $X_4$, $R_4$, $Z_4$, and n4 are each independently the same as described herein, provided that n4 is 0, 1, or 2, $X_{49}$ may be $C(R_{49a})(R_{49b})$, $N[(L_{49})_{b49}\text{-}(R_{49})_{c49}]$, O, S, or $Si(R_{49a})(R_{49b})$, $L_{49}$ is the same as described in connection with $L_4$, b49 and c49 are each independently the same as described in connection with b4 and c4, $R_{41}$ to $R_{49}$, $R_{49a}$, and $R_{49b}$ are each independently the same as described herein connection with $R_4$, d2 may be an integer from 0 to 2, d3 may be an integer from 0 to 3, d4 may be an integer from 0 to 4, d5 may be an integer from 0 to 5, d6 may be an integer from 0 to 6, and

* and *' each indicate a binding site to a neighboring atom.

In one or more embodiments, in Formula 1, a moiety represented by

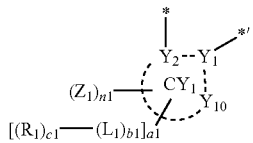

may be selected from groups represented by Formulae CY1(1) to CY1(12), and/or a moiety represented by

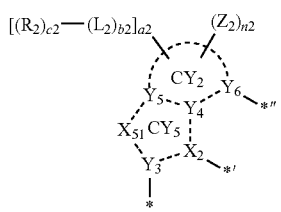

may be selected from groups represented by Formulae CY2(1) to CY2(3), and/or a moiety represented by

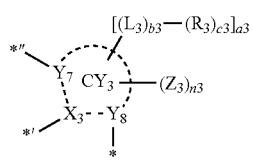

may be selected from groups represented by Formulae CY3(1) to CY3(15), and/or a moiety represented by

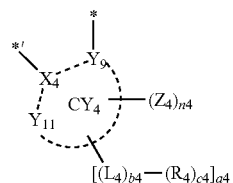

may be selected from groups represented by Formulae CY4(1) to CY4(12):

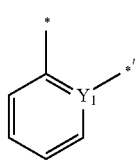

Formula CY1(1)

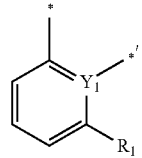

Formula CY1(2)

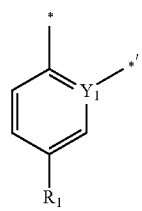

Formula CY1(3)

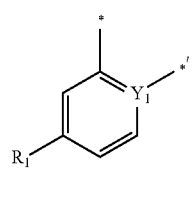

Formula CY1(4)

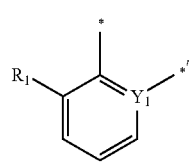

Formula CY1(5)

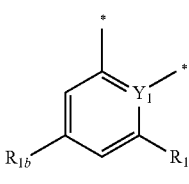

Formula CY1(6)

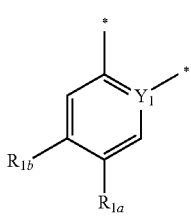

Formula CY1(7)

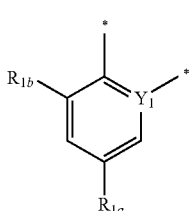

Formula CY1(8)

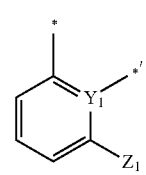

Formula CY1(9)

-continued
Formula CY1(10)
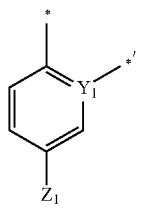
Formula CY1(11)
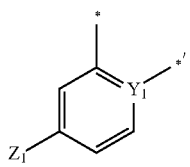
Formula CY1(12)
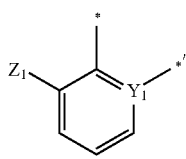
Formula CY2(1)
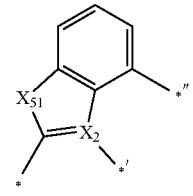
Formula CY2(2)
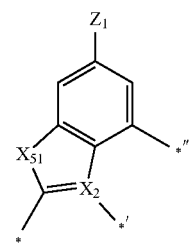
Formula CY2(3)
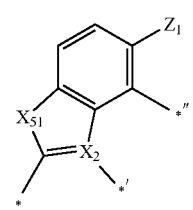
Formula CY3(1)
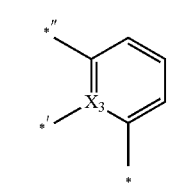
-continued
Formula CY3(2)
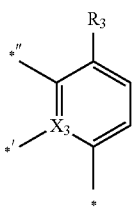
Formula CY3(3)
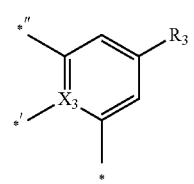
Formula CY3(4)
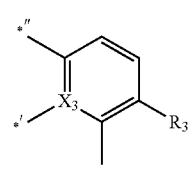
Formula CY3(5)
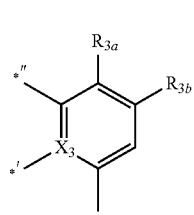
Formula CY3(6)
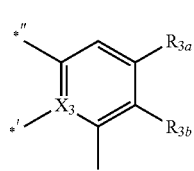
Formula CY3(7)
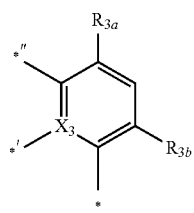
Formula CY3(8)
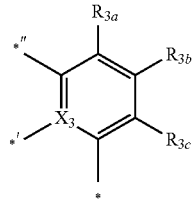

-continued
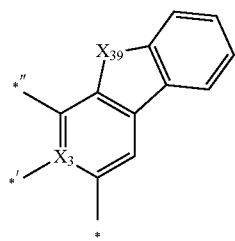
Formula CY3(9)
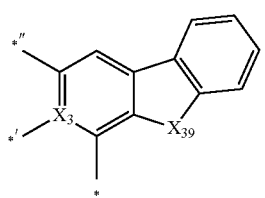
Formula CY3(10)
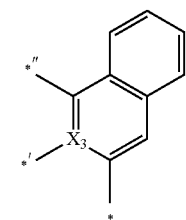
Formula CY3(11)
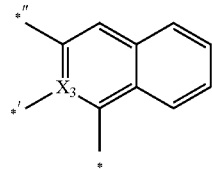
Formula CY3(12)
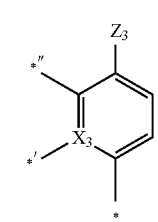
Formula CY3(13)
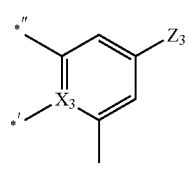
Formula CY3(14)
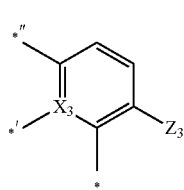
Formula CY3(15)
-continued
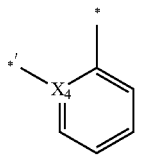
Formula CY4(1)
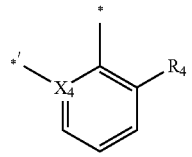
Formula CY4(2)
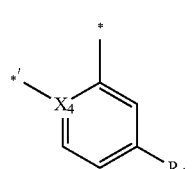
Formula CY4(3)
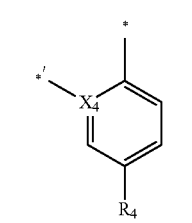
Formula CY4(4)
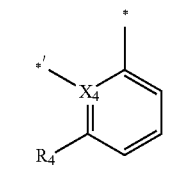
Formula CY4(5)
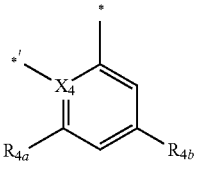
Formula CY4(6)
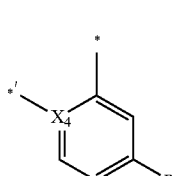
Formula CY4(7)
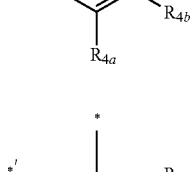
Formula CY4(8)
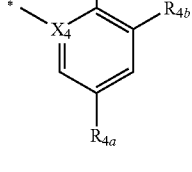

-continued

Formula CY4(9)

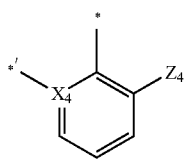

Formula CY4(10)

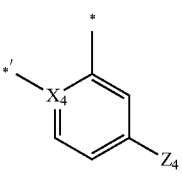

Formula CY4(11)

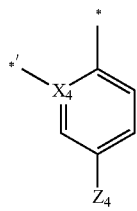

Formula CY4(12)

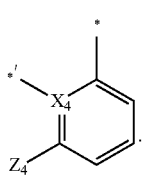

In Formulae CY1(1) to CY1(12), CY2(1) to CY2(3), CY3(1) to CY3(15), and CY4(1) to CY4(12), $Y_1$, $R_1$, $Z_1$, $X_2$, $Z_2$, $X_3$, $R_3$, $Z_3$, $X_4$, $R_4$, and $Z_4$ are each independently the same as described herein, $R_{1a}$ and $R_{1b}$ are each independently the same as described in connection with $R_1$, $R_{3a}$ to $R_{3c}$ are each independently the same as described in connection with $R_3$, $Z_{4a}$ and $Z_{4b}$ are each independently the same as described in connection with $Z_4$, $X_{51}$ may be O, S, $N[(L_7)_{b7}\text{-}(R_7)_{c7}]$, $C[(L_7)_{b7}\text{-}(R_7)_{c7}][(L_8)_{b8}\text{-}(R_8)_{c8}]$, $Si[(L_7)_{b7}\text{-}(R_7)_{c7}][(L_8)_{b8}\text{-}(R_8)_{c8}]$, or C(=O), $L_7$, $L_8$, b7, b8, $R_7$, $R_8$, c7, and c8 are each independently the same as described herein, $X_{39}$ may be $C(R_{39a})(R_{39b})$, $N[(L_{39})_{b39}\text{-}(R_{39})_{c39}]$, O, S, or $Si(R_{39a})(R_{39b})$, $L_{39}$ is the same as described in connection with $L_3$, b39 and c39 are each independently the same as described in connection with b3 and c3, $R_{39a}$ and $R_{39b}$ are each independently the same as described in connection with $R_3$, $R_1$, $R_{1a}$, $R_{1b}$, $R_3$, $R_{3a}$ to $R_{3c}$, $R_4$, $R_{4a}$, and $R_{4b}$ are not hydrogen, and

*, *', and *" each indicate a binding site to a neighboring atom.

In one or more embodiments, the organometallic compound may satisfy at least one of Condition 1 to Condition 4:

Condition 1 a moiety represented by

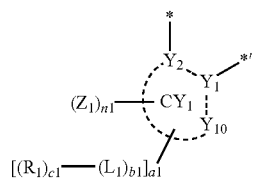

in Formula 1 is selected from groups represented by Formulae CY1(9) to CY1(12),

Condition 2 a moiety represented by

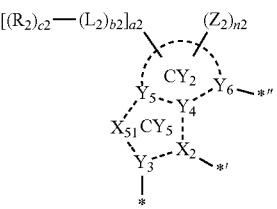

in Formula 1 is selected from groups represented by Formulae CY2(2) and CY2(3),

Condition 3 a moiety represented by

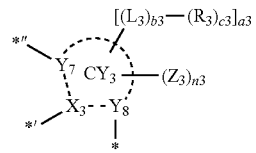

in Formula 1 is selected from groups represented by Formulae CY3(13) to CY3(15), and Condition 4 a moiety represented by

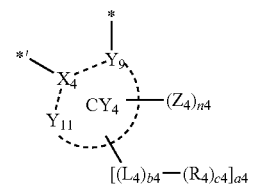

in Formula 1 is selected from groups represented by Formulae CY4(9) to CY4(12).

For example, the organometallic compound may be one of Compounds 1-101 to 1-112 and 1-201 to 1-228, but embodiments of the present disclosure are not limited thereto:

1-101
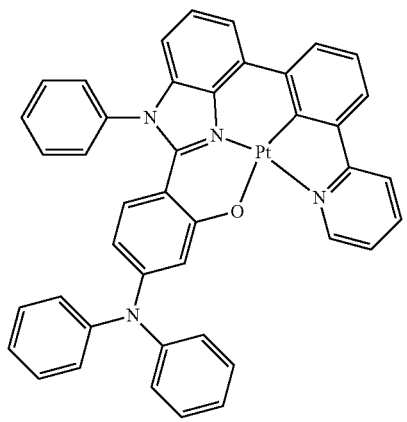
1-102
1-104
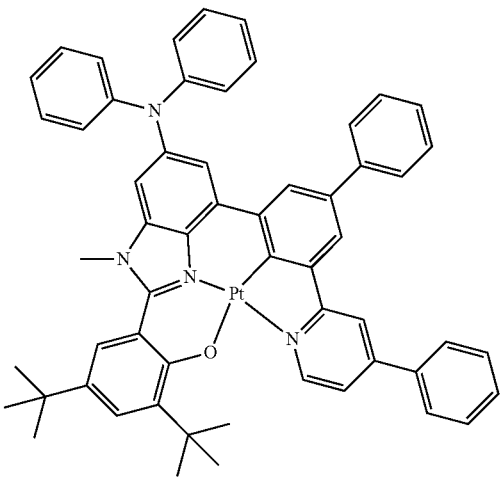
1-105
1-103
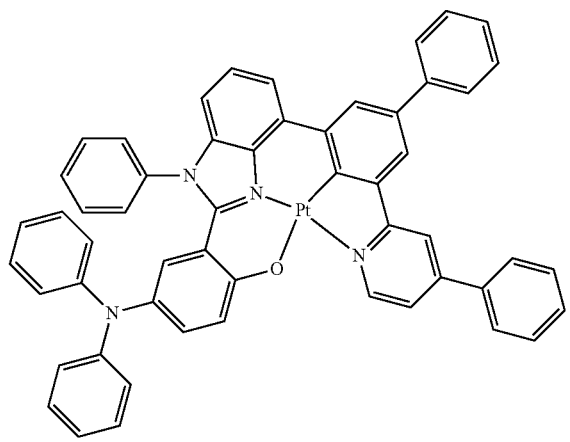
1-106
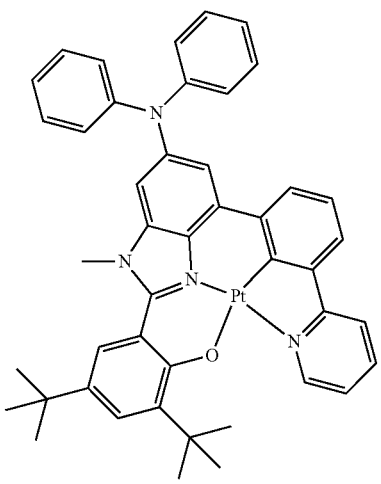
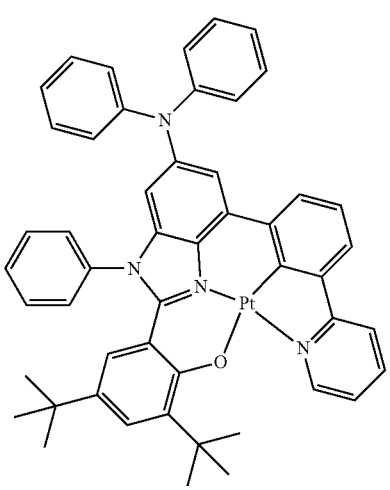

1-107
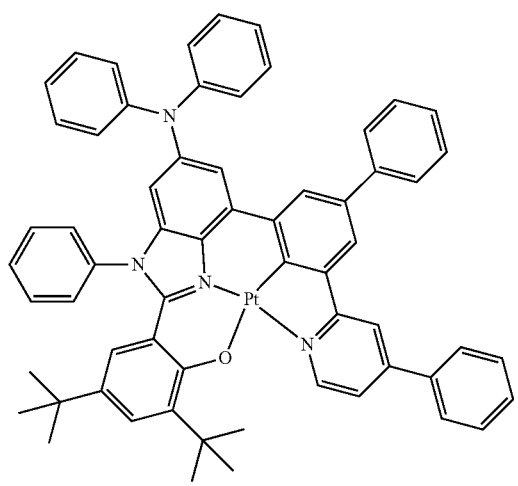
1-108
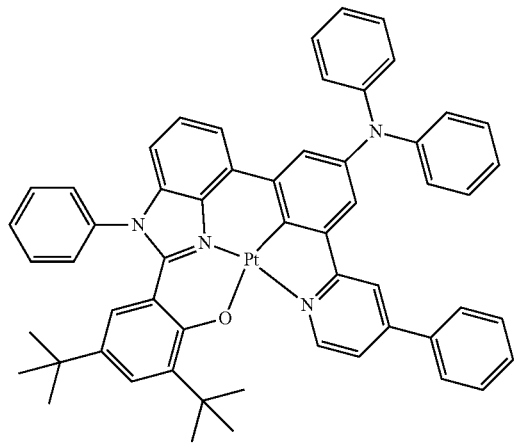
1-109
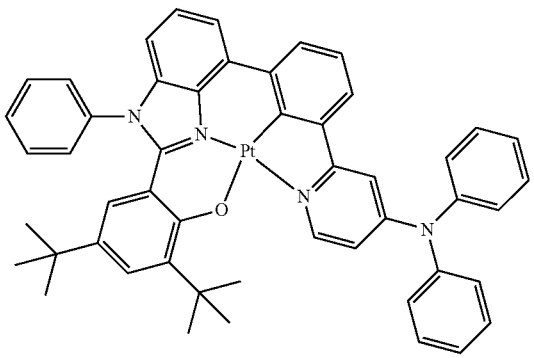
1-110
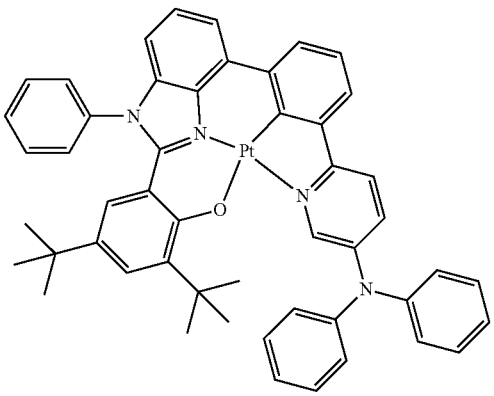
1-111
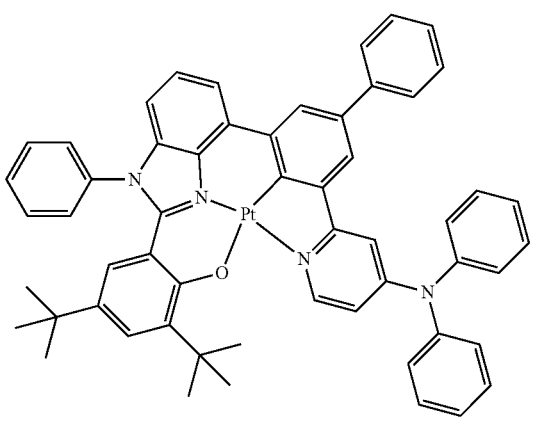
1-112
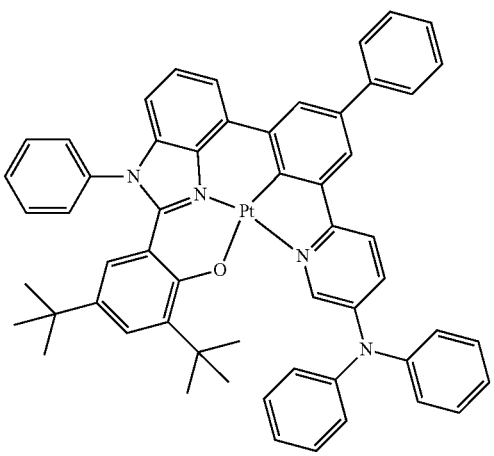

1-201
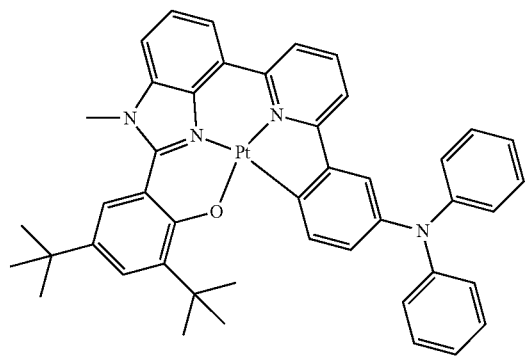
1-202
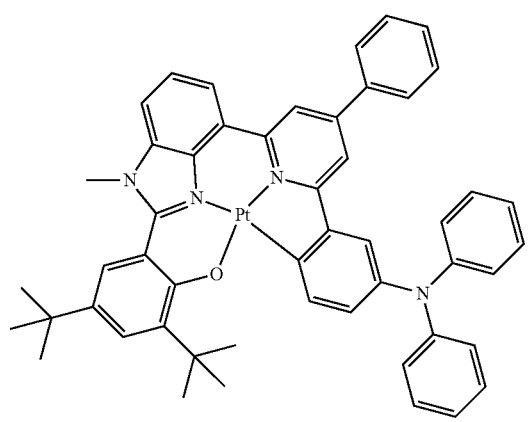
1-203
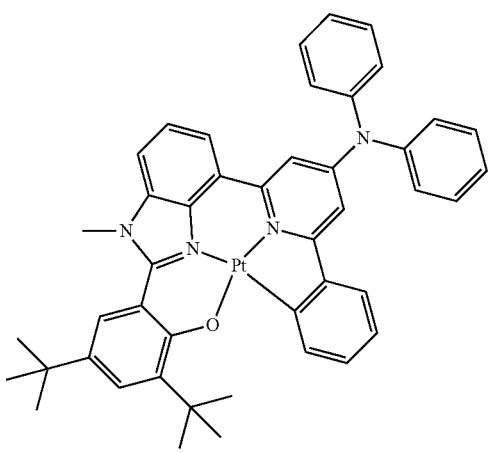
1-204
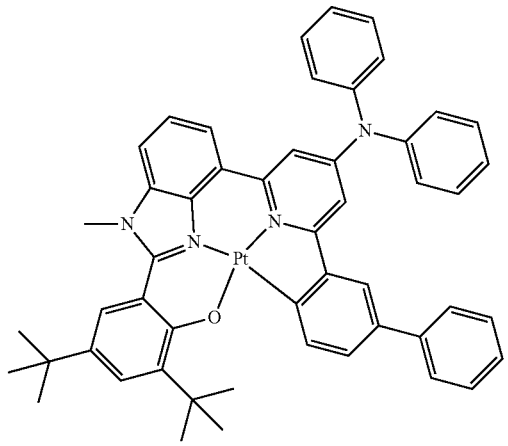
1-205
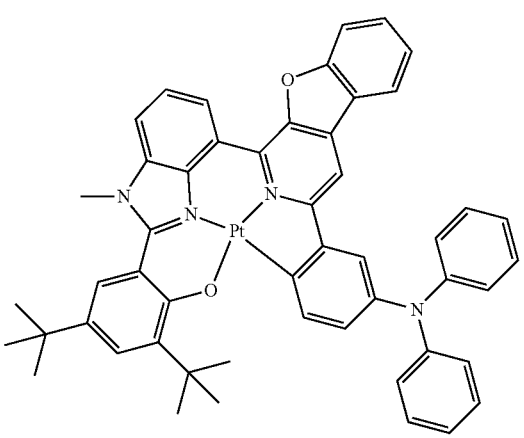
1-206
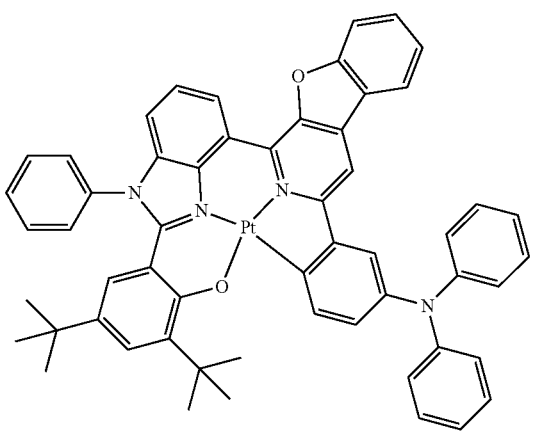

-continued
1-207
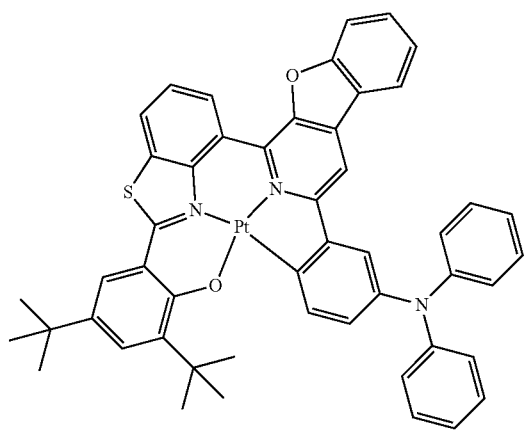
1-208
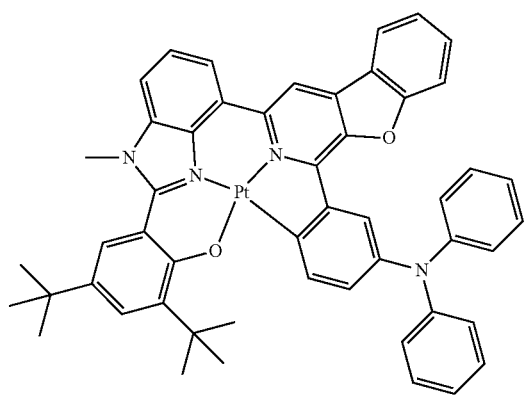
1-209
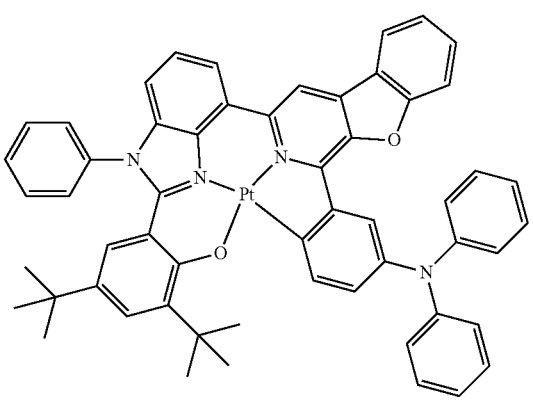
-continued
1-210
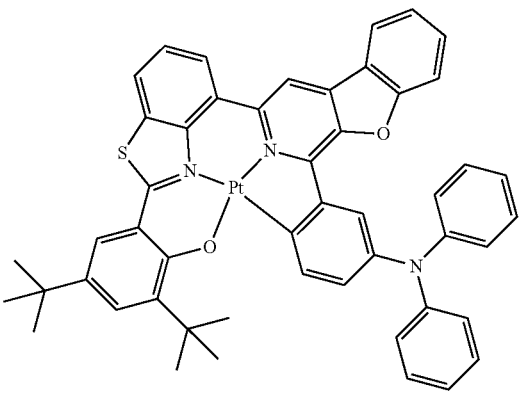
1-211
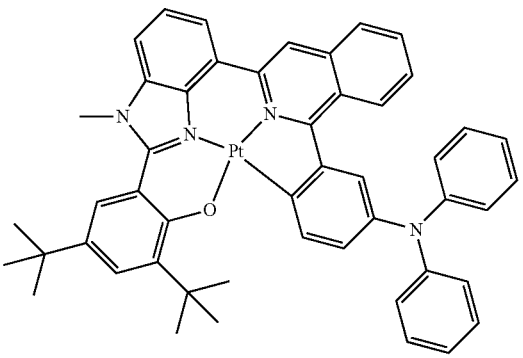
1-212
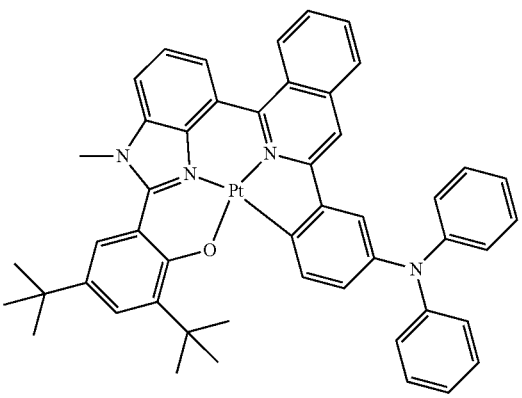
1-213
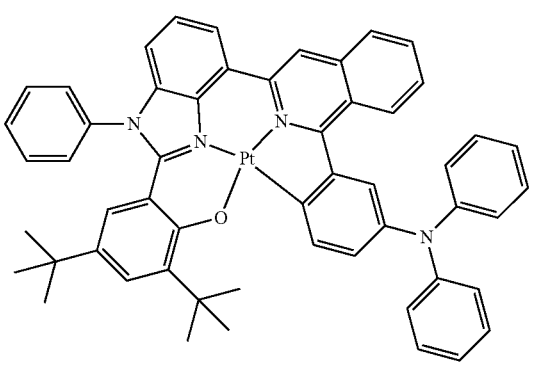

1-214
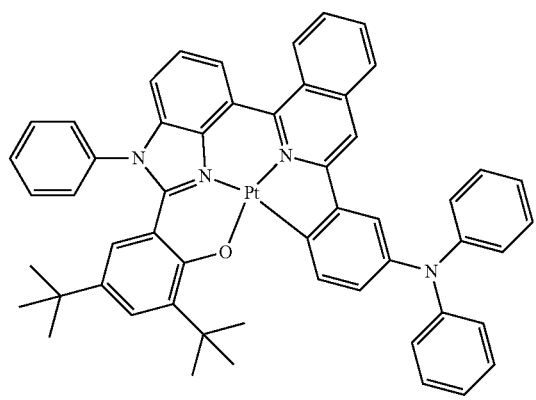
1-215
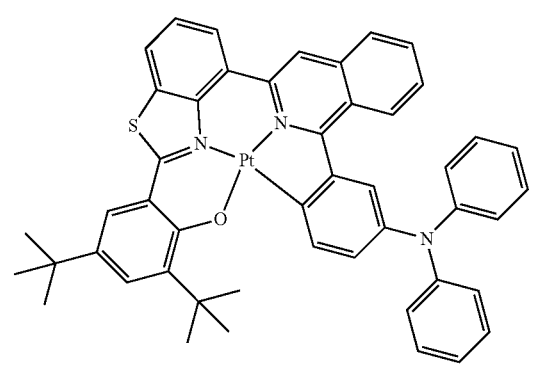
1-216
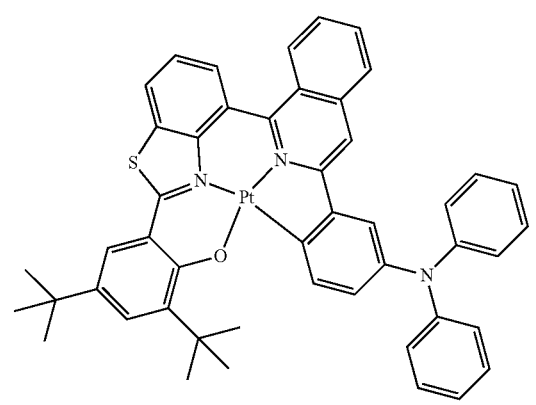
1-217
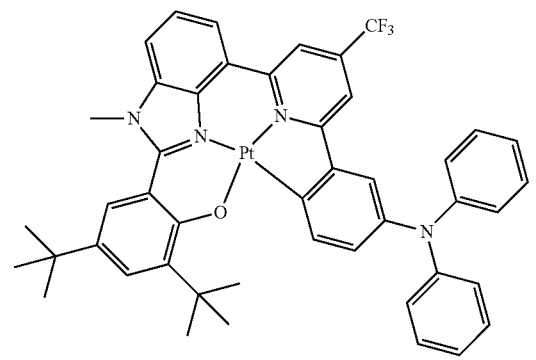
1-218
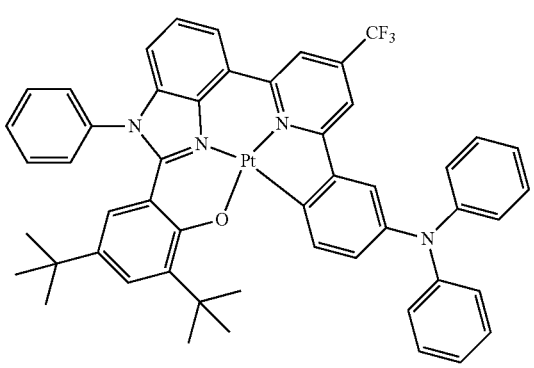
1-219
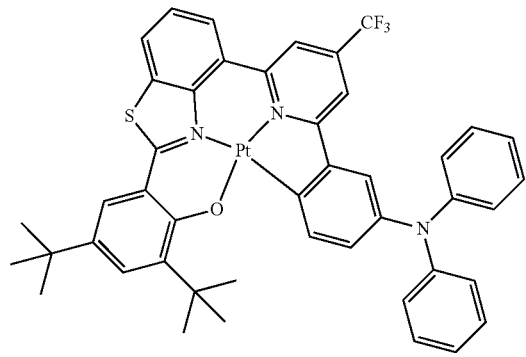
1-220
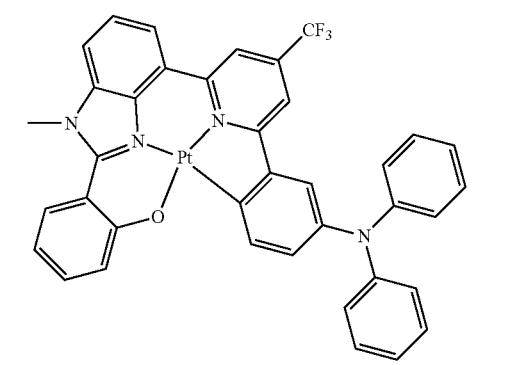
1-221
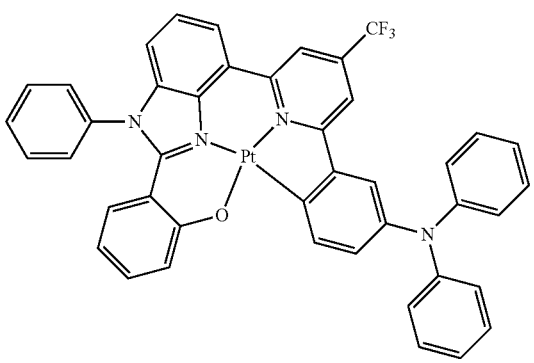

-continued
1-222
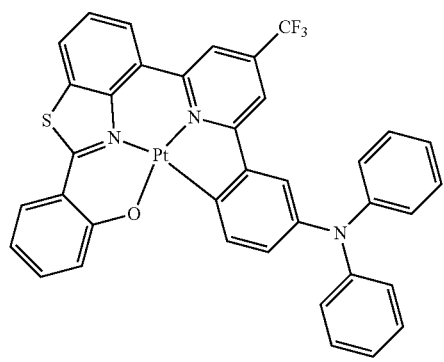
1-223
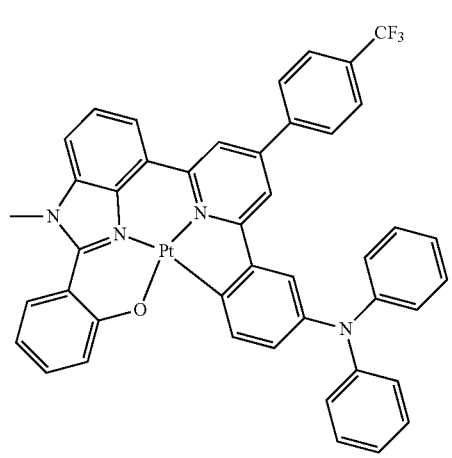
1-224
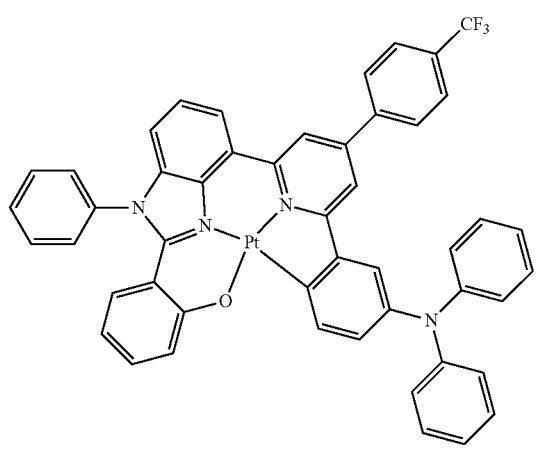
1-225
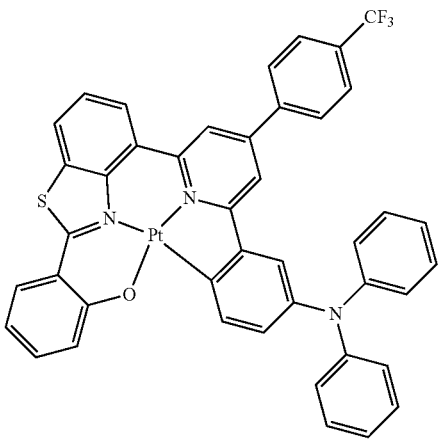
1-226
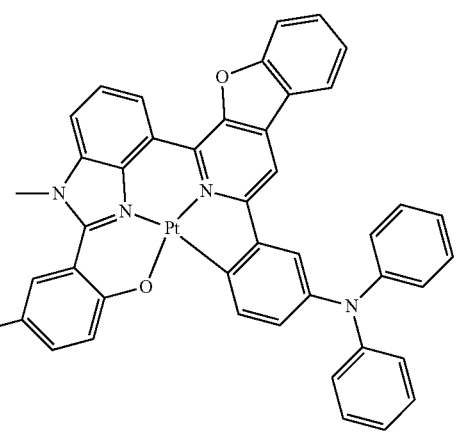
1-227
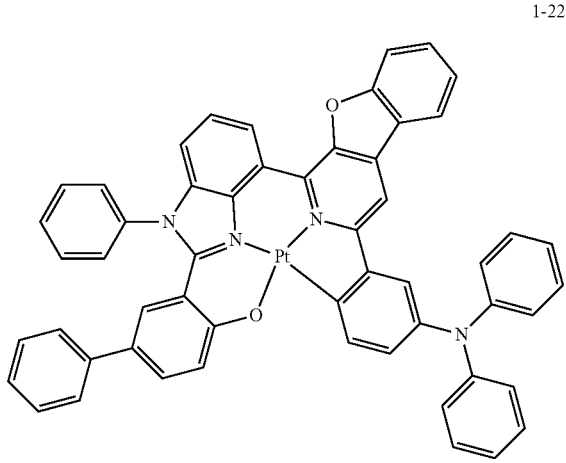

-continued 1-228

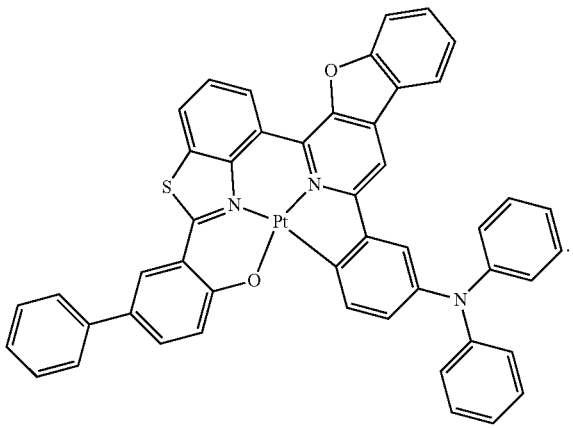

Formula 1 includes a 5-membered ring represented by $CY_5$, and a cyclometallated ring formed by $CY_5$, $CY_2$, $CY_3$, and M in Formula 1 is a 6-membered ring (see Formula 1'). Accordingly, a stable bond angle may be formed between a tetradentate ligand and a metal in Formula 1, thereby improving a molecular stability of the organometallic compound represented by Formula 1.

Formula 1'

6-membered ring

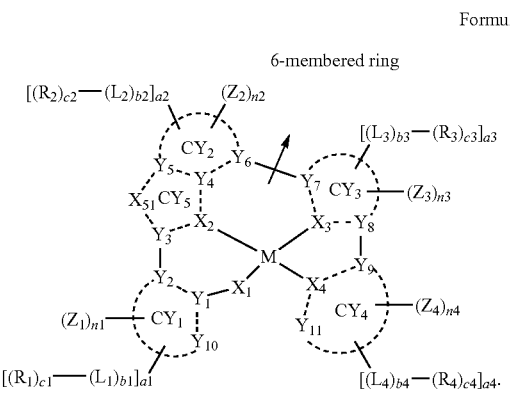

Also, $Z_1$ to $Z_4$ in Formula 1 may each independently be a group represented by Formula 2, provided that i) when $X_{51}$ is O, S, C(=O), or N, the sum of n1, n2, n3, and n4 is one or more, ii) when $X_{51}$ is $N[(L_7)_{b7}-(R_7)_{c7}]$, $C[(L_7)_{b7}-(R_7)_{c7}]$, or $Si[(L_7)_{b7}-(R_7)_{c7}]$, $R_7$ is a group represented by Formula 2 or the sum of n1, n2, n3, and n4 is one or more, and iii) when $X_{51}$ is $C[(L_7)_{b7}-(R_7)_{c7}][(L_8)_{b8}-(R_8)_{c8}]$ or $Si[(L_7)_{b7}-(R_7)_{c7}][(L_8)_{b8}-(R_8)_{c8}]$, at least one of $R_7$ and $R_8$ is a group represented by Formula 2 or the sum of n1, n2, n3, and n4 is one or more. That is, Formula 1 essentially includes at least one group represented by Formula 2.

Therefore, a maximum emission wavelength of the organometallic compound represented by Formula 1 may be shifted to a red light area. Hence, the organometallic compound represented by Formula 1 may be used as a red phosphorescent dopant capable of providing high efficiency and a long lifespan.

For example, a highest occupied molecular orbital (HOMO) energy level, a lowest unoccupied molecular orbital (LUMO) energy level, a singlet ($S_1$) energy level, and a triplet ($T_1$) energy level of each of Compounds 1-103 and 1-218 were evaluated by using a density functional theory (DFT) method of a Gaussian program (a structure was optimized at a B3LYP, 6-31G(d,p) level). Evaluation results thereof are shown in Table 1.

TABLE 1

| Compound No. | HOMO (eV) | LUMO (eV) | $S_1$ energy level (eV) | $T_1$ energy level (eV) | $S_1$-$T_1$ (eV) |
|---|---|---|---|---|---|
| 1-103 | −4.568 | −1.798 | 2.395 | 2.263 | 0.132 |
| 1-218 | −4.675 | −2.172 | 2.042 | 1.911 | 0.131 |
| A | −4.853 | −1.544 | 2.758 | 2.498 | 0.260 |

Compound A

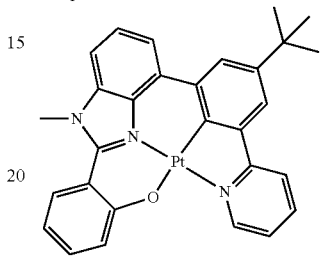

Referring to Table 1, it is confirmed that Compounds 1-103 and 1-218 have a high HOMO energy level (that is, a small HOMO energy level absolute value) and a small $S_1$-$T_1$ energy level, as compared with Compound A, and thus, the organometallic compound represented by Formula 1 has electrical characteristics suitable for use as a dopant of an electronic device, for example, an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect of the present description provides an organic light-emitting device that includes:

a first electrode;

a second electrode; and an organic layer that is disposed between the first electrode and the second electrode, wherein the organic layer includes an emission layer and at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound represented by Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one of organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this regard, Compound 1 and Compound 2 may be included in an identical layer (for example, Compound 1 and Compound 2 may both be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, or any combination thereof, and wherein the electron transport region includes a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstroms per second (Å/sec) to about 0 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

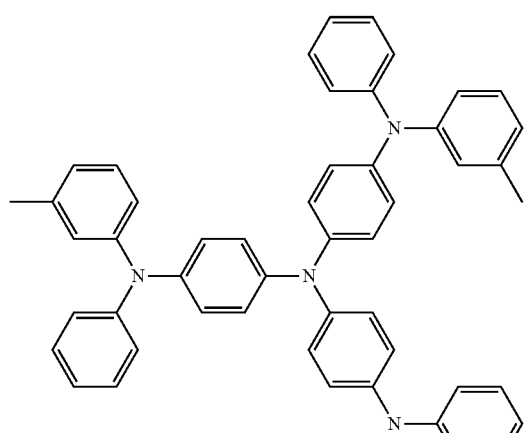
m-MTDATA
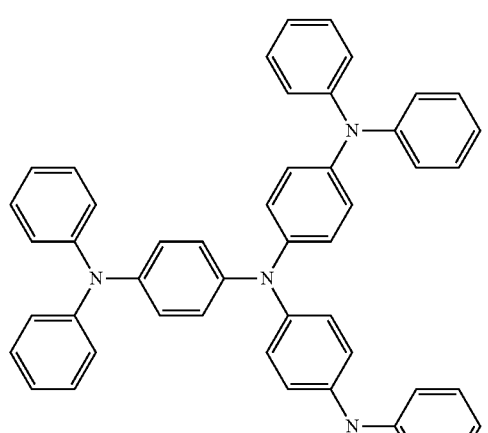
TDATA
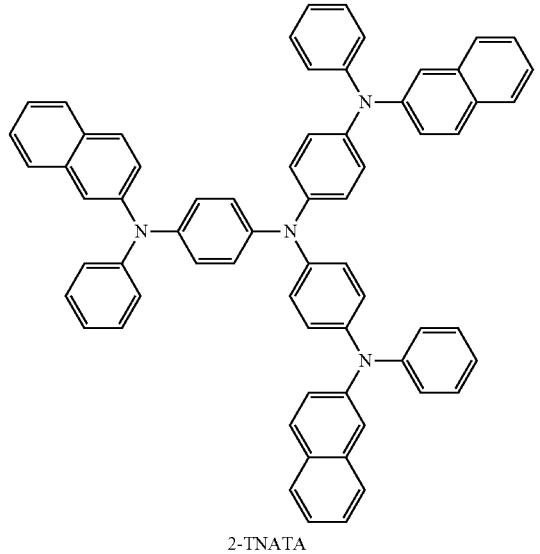
2-TNATA
-continued
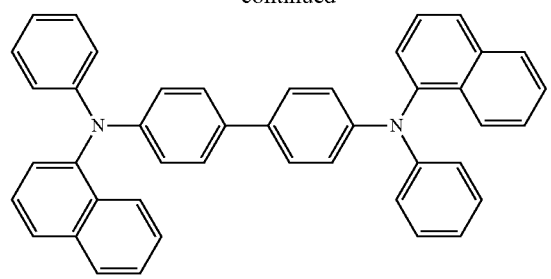
NPB
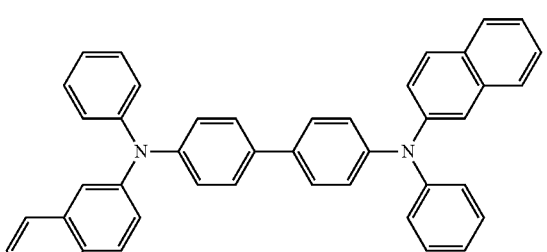
β-NPB
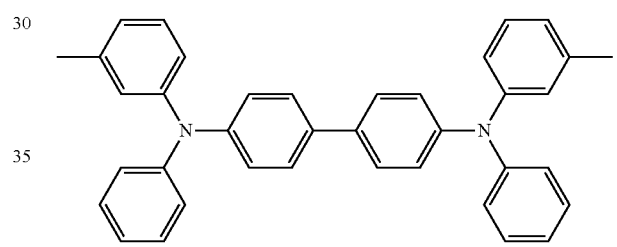
TPD
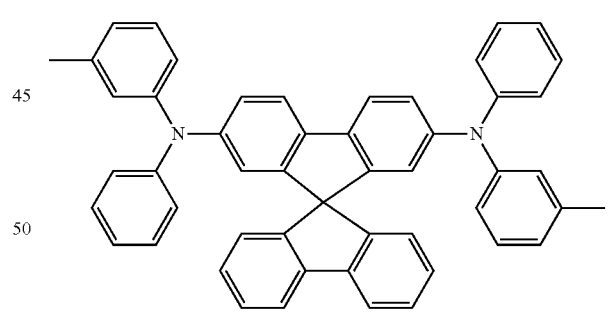
Spiro-TPD
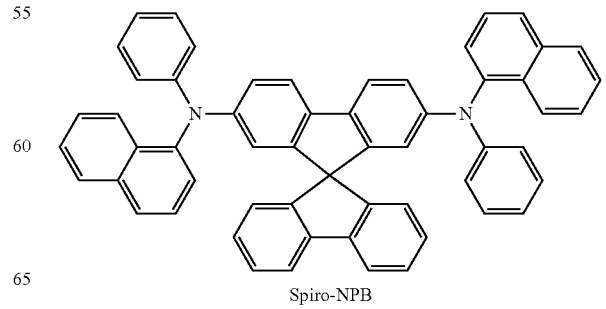
Spiro-NPB -continued

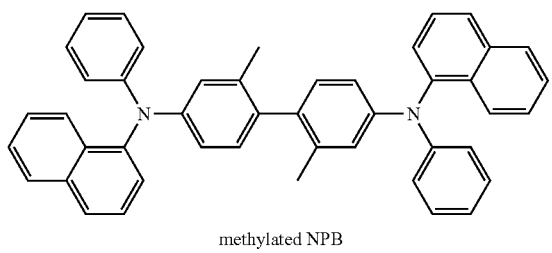

methylated NPB

TAPC

HMTPD

Formula 201

-continued

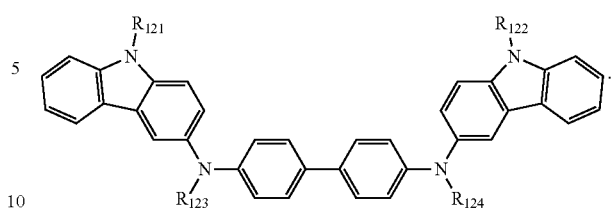

Formula 202

Ar$_{101}$ and Ar$_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

xa and xb in Formula 201 may each independently be an integer from 0 to 5, or may each independently be 0, 1, or 2. For example, xa may be 1 and xb may be 0, but embodiments of the present disclosure are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, and the like) and a $C_1$-$C_{10}$ alkoxy group (for example, a methoxy group, an ethoxy group, a propoxy group, a butoxy group, a pentoxy group, and the like);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

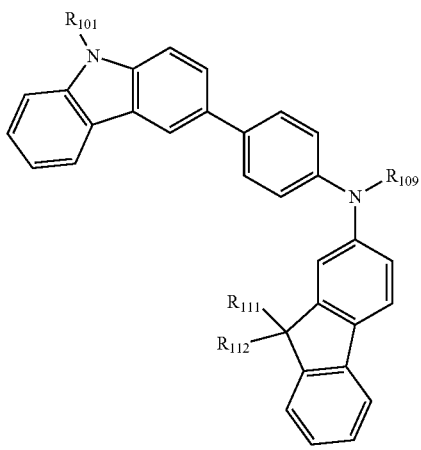

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto.

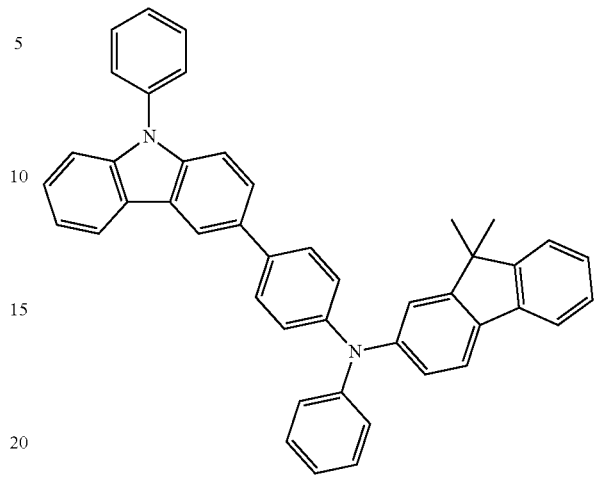

HT1

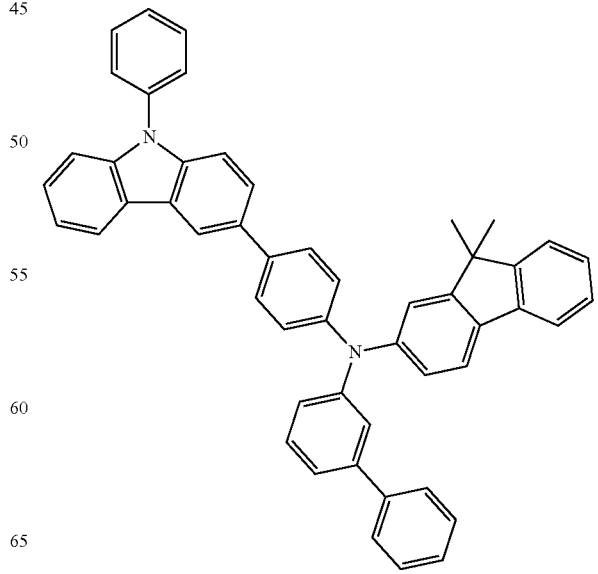

HT2

HT3
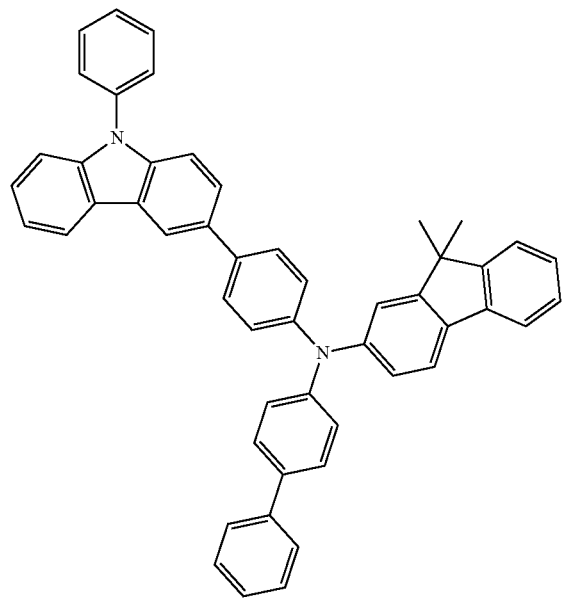
HT5
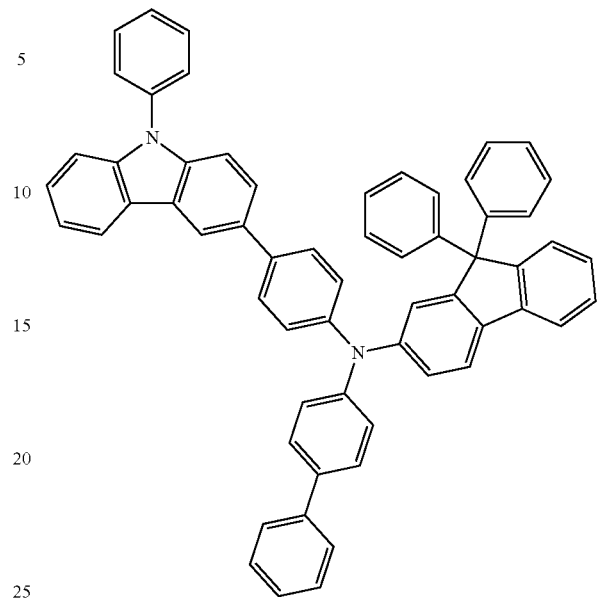
HT4
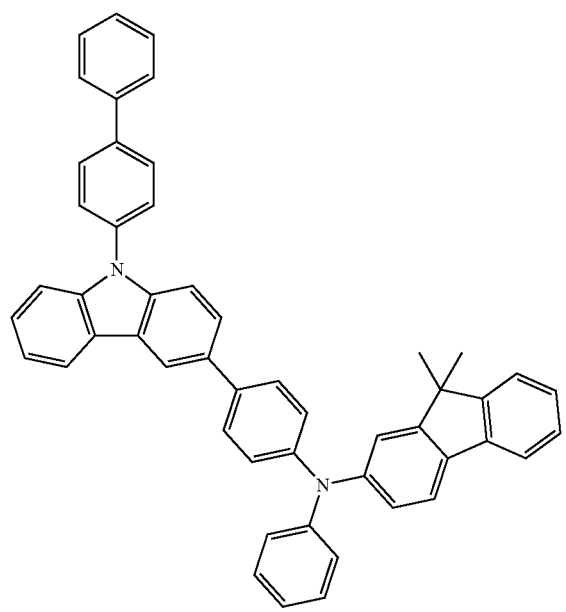
HT6
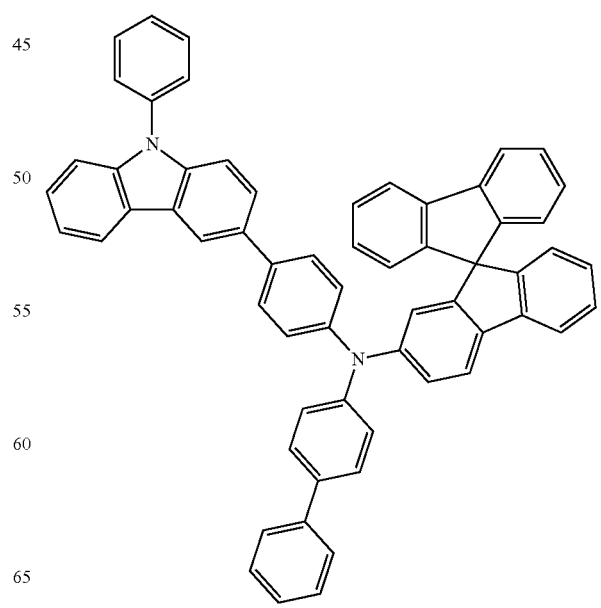

77
-continued
HT7
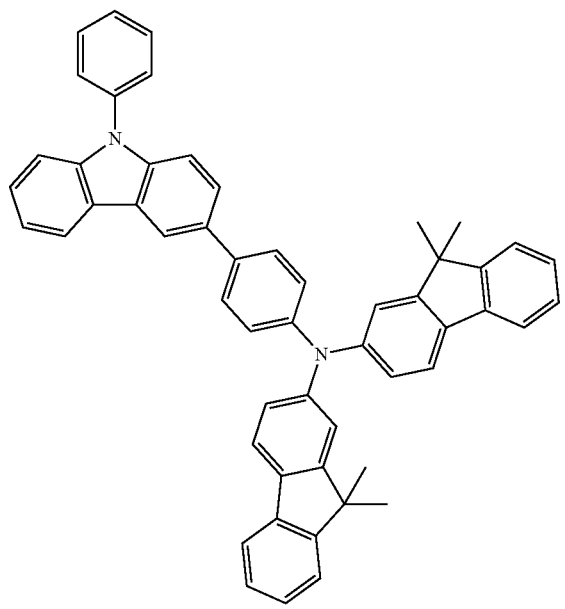
HT8
HT9
78
-continued
HT10
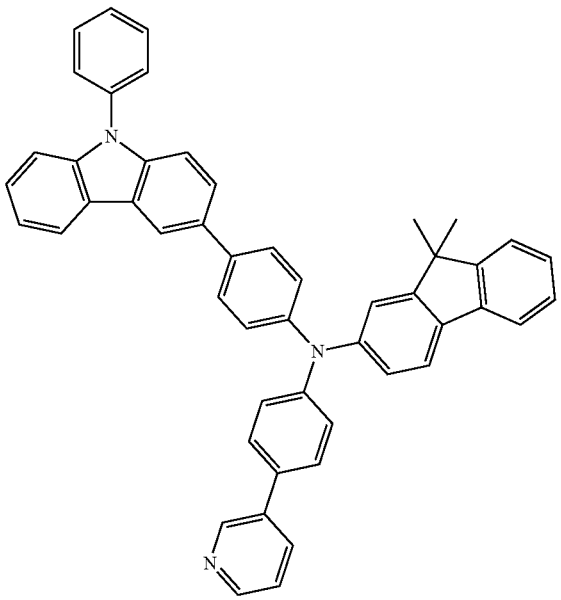
HT11
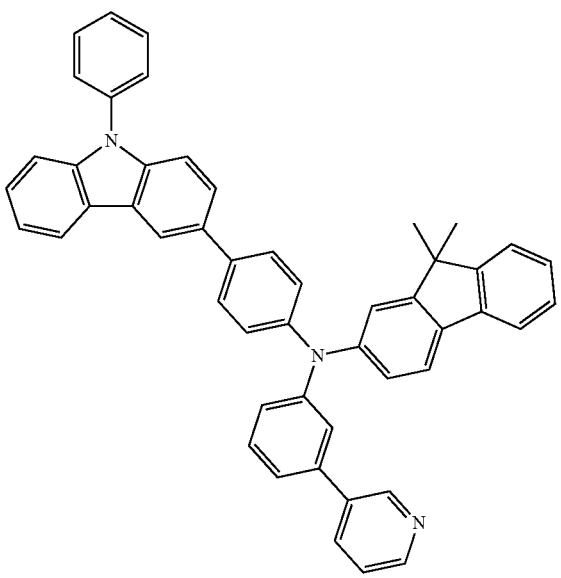

HT12
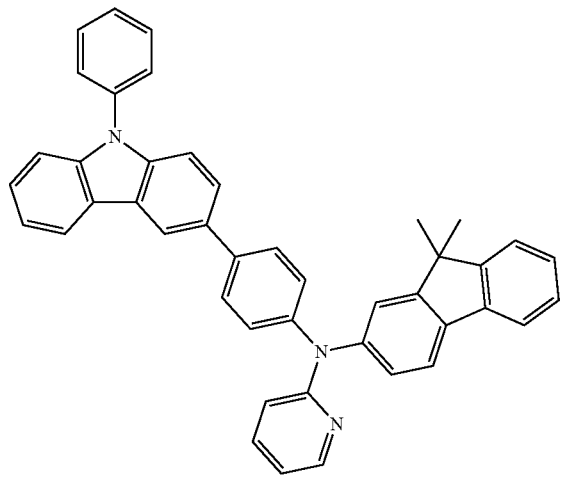
HT13
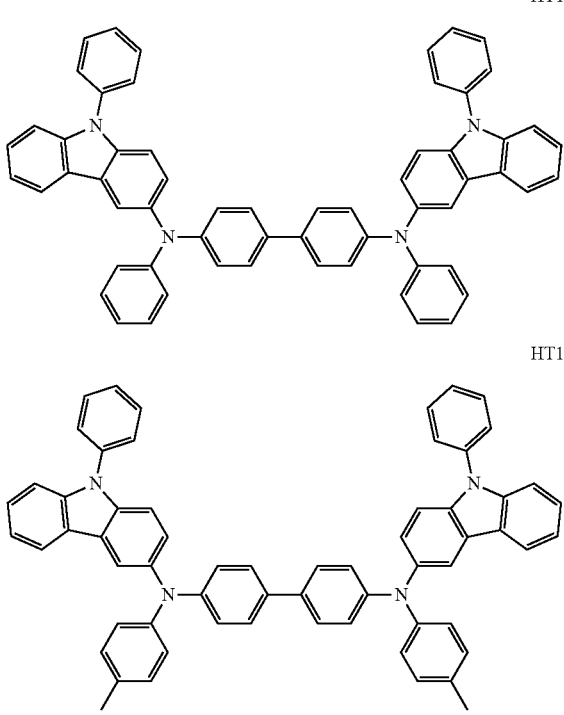
HT14
HT15
HT16
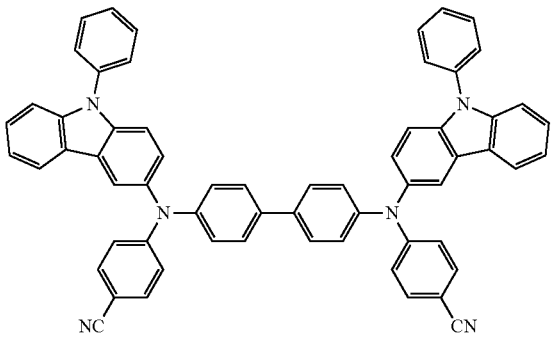
HT17
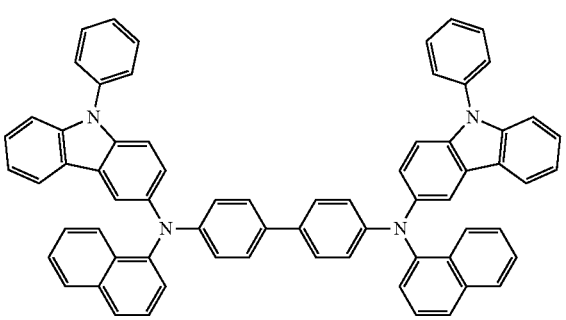
HT18
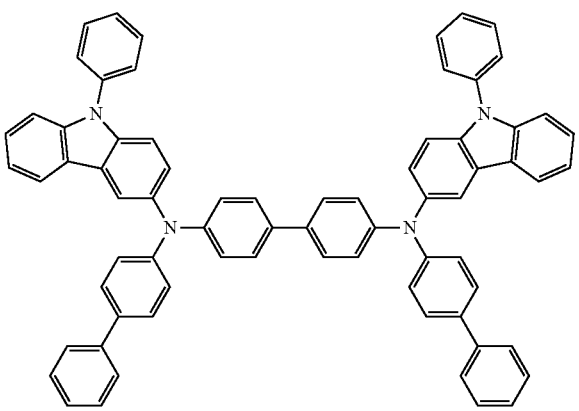
HT19
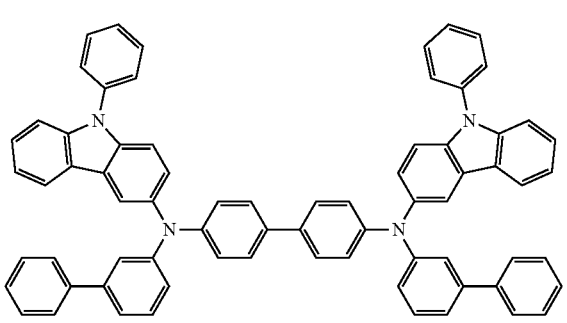

-continued

HT20

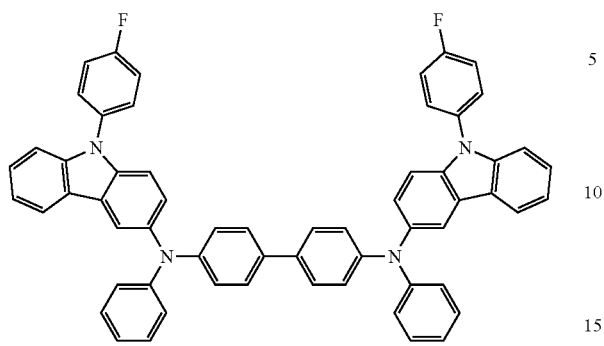

F4-TCNQ

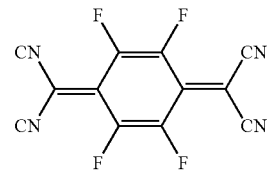

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 or Compound HT-D2 below, but are not limited thereto.

HT-D1

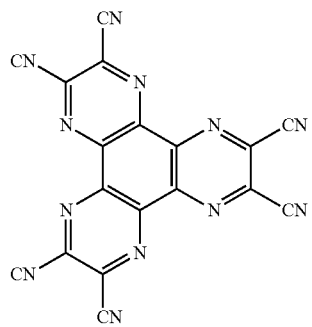

HT-D2

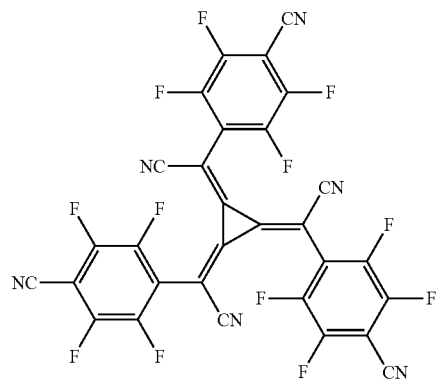

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

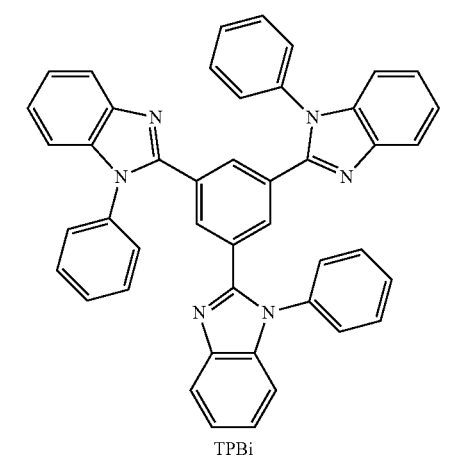
TPBi
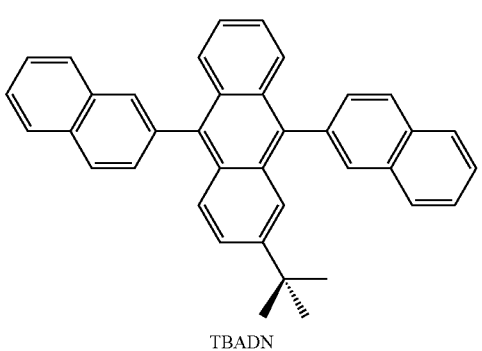
TBADN
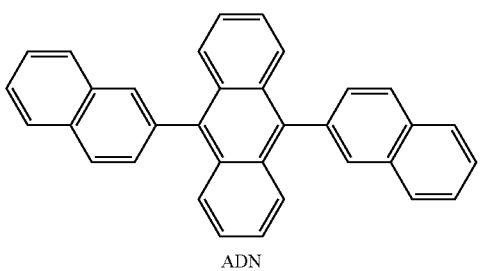
ADN
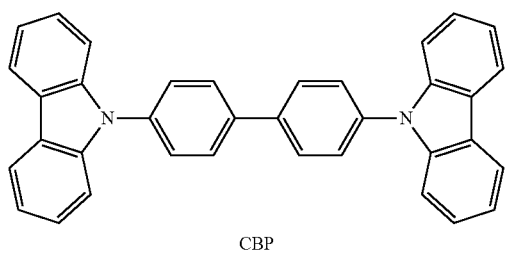
CBP
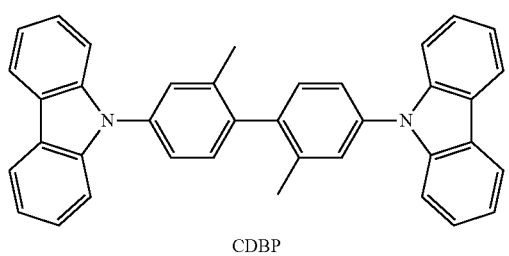
CDBP
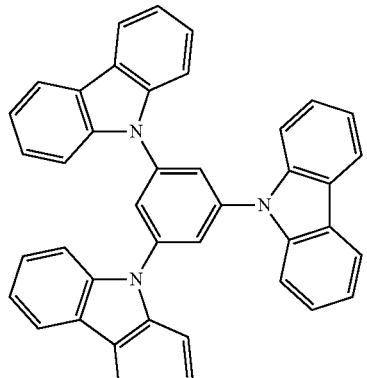
TCP
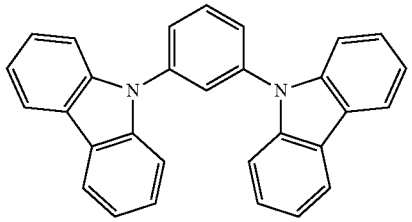
mCP
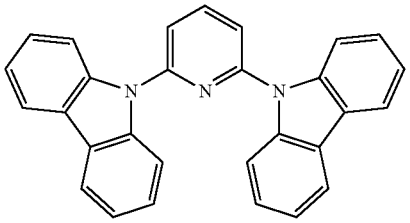
H50
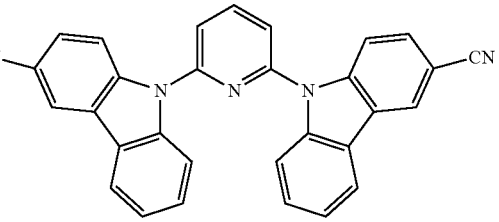
H51
In one or more embodiments, the host may further include a compound represented by Formula 301 below:
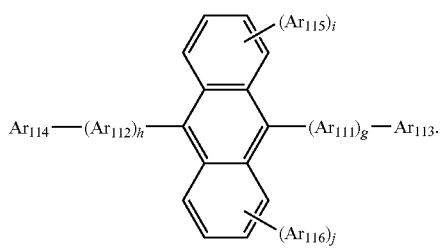
Formula 301
$Ar_{111}$ and $Ar_{112}$ in Formula 301 may each independently be selected from:
a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, l, and j in Formula 301 may each independently be an integer from 0 to 4, for example, 0, 1, or 2.

$Ar_{113}$ to $Ar_{116}$ in Formula 301 may each independently be selected from:

a $C_1$-$C_{10}$ alkyl group substituted with at least one selected from a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

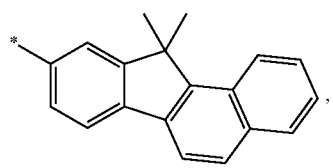 [SMILES: *c1ccc2c(c1)C(C)(C)c1c-2ccc2ccccc12]

but embodiments of the present disclosure are not limited thereto.

In one or more embodiments, the host may include a compound represented by Formula 302:

Formula 302

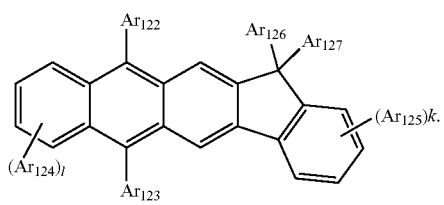

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

The compound represented by Formula 301 and the compound represented by Formula 302 may include Compounds H1 to H42 illustrated below, but are not limited thereto.

H1

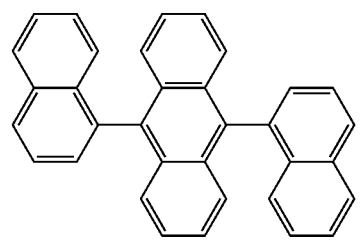

H2

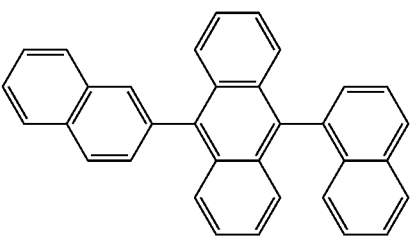

H3

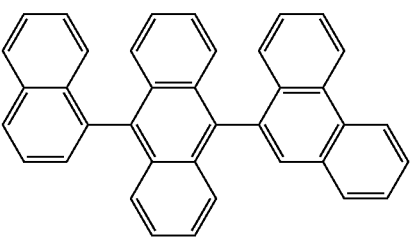

H4

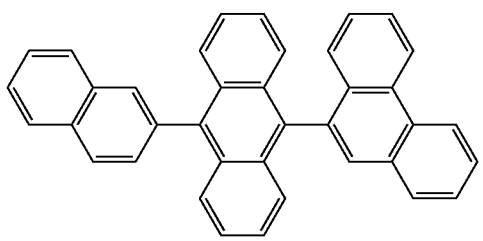

H5

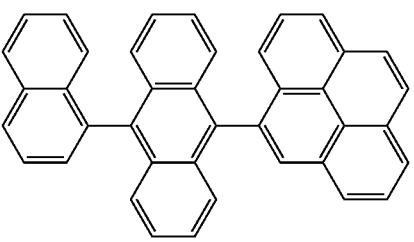

H6

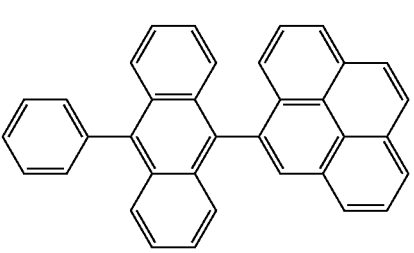

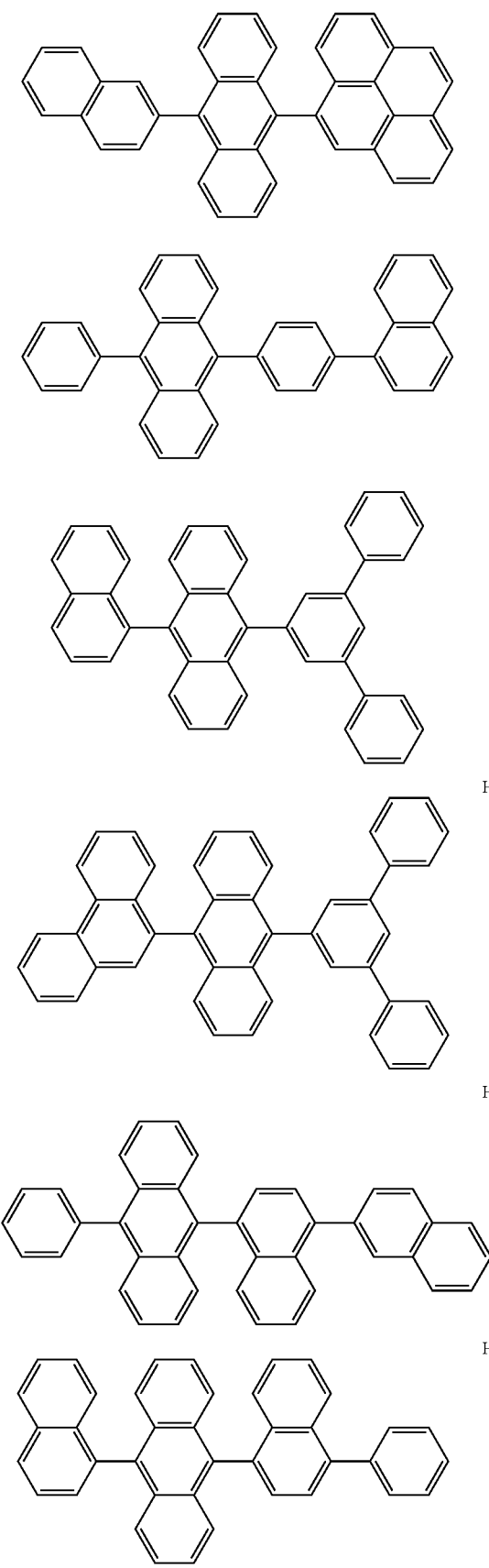
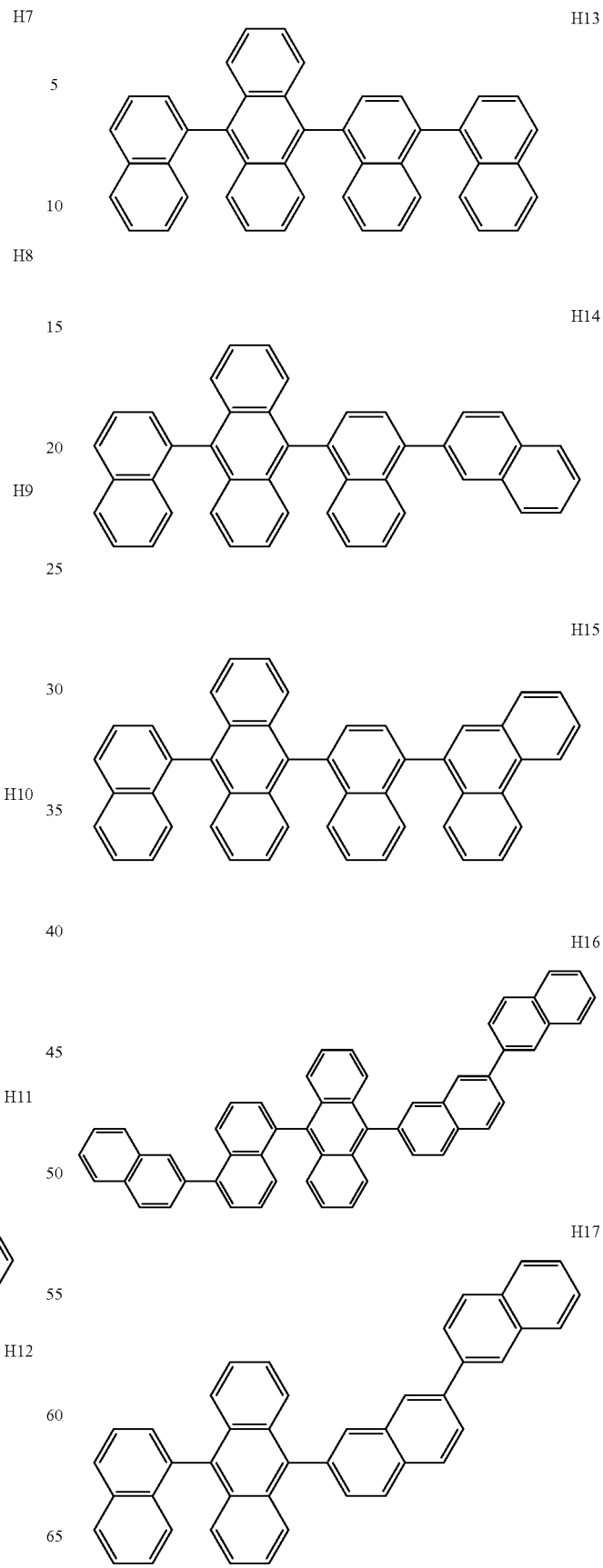

H18
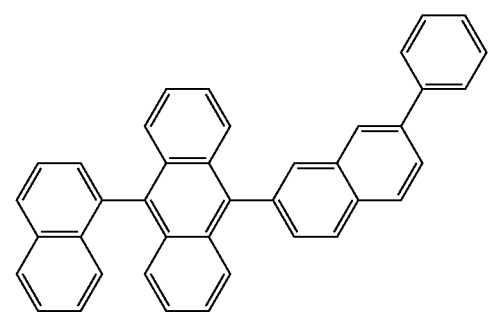
H19
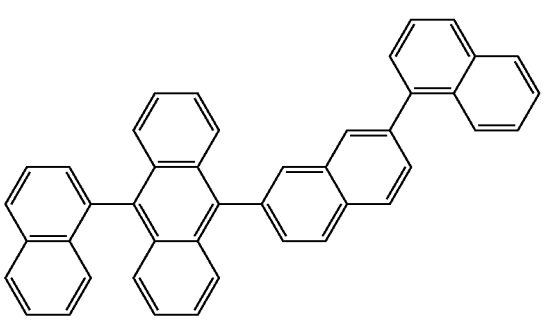
H20
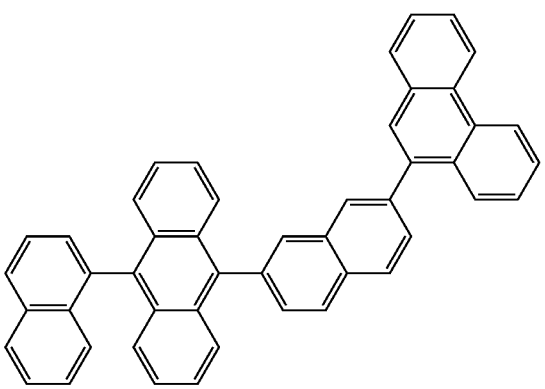
H21
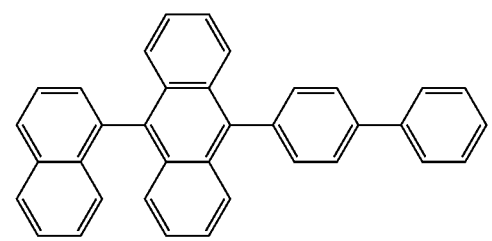
H22
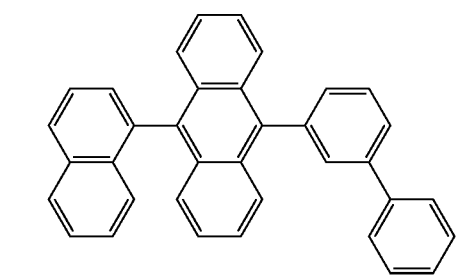
H23
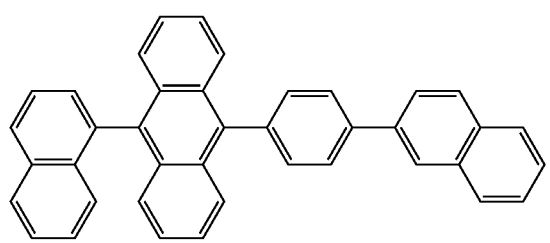
H24
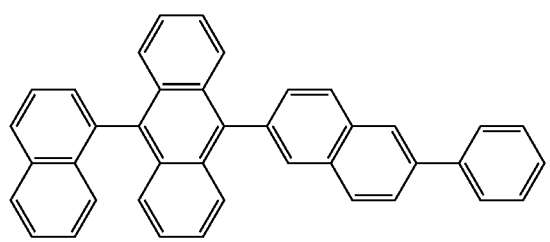
H25
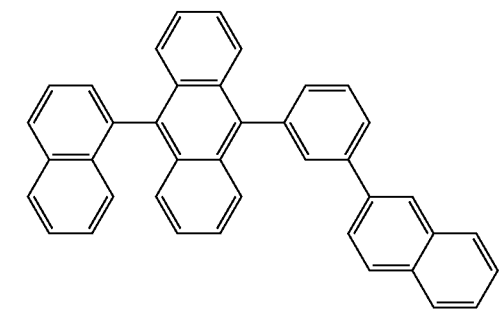
H26
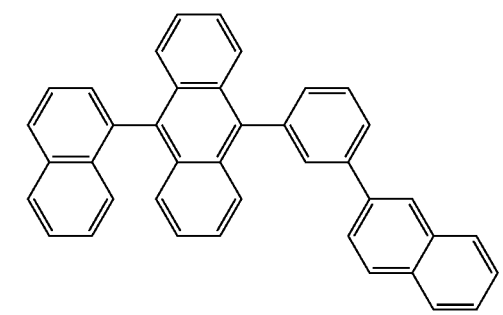
H27
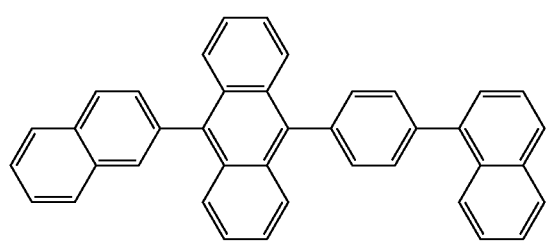

-continued
H28
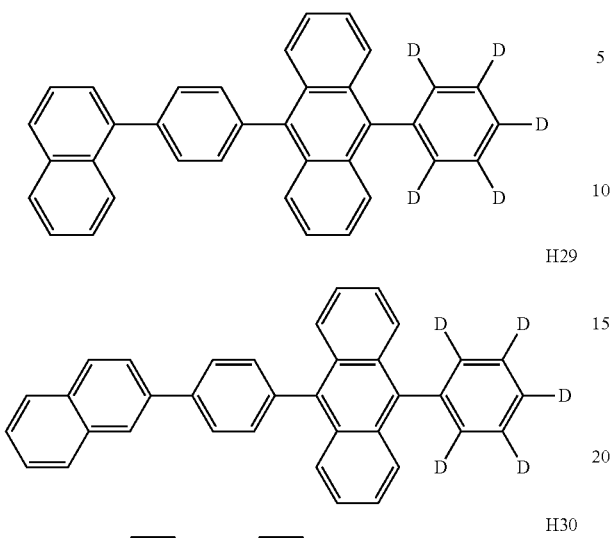
H29
H30
H31
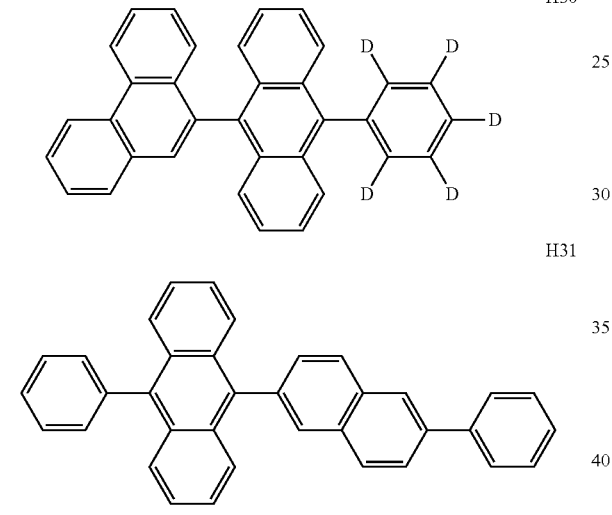
H32
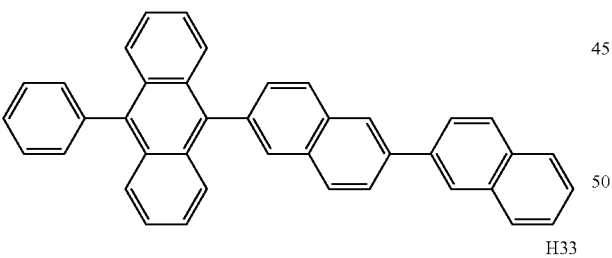
H33
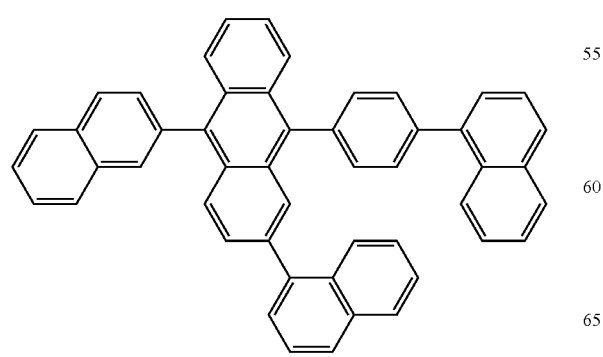
-continued
H34
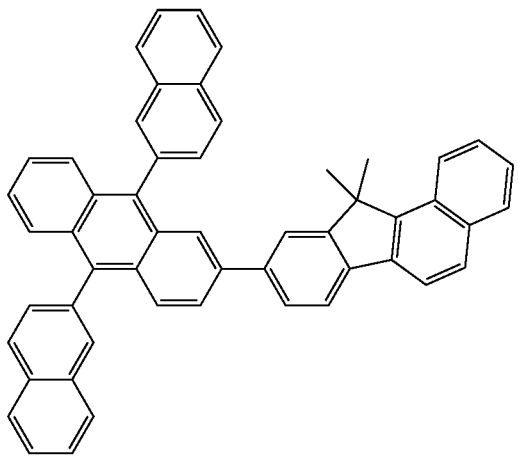
H35
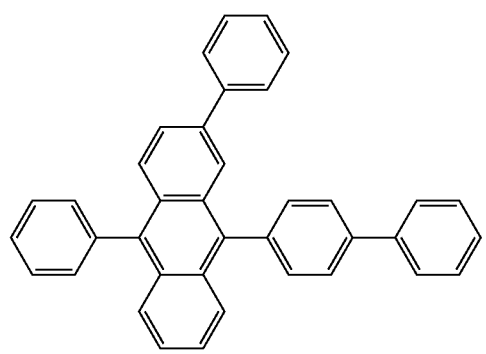
H36
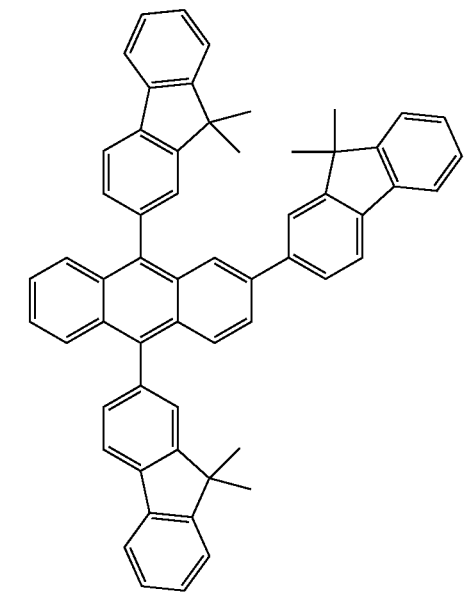

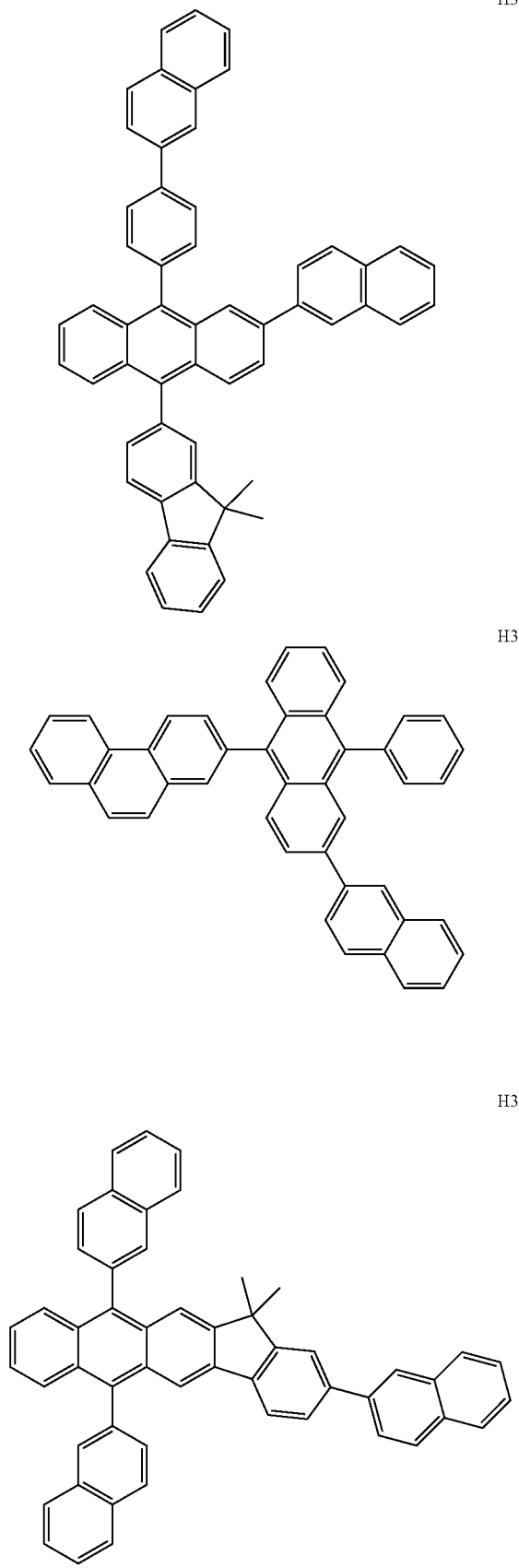

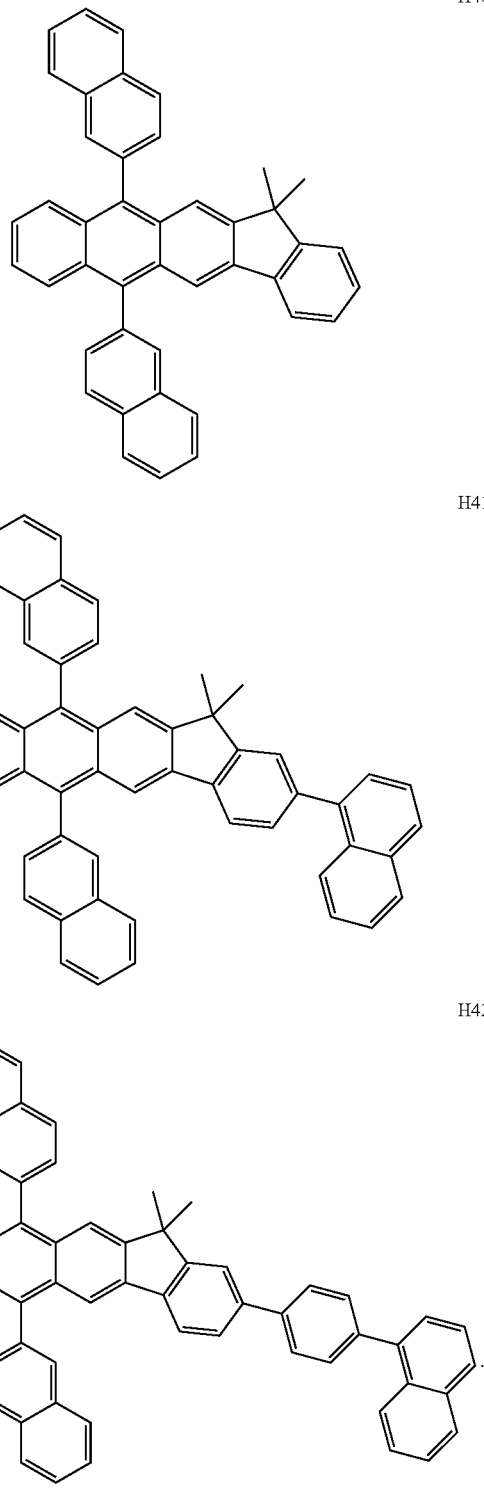

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

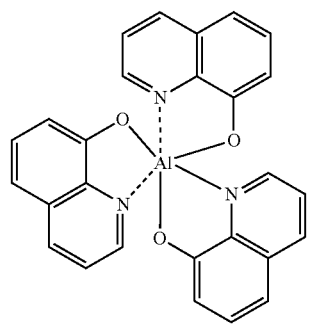

Alq$_3$

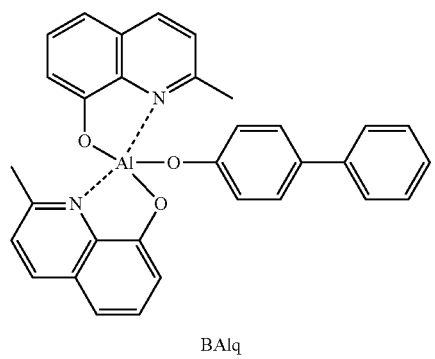

BAlq

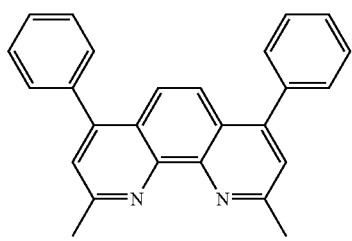

BCP

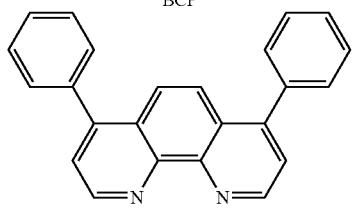

Bphen

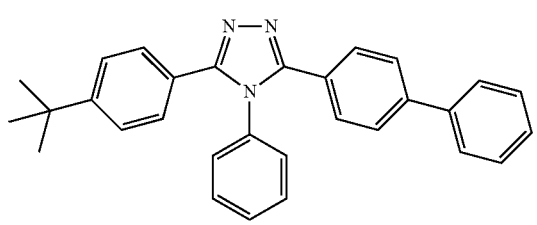

TAZ

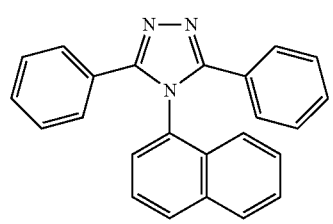

NTAZ

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, Alq$_3$, BAlq, TAZ, and NTAZ.

In one or more embodiments, the electron transport layer may include at least one of ET1 and ET25, but are not limited thereto:

-continued
ET1
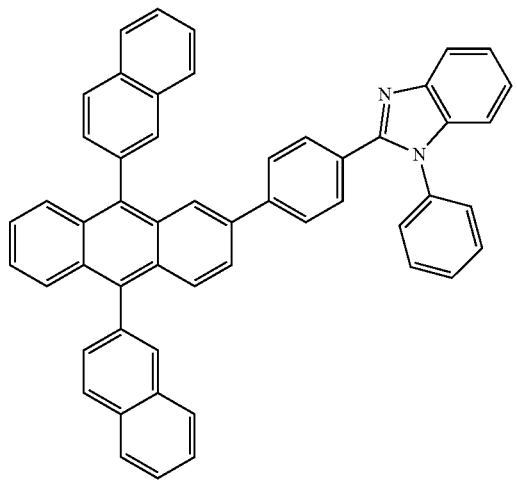
ET2
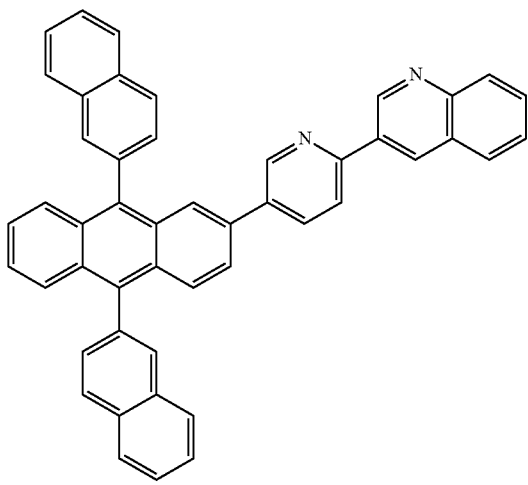
ET3
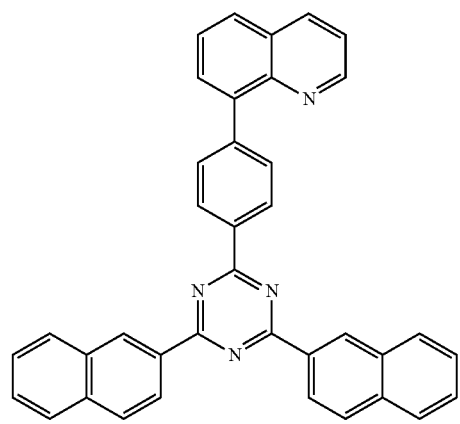
ET4
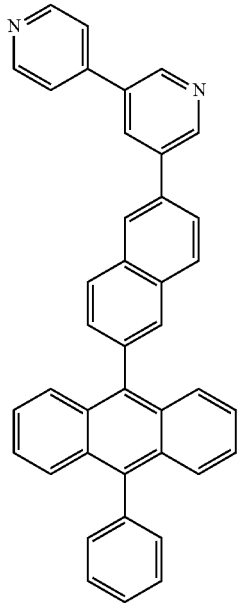
ET5
ET6
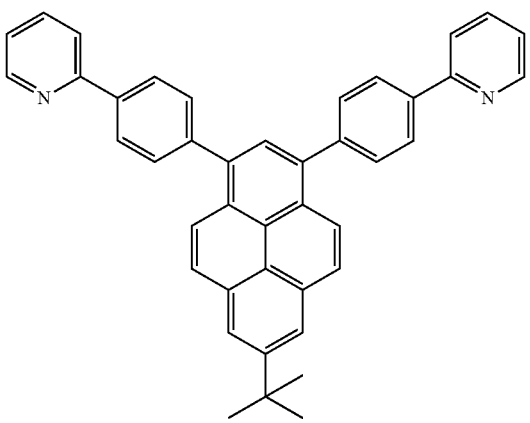

99
-continued
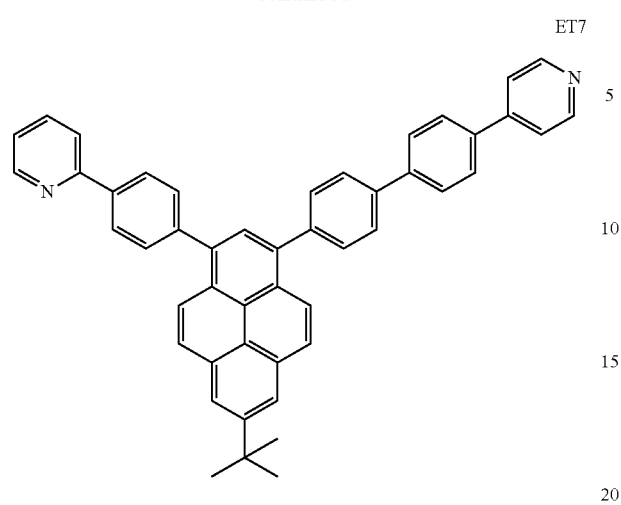
ET7
ET8
ET9
100
-continued
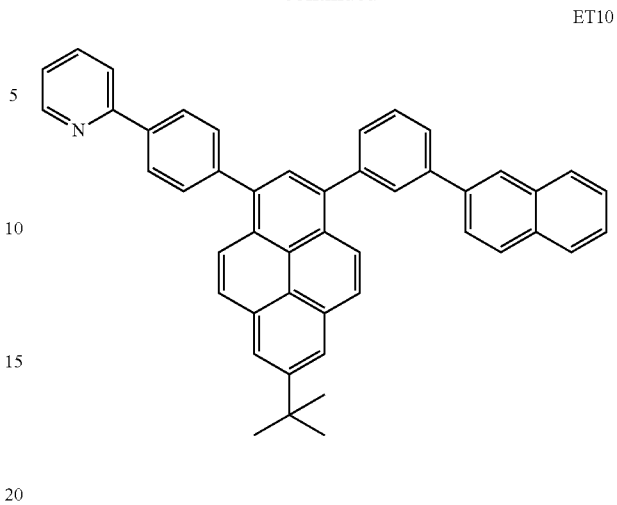
ET10
ET11
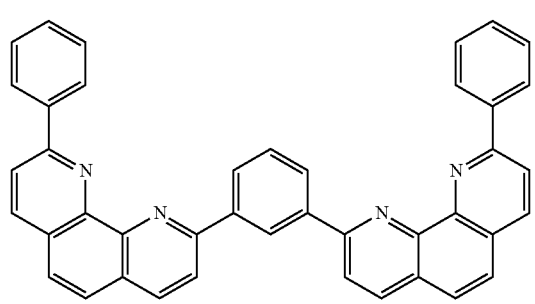
ET12
ET13
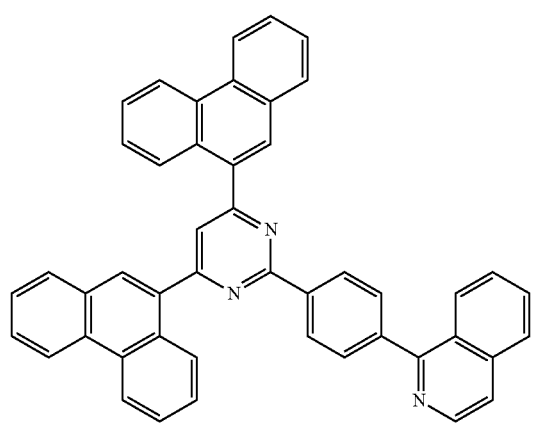

ET14
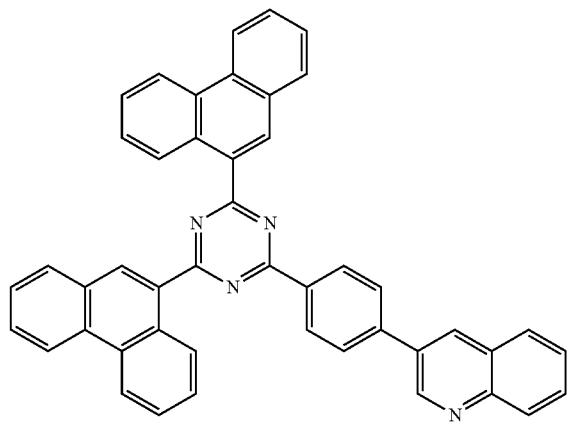
ET15
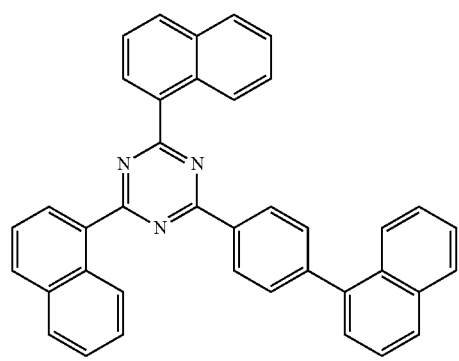
ET16
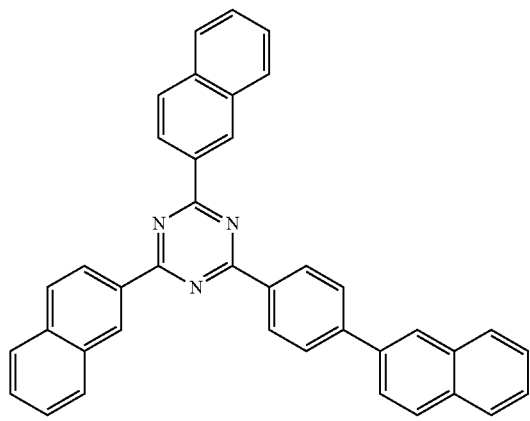
ET17
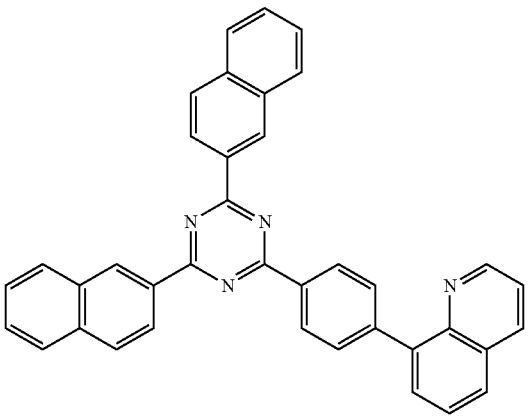
ET18
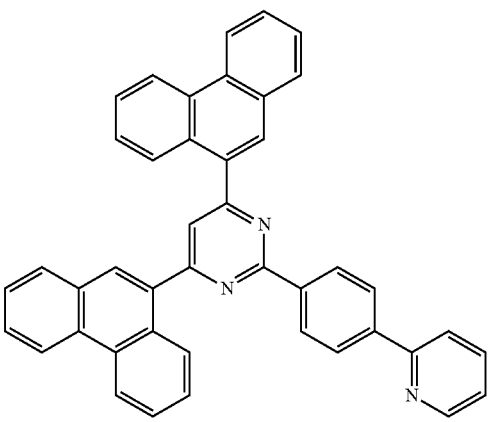
ET19
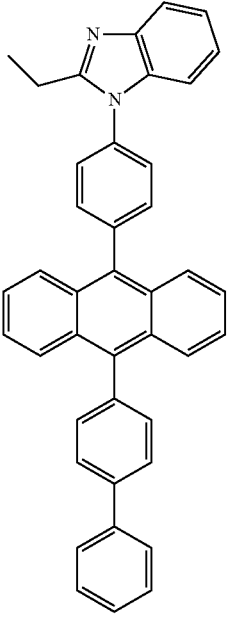

ET20
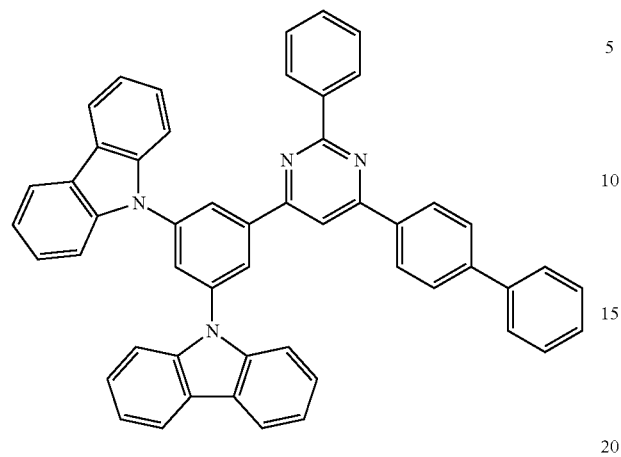
ET23
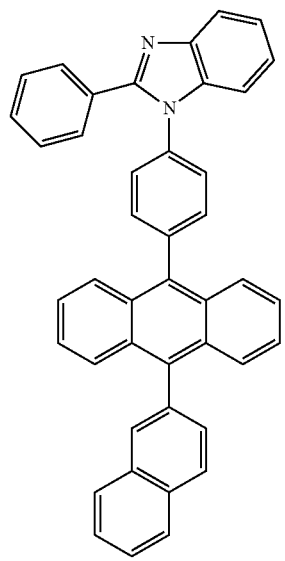
ET21
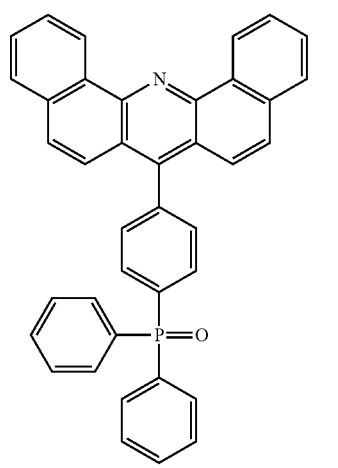
ET24
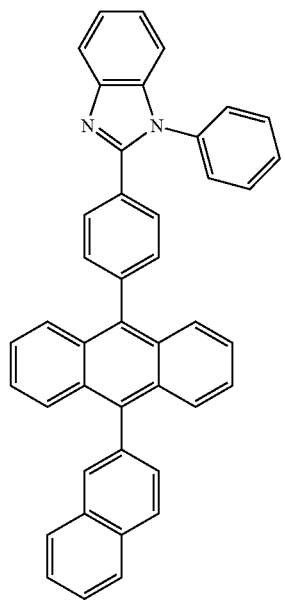
ET22
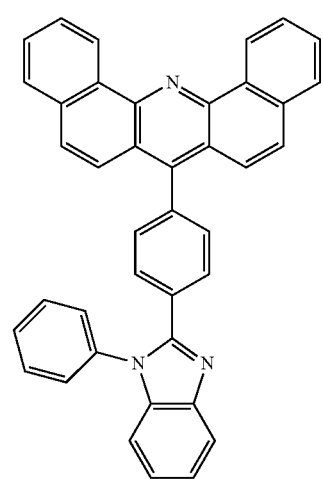
ET25
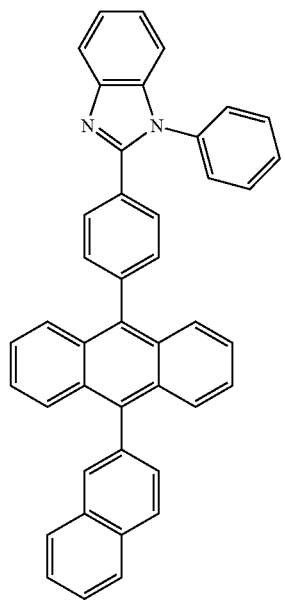
A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

ET-D1

ET-D2

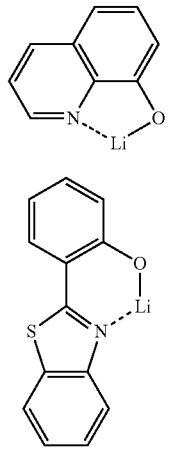

The electron transport region may include an electron injection layer that promotes flow of electrons from the second electrode thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy (iso-propoxy) group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and that has no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-

$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, P, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group," as used herein, refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —N(Q₃₁)(Q₃₂), —Si(Q₃₃)(Q₃₄)(Q₃₅), —B(Q₃₆)(Q₃₇), and —P(=O)(Q₃₈)(Q₃₉), and Q$_1$ to Q$_9$, Q$_{11}$ to Q$_{19}$, Q$_{21}$ to Q$_{29}$, and Q$_{31}$ to Q$_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Examples and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 1-103

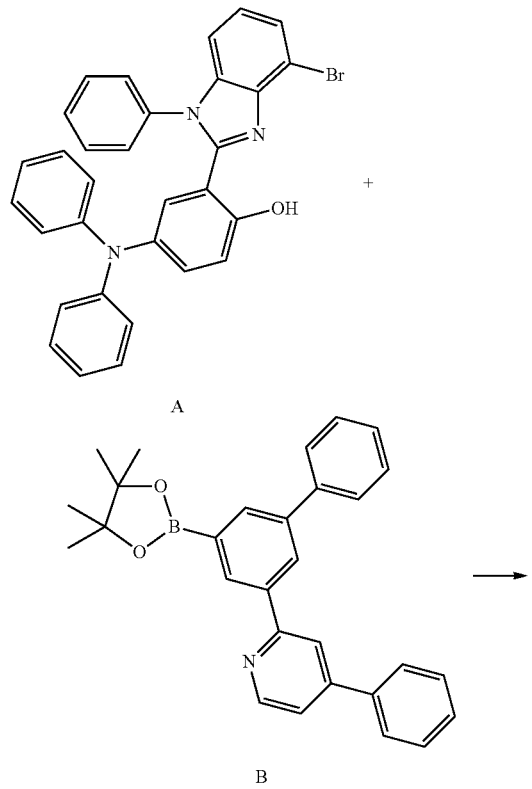

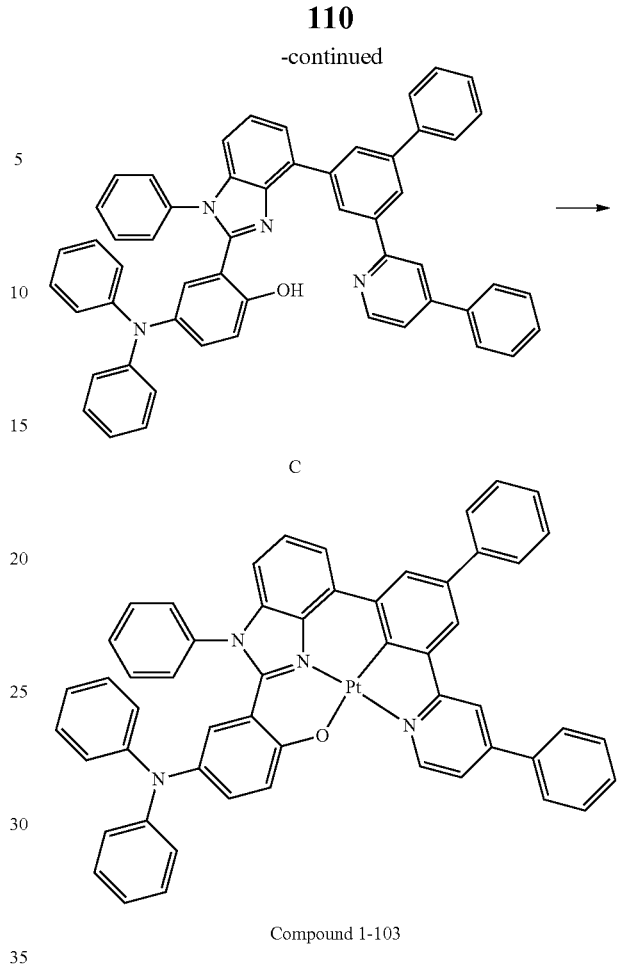

Compound 1-103

Synthesis of Intermediate C (4-(diphenylamino)-2-(1-phenyl-4-(5-(4-phenylpyridin-2-yl)-[1,1'-biphenyl]-3-yl)-1H-benzo[d]imidazol-2-yl)phenol)

5.02 grams (g) (9.43 millimoles, mmol) of Intermediate A (2-(4-bromo-1-phenyl-1H-benzo[d]imidazol-2-yl)-4-(diphenylamino)phenol), 3.88 g (8.96 mmol) of Intermediate B (4-phenyl-2-(5-(4,4,5,5-tetramethyl-1,3,2-dioxaborolan-2-yl)-[1,1'-biphenyl]-3-yl)pyridine), 0.76 g (0.66 mmol) of tetrakis(triphenylphosphine)palladium(0), and 3.26 g (23.57 mmol) of potassium carbonate were mixed with 70 milliliters (mL) of a mixture in which tetrahydrofuran (THF) and distilled water (H$_2$O) were mixed at a ratio of 2:1, and then refluxed for 12 hours. The refluxed mixture was cooled to room temperature and the precipitate was filtered. A filtrate obtained therefrom was washed with ethyl acetate (EA)/H$_2$O, and the crude product was purified by column chromatography (while increasing a rate of EA/Hex (hexane) to between 7% and 10%) to obtain 6.21 g (yield: 91%) of Intermediate C. The obtained product was confirmed by Mass and HPLC analysis.

HRMS (MALDI) calcd for C$_{54}$H$_{38}$N$_4$O: m/z 758.3046, Found: 758.3049.

Synthesis of Compound 1-103

6.21 g (8.18 mmol) of Intermediate C and 3.74 g (9.00 mmol) of K$_2$PtCl$_4$ were mixed with 220 mL of a mixture containing 200 mL of AcOH and 20 mL of H$_2$O, and the resulting mixture was refluxed for 16 hours. The refluxed mixture was cooled to room temperature and the precipitate was filtered. The obtained precipitate was dissolved again in methylene chloride (MC) and washed with H$_2$O. The crude product was purified by column chromatography (MC 20%, EA 1%, Hex 79%) to obtain 4.57 g (purity: 99% or more, yield: 58%) of Compound 1-103. The obtained product was confirmed by Mass and HPLC analysis.

HRMS (MALDI) calcd for C$_{54}$H$_{36}$N$_4$OPt: m/z 951.9930, Found: 951.9931.

Synthesis Example 2: Synthesis of Compound 1-218

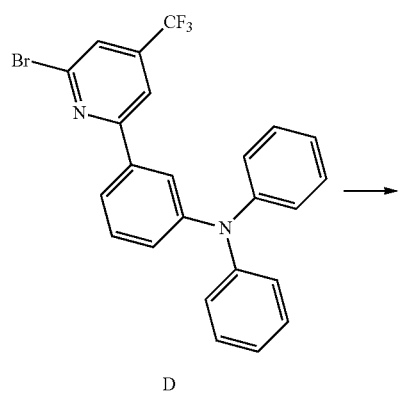

D

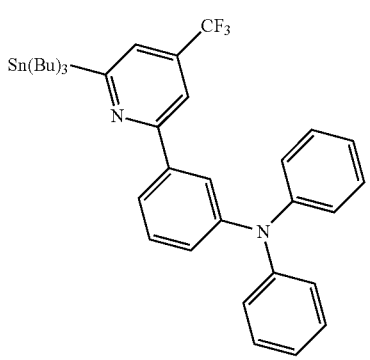

E

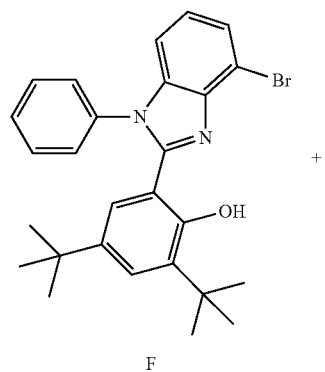

F

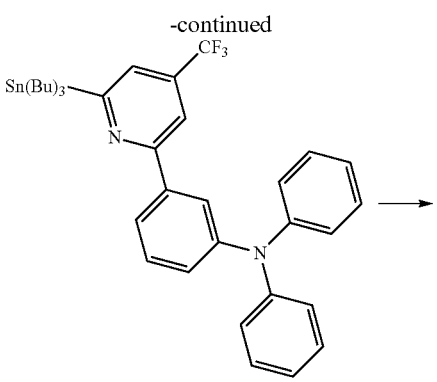

-continued

E

G

Compound 1-218

Synthesis of Intermediate E (N,N-diphenyl-3-(6-(tributylstannyl)-4-(trifluoromethyl)pyridin-2-yl)aniline)

2.00 g of 4.26 mmol of Intermediate D (3-(6-bromo-4-(trifluoromethyl)pyridin-2-yl)-N,N-diphenylaniline) was mixed with 14 mL of THF and stirred at a temperature of −78° C. Then, 2.93 mL (4.69 mmol) of n-butyllithium solution (1.6 M (molar) in hexane) was slowly added thereto. After 1 hour, 1.57 mL (5.54 mmol) of tributyltin chloride was added thereto, and the resulting mixture was slowly heated to room temperature. After the reaction was performed for 6 hours, the reaction solution was diluted with EA and washed with an excess amount of H$_2$O. The solvent was removed therefrom under reduced pressure. 2.90 g (yield: 100%) of Intermediate E obtained therefrom was used in a subsequent reaction without additional purification.

Synthesis of Intermediate G (2,4-di-tert-butyl-6-(4-(6-(3-(diphenylamino)phenyl)-4-(trifluoromethyl)pyridin-2-yl)-1-phenyl-1H-benzo[d]imidazol-2-yl)phenol)

2.26 g (4.73 mmol) of Intermediate F (2-(4-bromo-1-phenyl-1H-benzo[d]imidazol-2-yl)-4,6-di-tert-butylphenol), 2.90 g (4.26 mmol) of Intermediate E, 0.38 g (0.33 mmol) of tetrakis(triphenylphosphine)palladium(0), and 0.55 g (9.47 mmol) of potassium fluoride were mixed with 25 mL of toluene, and the resulting mixture was refluxed for 12 hours. The refluxed mixture was cooled to room temperature and the precipitate was filtered. A filtrate obtained therefrom was washed with EA/H$_2$O, and the crude product was purified by column chromatography (while increasing a rate of EA/Hex (hexane) to between 1% and 5%) to obtain 0.77 g (yield: 21%) of Intermediate G. The obtained product was confirmed by Mass and HPLC analysis.

HRMS (MALDI) calcd for $C_{51}H_{45}F_3N_4O$: m/z 786.3545, Found: 786.3541.

Synthesis of Compound 1-218

0.77 g (0.98 mmol) of Intermediate G and 0.45 g (1.08 mmol) of $K_2PtCl_4$ were mixed with 42 mL of a solvent containing a mixture of 40 mL of AcOH and 2 mL of H$_2$O, and the resulting mixture was refluxed for 16 hours. The refluxed mixture was cooled to room temperature and the precipitate was filtered. The obtained precipitate was mixed again with MC and washed with H$_2$O. The crude product was purified by column chromatography (MC 30%, Hex 70%) to obtain 0.68 g (purity: 99% or more, yield: 71%) of Compound 1-218. The obtained product was confirmed by Mass and HPLC analysis.

HRMS (MALDI) calcd for $C_{51}H_{43}F_3N_4OPt$: m/z 979.3037, Found: 979.3039.

Example 1

An ITO glass substrate was cut to a size of 50 mm×50 mm×0.5 mm (mm=millimeter), sonicated with acetone, isopropyl alcohol, and pure water each for 15 minutes, and then cleaned by exposure to ultraviolet (UV) rays and ozone for 30 minutes.

Then, m-MTDATA was deposited on an ITO electrode (anode) of the ITO glass substrate at a deposition rate of 1 Angstroms per second (Å/sec) to form a hole injection layer having a thickness of 600 Å, and α-NPD was deposited on the hole injection layer at a deposition rate of 1 Å/sec to form a hole transport layer having a thickness of 250 Å.

Compound 1-103 (dopant) and CBP (host) were respectively co-deposited on the hole transport layer at deposition rates of 0.1 Å/sec and 1 Å/sec to form an emission layer having a thickness of 400 Å.

BAlq was deposited on the emission layer at a deposition rate of 1 Å/sec to form a hole blocking layer having a thickness of 50 Å, Alq$_3$ was deposited on the hole blocking layer to form an electron transport layer having a thickness of 300 Å, LiF was deposited on the electron transport layer to form an electron injection layer having a thickness of 10 Å, and Al was vacuum-deposited on the electron injection layer to form a second electrode (cathode) having a thickness of 1,200 Å, thereby completing the manufacture of an organic light-emitting device having a structure of ITO/m-MTDATA (600 Å)/α-NPD (250 Å)/CBP+Compound 1-103 (10%) (400 Å)/BAlq (50 Å)/Alq$_3$ (300 Å)/LiF (10 Å)/Al (1200 Å).

Example 2

An organic light-emitting device was manufactured in the same manner as in Example 1, except that Compound 1-218 was used instead of Compound 1-103 as a dopant in forming an emission layer.

Since the organometallic compound has excellent electrical characteristics and thermal stability, an organic light-emitting device including the organometallic compound may have excellent driving voltage, efficiency, power, color purity, and lifespan characteristics. Also, since the organometallic compound has excellent phosphorescent emission characteristics, a diagnostic composition having high diagnostic efficiency may be provided by using the organometallic compound.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present description as defined by the following claims.

What is claimed is:

1. An organometallic compound represented by Formula 1:

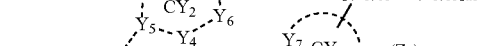

wherein, in Formulae 1 and 2,

M is beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ is O or S, and a bond between $X_1$ and M is a covalent bond, $X_2$ to $X_4$ are each independently N or C, one bond selected from a bond between $X_2$ and M, a bond between $X_3$ and M, and a bond between $X_4$ and M is a covalent bond, and the others thereof are each a coordinate bond, $Y_1$ to $Y_9$ are each independently C or N, $Y_{10}$ and $Y_{11}$ are each independently C, N, O, Si, or S, $Y_1$ and $Y_{10}$, $Y_1$ and $Y_2$, $Y_2$ and $Y_3$, $Y_2$ and $Y_4$, $Y_4$ and $Y_5$, $X_{51}$ and $Y_3$, $X_{51}$ and $Y_5$, $Y_4$ and $Y_6$, $X_3$ and $Y_7$, $X_3$ and $Y_8$, $X_4$ and $Y_9$, and $X_4$ and $Y_{11}$ are each linked via a chemical bond, a bond between $Y_2$ and $Y_3$, a bond between $Y_6$ and $Y_7$, and a bond between $Y_8$ and $Y_9$ are each a single bond, $CY_1$ to $CY_5$ are each independently a $C_5$-$C_{30}$ carbocyclic group or a $C_1$-$C_{30}$ heterocyclic group, a cyclometallated ring formed by $CY_5$, $CY_2$, $CY_3$, and M is a 6-membered ring, $X_{51}$ is O, S, $N[(L_7)_{b7}\text{-}(R_7)_{c7}]$, $C[(L_7)_{b7}\text{-}(R_7)_{c7}][(L_8)_{b8}\text{-}(R_8)_{c8}]$, $Si[(L_7)_{b7}\text{-}(R_7)_{c7}][(L_8)_{b8}\text{-}(R_8)_{c8}]$, $C(=O)$, N, $C[(L_7)_{b7}\text{-}(R_7)_{c7}]$, or $Si[(L_7)_{b7}\text{-}(R_7)_{c7}]$, $R_7$ and $R_8$ are optionally linked via a first linking group to form a substituted or unsubstituted $C_5$-$C_{30}$ carbocyclic group or a substituted or unsubstituted $C_1$-$C_{30}$ heterocyclic group, $L_1$ to $L_4$, $L_7$, $L_8$, $L_{61}$, and $L_{62}$ are each independently selected from a single bond, a substituted or unsubstituted $C_5$-$C_{30}$ carbocyclic group, and a substituted or unsubstituted $C_1$-$C_{30}$ heterocyclic group, b1 to b4, b7, b8, b61, and b62 are each independently an integer from 1 to 5, $R_1$ to $R_4$, $R_7$, and $R_8$ are each independently selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{10}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_3)(Q_4)(Q_5)$, —$B(Q_6)(Q_7)$, and —$P(=O)(Q)(Q_9)$, $R_{61}$ and $R_{62}$ are each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, c1 to c4, c7, c8, c61, and c62 are each independently an integer from 1 to 5, $Z_1$ to $Z_4$ are each independently a group represented by Formula 2, a1 to a4 and n1 to n4 are each independently an integer from 0 to 20, two in a plurality of groups $R_1$ are optionally linked to form a substituted or unsubstituted $C_5$-$C_{30}$ carbocyclic group or a substituted or unsubstituted $C_1$-$C_{30}$ heterocyclic group, two in a plurality of groups $R_2$ are optionally linked to form a substituted or unsubstituted $C_5$-$C_{30}$ carbocyclic group or a substituted or unsubstituted $C_1$-$C_{30}$ heterocyclic group, two in a plurality of groups $R_3$ are optionally linked to form a substituted or unsubstituted $C_5$-$C_{30}$ carbocyclic group or a substituted or unsubstituted $C_1$-$C_{30}$ heterocyclic group, two in a plurality of groups $R_4$ are optionally linked to form a substituted or unsubstituted $C_5$-$C_{30}$ carbocyclic group or a substituted or unsubstituted $C_1$-$C_{30}$ heterocyclic group, two or more in $R_1$ to $R_4$ are optionally linked to form a substituted or unsubstituted $C_5$-$C_{30}$ carbocyclic group or a substituted or unsubstituted $C_1$-$C_{30}$ heterocyclic group, i) when $X_{51}$ is O, S, $C(=O)$, or N, the sum of n, n2, n3, and n4 is one or more, ii) when $X_{51}$ is $N[(L_7)_{b7}\text{-}(R_7)_{c7}]$, $C[(L_7)_{b7}\text{-}(R_7)_{c7}]$, or $Si[(L_7)_{b7}\text{-}(R_7)_{c7}]$, $R_7$ is a group represented by Formula 2 or the sum of n, n2, n3, and n4 is one or more, and iii) when $X_{51}$ is $C[(L_7)_{b7}\text{-}(R_7)_{c7}][(L_8)_{b8}\text{-}(R_8)_{c8}]$ or $Si[(L_7)_{b7}\text{-}(R_7)_{c7}][(L_8)_{b8}\text{-}(R_8)_{c8}]$, at least one of $R_7$ and $R_8$ is a group represented by Formula 2 or the sum of n, n2, n3, and n4 is one or more,

* indicates a binding site to a neighboring atom, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_3$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{10}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

2. The organometallic compound of claim 1, wherein $Y_1$ is C, and i) $X_2$ and $X_4$ are each N, $X_3$ is C, a bond between $X_2$ and M and a bond between $X_4$ and M are each a coordinate bond, and a bond between $X_3$ and M is a covalent bond, or ii) $X_2$ and $X_3$ are each N, $X_4$ is C, a bond between $X_2$ and M and a bond between $X_3$ and M are each a coordinate bond, and a bond between $X_4$ and M is a covalent bond.

3. The organometallic compound of claim 1, wherein $CY_1$ to $CY_4$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

4. The organometallic compound of claim 1, wherein i) $Y_3$ and $Y_5$ are each C, a bond between $X_{51}$ and $Y_3$ and a bond between $X_{51}$ and $Y_5$ are each a single bond, and $X_{51}$ is O, S, N[($L_7$)$_{b7}$-($R_7$)$_{c7}$], C[($L_7$)$_{b7}$-($R_7$)$_{c7}$][($L_8$)$_{b8}$-($R_8$)$_{c8}$], Si[($L_7$)$_{b7}$-($R_7$)$_{c7}$][($L_8$)$_{b8}$-($R_8$)$_{c8}$], or C(=O), ii) $Y_3$ is C, $Y_5$ is N, a bond between $X_{51}$ and $Y_3$ is a double bond, a bond between $X_{51}$ and $Y_5$ is a single bond, and $X_{51}$ is N, C[($L_7$)$_{b7}$-($R_7$)$_{c7}$], or Si[($L_7$)$_{b7}$-($R_7$)$_{c7}$], or iii) $Y_3$ is N, $Y_5$ is C, a bond between $X_{51}$ and $Y_3$ is a single bond, a bond between $X_{51}$ and $Y_5$ is a double bond, and $X_{51}$ is N, C[($L_7$)$_{b7}$-($R_7$)$_{c7}$], or Si[($L_7$)$_{b7}$-($R_7$)$_{c7}$].

5. The organometallic compound of claim 1, wherein $L_1$ to $L_4$, $L_7$, $L_8$, $L_{61}$, and $L_{62}$ are each independently selected from:

a single bond, a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group; and a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a C1-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_{31}$ to $Q_{39}$ are each independently selected from:

—$H_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an isopentyl group, a secpentyl group, a tert-pentyl group, a phenyl group, a biphenyl group, and a naphthyl group; and an n-propyl group, an iso-propyl group, an n-butyl group, an iso-butyl group, a sec-butyl group, a tert-butyl group, an n-pentyl group, an isopentyl group, a secpentyl group, a tert-pentyl group, a phenyl group, a biphenyl group, and a naphthyl group, each substituted with at least one selected from deuterium, a $C_1$-$C_{10}$ alkyl group, and a phenyl group.

6. The organometallic compound of claim 1, wherein $R_1$ to $R_4$, $R_7$, $R_8$, $R_{61}$, and $R_{62}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si($Q_{33}$)($Q_{34}$)($Q_{35}$); and —Si($Q_3$)($Q_4$)($Q_5$), —B($Q_6$)($Q_7$), and —P(=O)($Q_8$)($Q_9$), and $Q_3$ to $Q_9$ and $Q_{33}$ to $Q_{35}$ are each independently selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, a biphenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, a biphenyl group, and a naphthyl group, each substituted with at least one selected from deuterium, a $C_1$-$C_{10}$ alkyl group, and a phenyl group.

7. The organometallic compound of claim 1, wherein $R_1$ to $R_4$, $R_7$, $R_8$, $R_{61}$, and $R_{62}$ are each independently selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-19, groups represented by Formulae 10-1 to 10-139, and —Si($Q_3$)($Q_4$)($Q_5$):

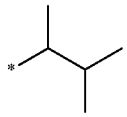

Formula 9-1

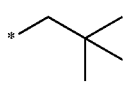

Formula 9-2

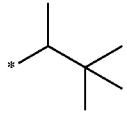

Formula 9-3

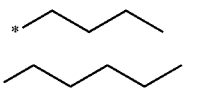

Formula 9-4

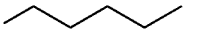

Formula 9-5

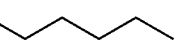

Formula 9-6

-continued

Formula 9-7

Formula 9-8

Formula 9-9

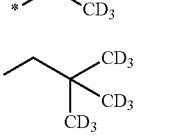

Formula 9-10

Formula 9-11

Formula 9-12

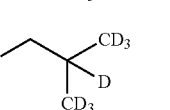

Formula 9-13

Formula 9-14

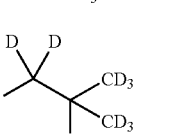

Formula 9-15

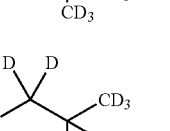

Formula 9-16

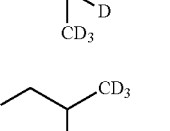

Formula 9-17

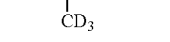

Formula 9-18

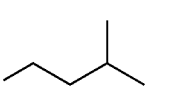

Formula 9-19

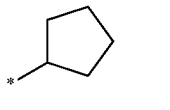

Formula 10-1

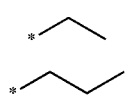

Formula 10-2

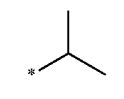
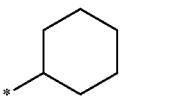

Formula 10-3

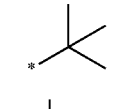
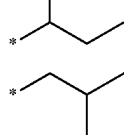
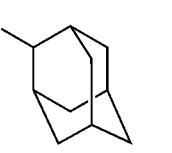

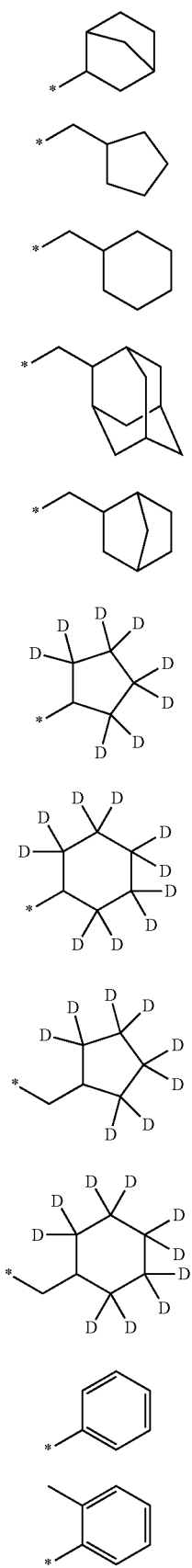

-continued
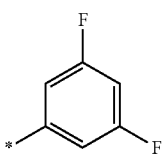
Formula 10-26
Formula 10-27
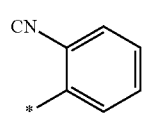
Formula 10-28
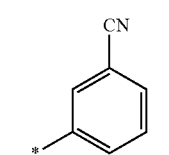
Formula 10-29
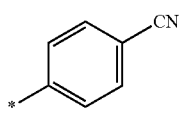
Formula 10-30
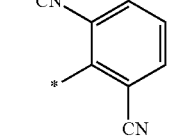
Formula 10-31
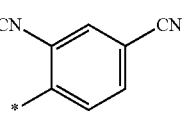
Formula 10-32
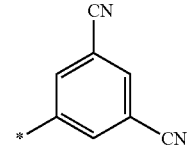
Formula 10-33
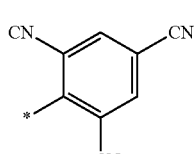
Formula 10-34
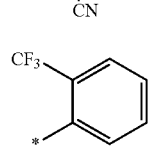
Formula 10-35
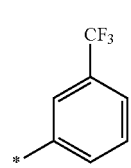
Formula 10-36
-continued
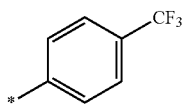
Formula 10-37
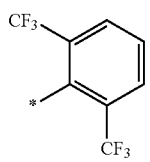
Formula 10-38
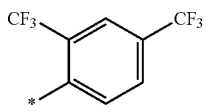
Formula 10-39
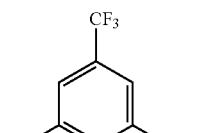
Formula 10-40
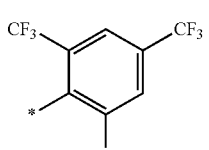
Formula 10-41
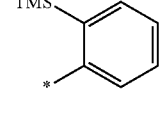
Formula 10-42
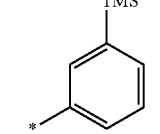
Formula 10-43
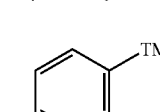
Formula 10-44
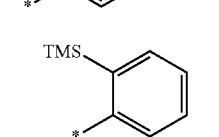
Formula 10-45
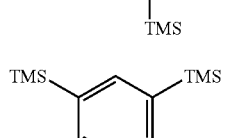
Formula 10-46
Formula 10-47

-continued
Formula 10-48
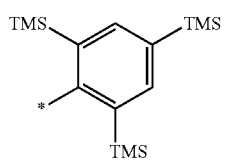
Formula 10-49
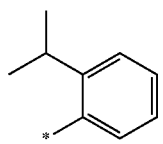
Formula 10-50
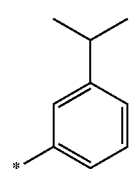
Formula 10-51
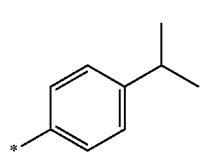
Formula 10-52
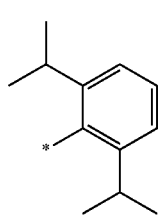
Formula 10-53
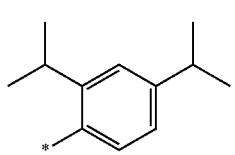
Formula 10-54
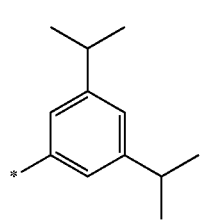
Formula 10-55
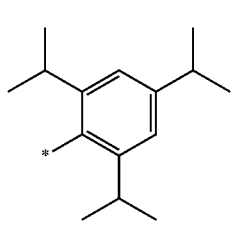
Formula 10-56
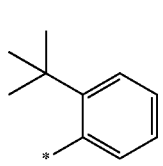
-continued
Formula 10-57
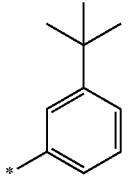
Formula 10-58
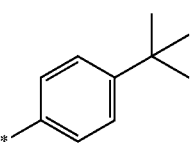
Formula 10-59
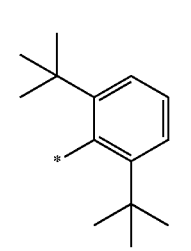
Formula 10-60
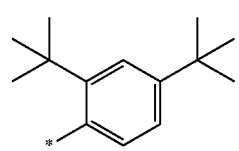
Formula 10-61
Formula 10-62
Formula 10-63
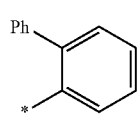
Formula 10-64
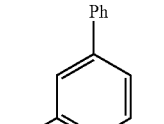
Formula 10-65
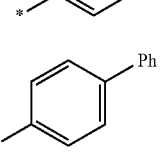

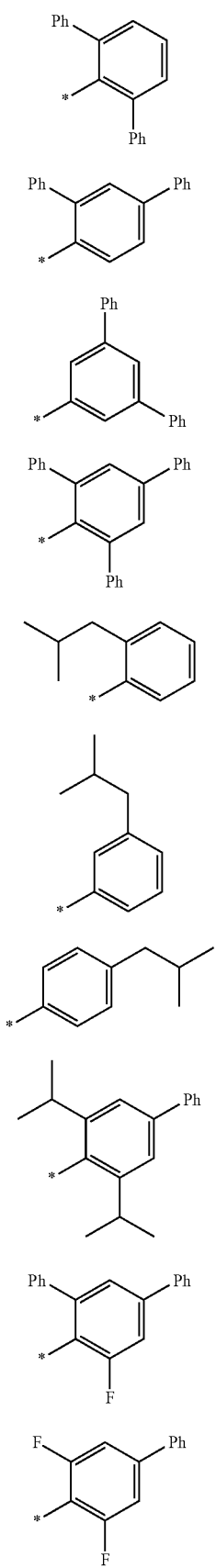
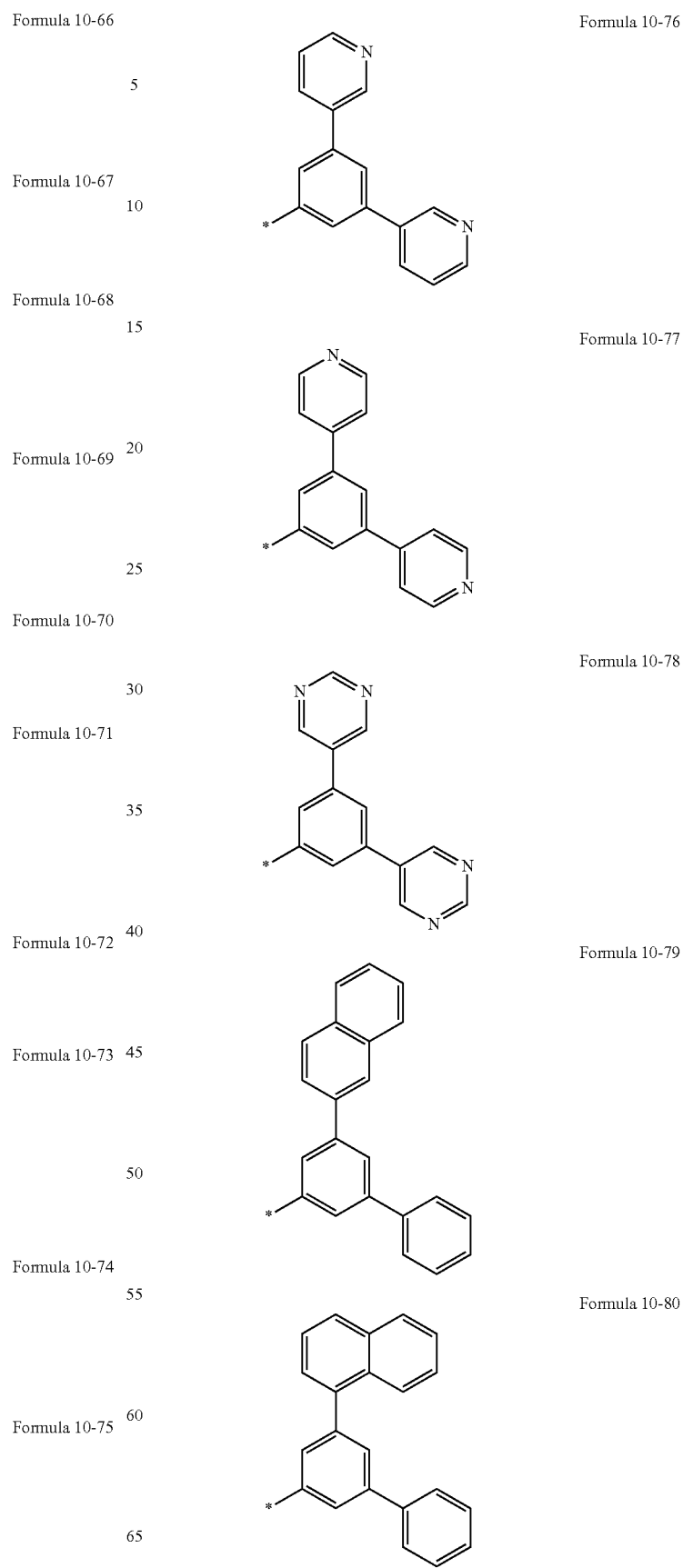

-continued
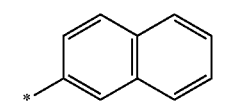
Formula 10-81
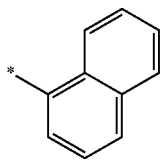
Formula 10-82
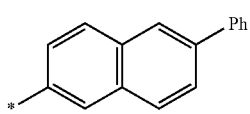
Formula 10-83
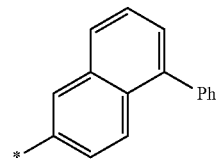
Formula 10-84
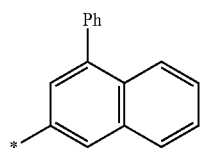
Formula 10-85
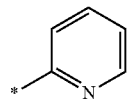
Formula 10-86
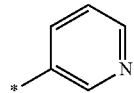
Formula 10-87
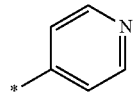
Formula 10-88
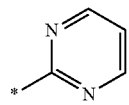
Formula 10-89
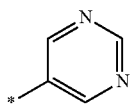
Formula 10-90
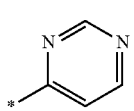
Formula 10-91
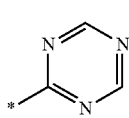
Formula 10-92
-continued
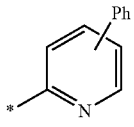
Formula 10-93
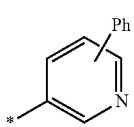
Formula 10-94
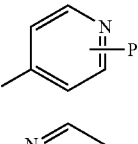
Formula 10-95
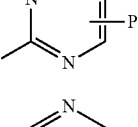
Formula 10-96
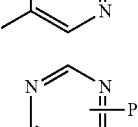
Formula 10-97
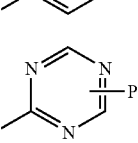
Formula 10-98
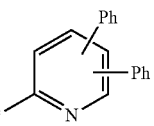
Formula 10-99
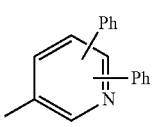
Formula 10-100
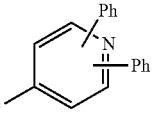
Formula 10-101
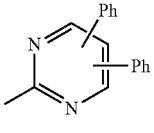
Formula 10-102
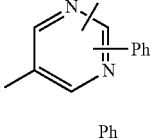
Formula 10-103
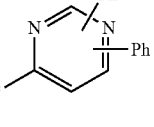
Formula 10-104
Formula 10-105

-continued
Formula 10-106
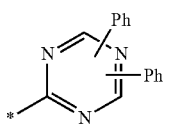
Formula 10-107
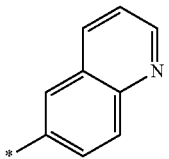
Formula 10-108
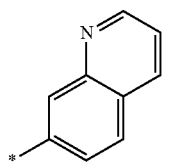
Formula 10-109
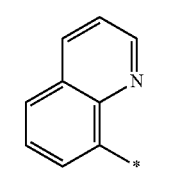
Formula 10-110
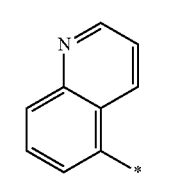
Formula 10-111
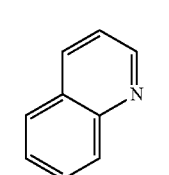
Formula 10-112
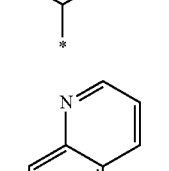
Formula 10-113
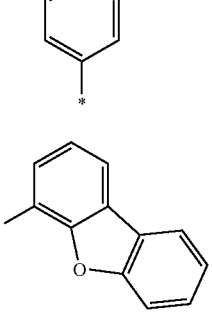
Formula 10-114
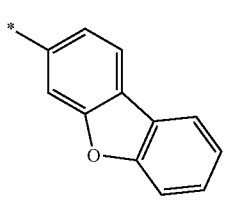
-continued
Formula 10-115
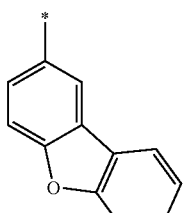
Formula 10-116
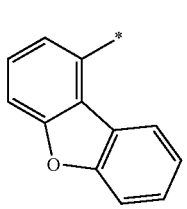
Formula 10-117
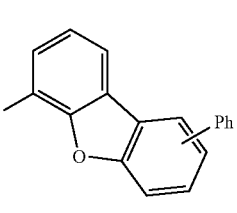
Formula 10-118
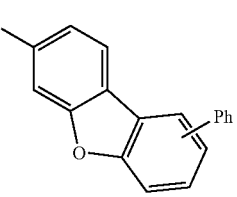
Formula 10-119
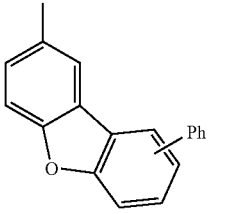
Formula 10-120
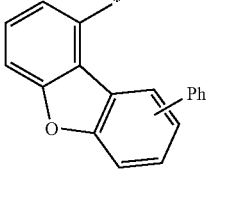
Formula 10-121
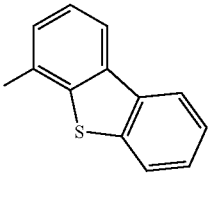
Formula 10-122
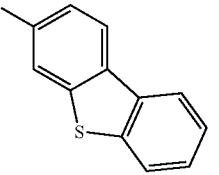

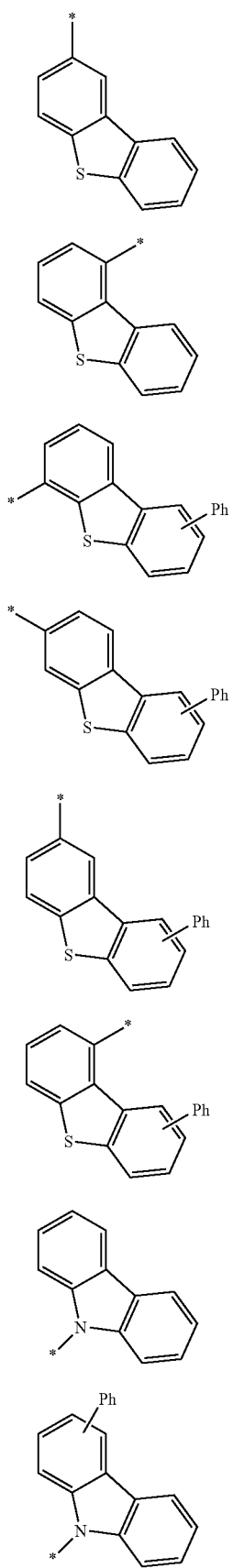
Formula 10-123
Formula 10-124
Formula 10-125
Formula 10-126
Formula 10-127
Formula 10-128
Formula 10-129
Formula 10-130
Formula 10-131
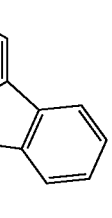
Formula 10-132
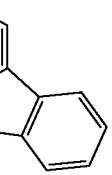
Formula 10-133
Formula 10-134
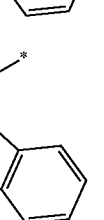
Formula 10-135
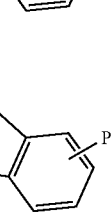
Formula 10-136
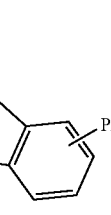
Formula 10-137
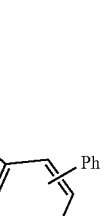
Formula 10-138
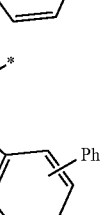

-continued

Formula 10-139

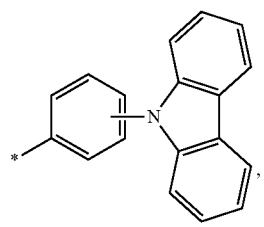

wherein, in Formulae 9-1 to 9-19 and 10-1 to 10-139, "Ph" indicates a phenyl group, "TMS" indicates a trimethylsilyl group, and "*" indicates a binding site to a neighboring atom.

8. The organometallic compound of claim 1, wherein the sum of n1, n2, n3, and n4 is 1 or 2.

9. The organometallic compound of claim 1, wherein a moiety represented by

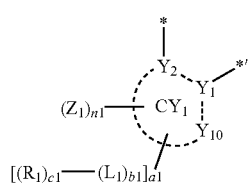

in Formula 1 is selected from groups represented by Formulae CY1-1 to CY1-26:

Formula CY1-1

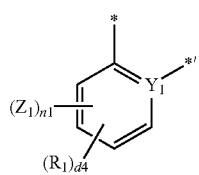

Formula CY1-2

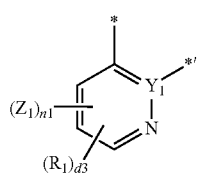

Formula CY1-3

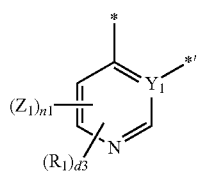

Formula CY1-4

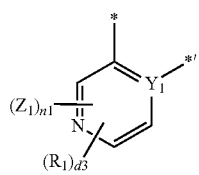

Formula CY1-5

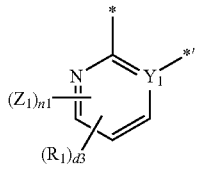

Formula CY1-6

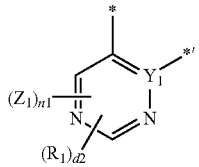

Formula CY1-7

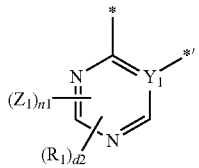

Formula CY1-8

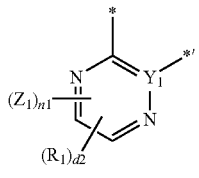

Formula CY1-9

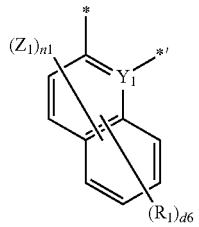

Formula CY1-10

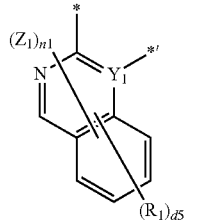

Formula CY1-11

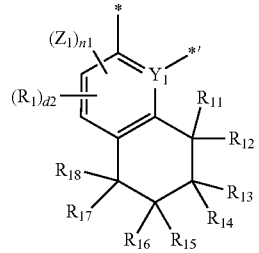

-continued
Formula CY1-12
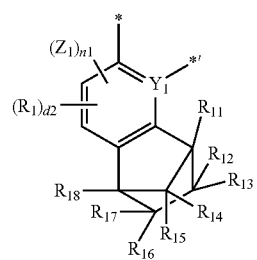
Formula CY1-13
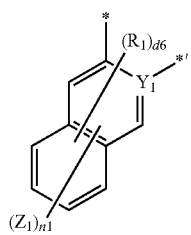
Formula CY1-14
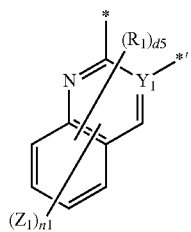
Formula CY1-15
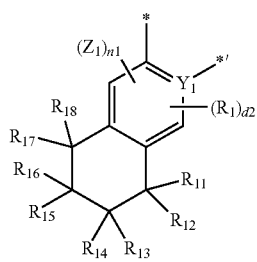
Formula CY1-16
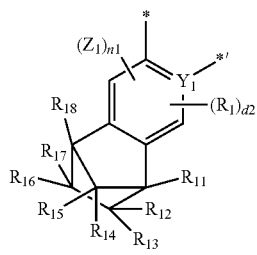
Formula CY1-17
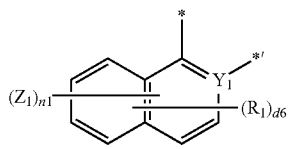
Formula CY1-18
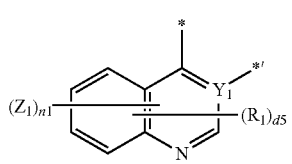
-continued
Formula CY1-19
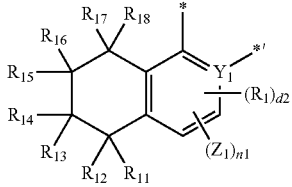
Formula CY1-20
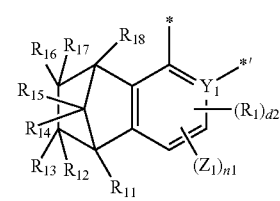
Formula CY1-21
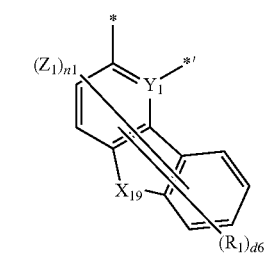
Formula CY1-22
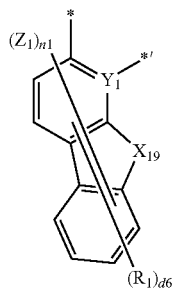
Formula CY1-23
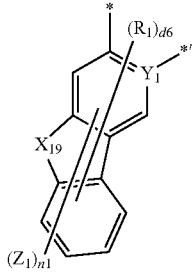
Formula CY1-24
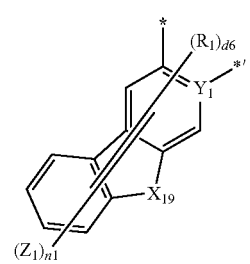

Formula CY1-25

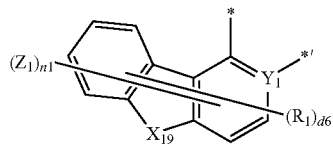

Formula CY1-26

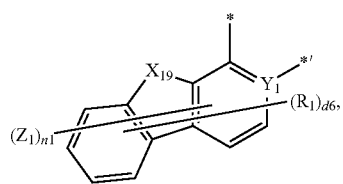

wherein, in Formulae CY1-1 to CY1-26, $Y_1$, $R_1$, $Z_1$, and n1 are each independently the same as described in claim 1, provided that n1 is 0, 1, or 2, $X_{19}$ is $C(R_{19a})(R_{19b})$, $N[(L_{19})_{b19}-(R_{19})_{c19}]$, O, S, or $Si(R_{19a})(R_{19b})$, $L_{19}$ is the same as described in connection with $L_1$ in claim 1, b19 and c19 are each independently the same as described in connection with b1 and c1 in claim 1, $R_{11}$ to $R_{19}$, $R_{19a}$, and $R_{19b}$ are each independently the same as described in connection with $R_1$ in claim 1, d2 is an integer from 0 to 2, d3 is an integer from 0 to 3, d4 is an integer from 0 to 4, d5 is an integer from 0 to 5, d6 is an integer from 0 to 6, and \* and \*' each indicate a binding site to a neighboring atom.

10. The organometallic compound of claim 1, wherein a moiety represented by

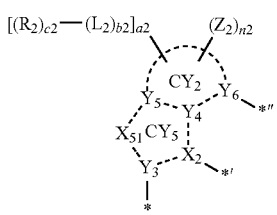

in Formula 1 is selected from groups represented by Formulae CY2-1 to CY2-12:

Formula CY2-1

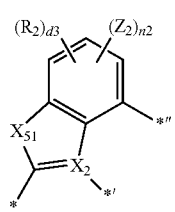

Formula CY2-2

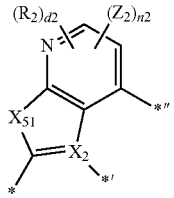

Formula CY2-3

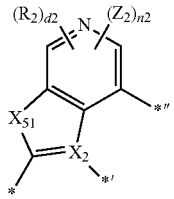

Formula CY2-4

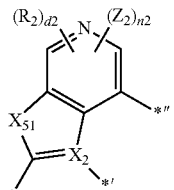

Formula CY2-5

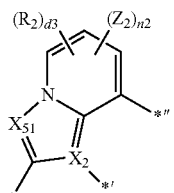

Formula CY2-6

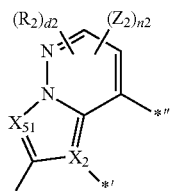

Formula CY2-7

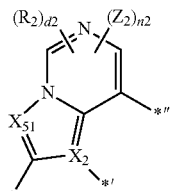

Formula CY2-8

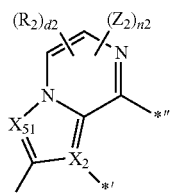

Formula CY2-9
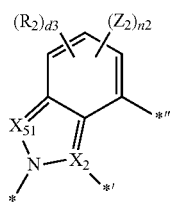

Formula CY2-10
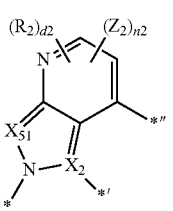

Formula CY2-11
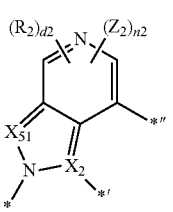

Formula CY2-12
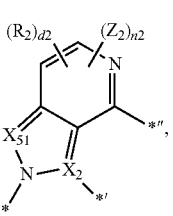

wherein, in Formulae CY2-1 to CY2-12, $X_2$, $R_2$, $Z_2$, and n2 are each independently the same as described in claim 1, provided that n2 is 0, 1, or 2, $X_{51}$ in Formulae CY2-1 to CY2-4 is O, S, N[$(L_7)_{b7}$-$(R_7)_{c7}$], C[$(L_7)_{b7}$-$(R_7)_{c7}$][$(L_8)_{b8}$-$(R_8)_{c8}$], Si[$(L_7)_{b7}$-$(R_7)_{c7}$][$(L_8)_{b8}$-$(R_8)_{c8}$], or C(=O), $X_{51}$ in Formulae CY2-5 to CY2-12 is N, C[$(L_7)_{b7}$-$(R_7)_{c7}$], or Si[$(L_7)_{b7}$-$(R_7)_{c7}$], $L_7$, $L_8$, b7, b8, $R_7$, $R_8$, c7, and c8 are each independently the same as described in claim 1, d2 is an integer from 0 to 2, d3 is an integer from 0 to 3, and

*, *', and *'' each indicate a binding site to a neighboring atom.

11. The organometallic compound of claim 1, wherein a moiety represented by

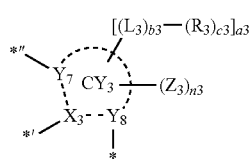

in Formula 1 is selected from groups represented by Formulae CY3-1 to CY3-12:

Formula CY3-1
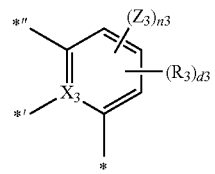

Formula CY3-2
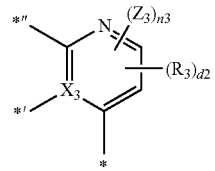

Formula CY3-3
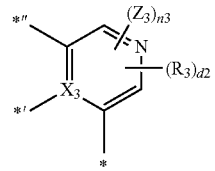

Formula CY3-4
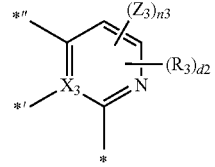

Formula CY3-5
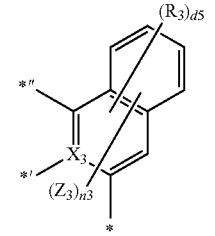

Formula CY3-6
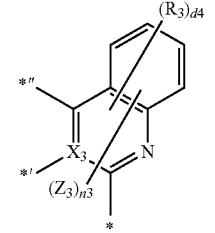

Formula CY3-7
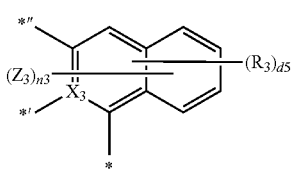

-continued

Formula CY3-8
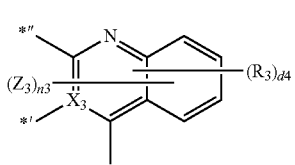

Formula CY3-9

Formula CY3-10

Formula CY3-11

Formula CY3-12 wherein, in Formulae CY3-1 to CY3-12, $X_3$, $R_3$, $Z_3$, and n3 are each independently the same as described in claim 1, provided that n3 is 0, 1, or 2, $X_{39}$ is $C(R_{39a})(R_{39b})$, $N[(L_{39})_{b39}$-$(R_{39})_{c39}]$, O, S, or $Si(R_{39a})(R_{39b})$, $L_{39}$ is the same as described in connection with $L_3$ in claim 1, b39 and c39 are each independently the same as described in connection with b3 and c3 in claim 1, $R_{39a}$ and $R_{39b}$ are each independently the same as described in connection with $R_3$ in claim 1, d2 is an integer from 0 to 2, d3 is an integer from 0 to 3, d4 is an integer from 0 to 4, d5 is an integer from 0 to 5, and

*, *', and *" each indicate a binding site to a neighboring atom.

12. The organometallic compound of claim 1, wherein a moiety represented by

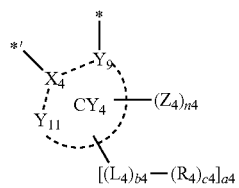

in Formula 1 is selected from groups represented by Formulae CY4-1 to CY4-26:

Formula CY4-1
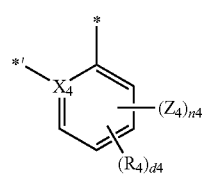

Formula CY4-2
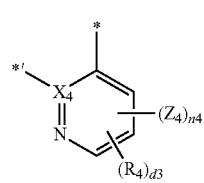

Formula CY4-3
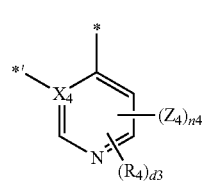

Formula CY4-4
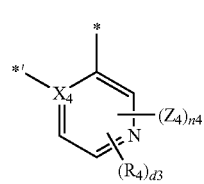

Formula CY4-5
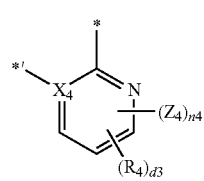

Formula CY4-6
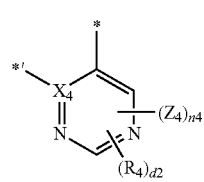

Formula CY4-7
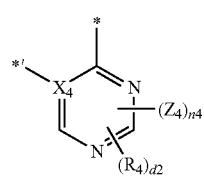

-continued
Formula CY4-8
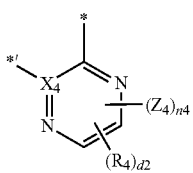
Formula CY4-9
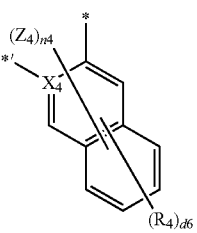
Formula CY4-10
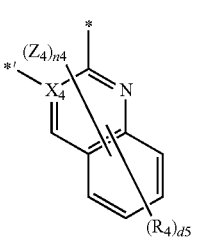
Formula CY4-11
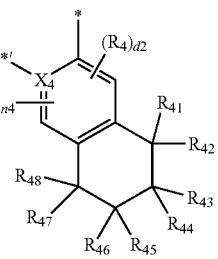
Formula CY4-12
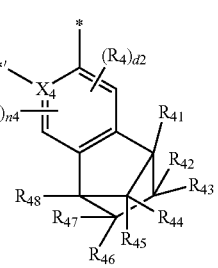
Formula CY4-13
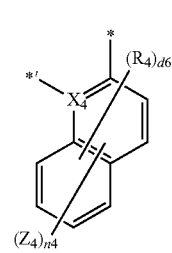
-continued
Formula CY4-14
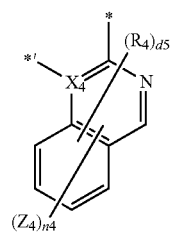
Formula CY4-15
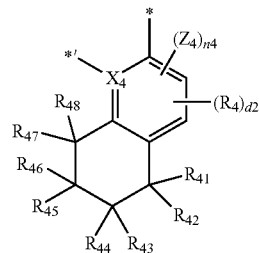
Formula CY4-16
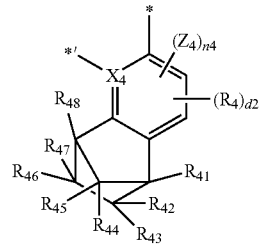
Formula CY4-17
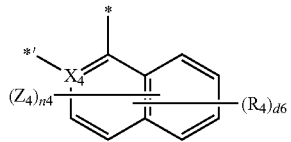
Formula CY4-18
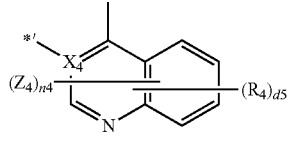
Formula CY4-19
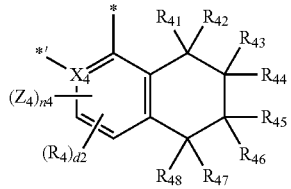
Formula CY4-20
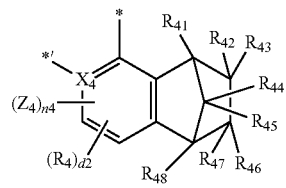

-continued

Formula CY4-21

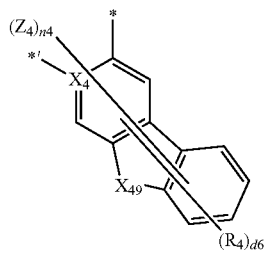

Formula CY4-22

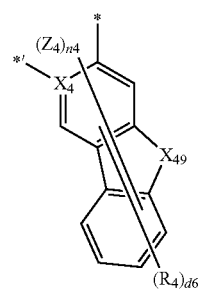

Formula CY4-23

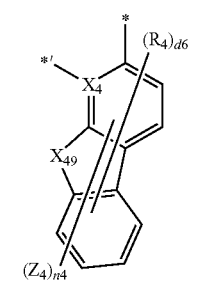

Formula CY4-24

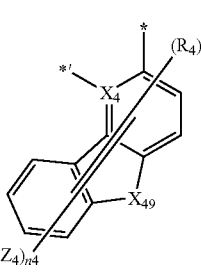

Formula CY4-25

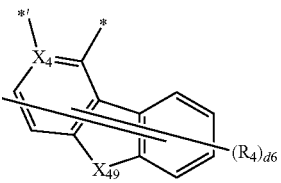

Formula CY4-26

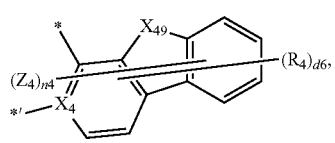

wherein, in Formulae CY4-1 to CY4-26, $X_4$, $R_4$, $Z_4$, and n4 are each independently the same as described in claim 1, provided that n4 is 0, 1, or 2, $X_{49}$ is $C(R_{49a})(R_{49b})$, $N[(L_{49})_{b49}\text{-}(R_{49})_{c49}]$, O, S, or $Si(R_{49a})(R_{49b})$, $L_{49}$ is the same as described in connection with $L_4$ in claim 1, b49 and c49 are each independently the same as described in connection with b4 and c4 in claim 1, $R_{41}$ to $R_{49}$, $R_{49a}$, and $R_{49b}$ are each independently the same as described in connection with $R_4$ in claim 1, d2 is an integer from 0 to 2,
d3 is an integer from 0 to 3,
d4 is an integer from 0 to 4,
d5 is an integer from 0 to 5,
d6 is an integer from 0 to 6, and \* and \*' each indicate a binding site to a neighboring atom.

13. The organometallic compound of claim 1, wherein, in Formula 1,
a moiety represented by

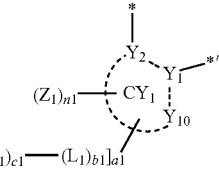

is selected from groups represented by Formulae CY1(1) to CY1(12),
a moiety represented by

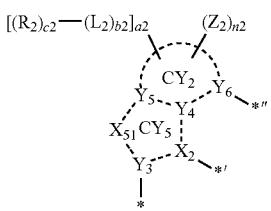

is selected from groups represented by Formulae CY2(1) to CY2(3),
a moiety represented by

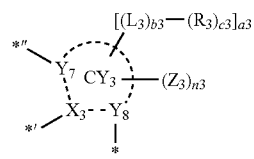

is selected from groups represented by Formulae CY3(1) to CY3(15), and
a moiety represented by

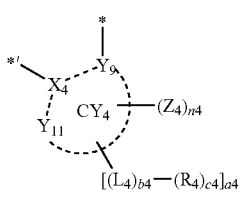

is selected from groups represented by Formulae CY4(1) to CY4(12):

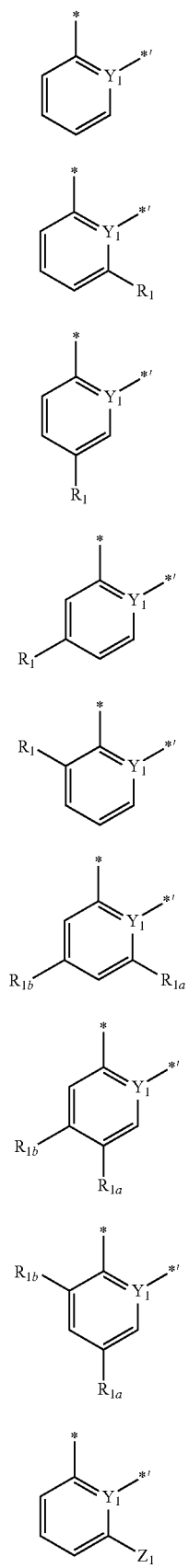
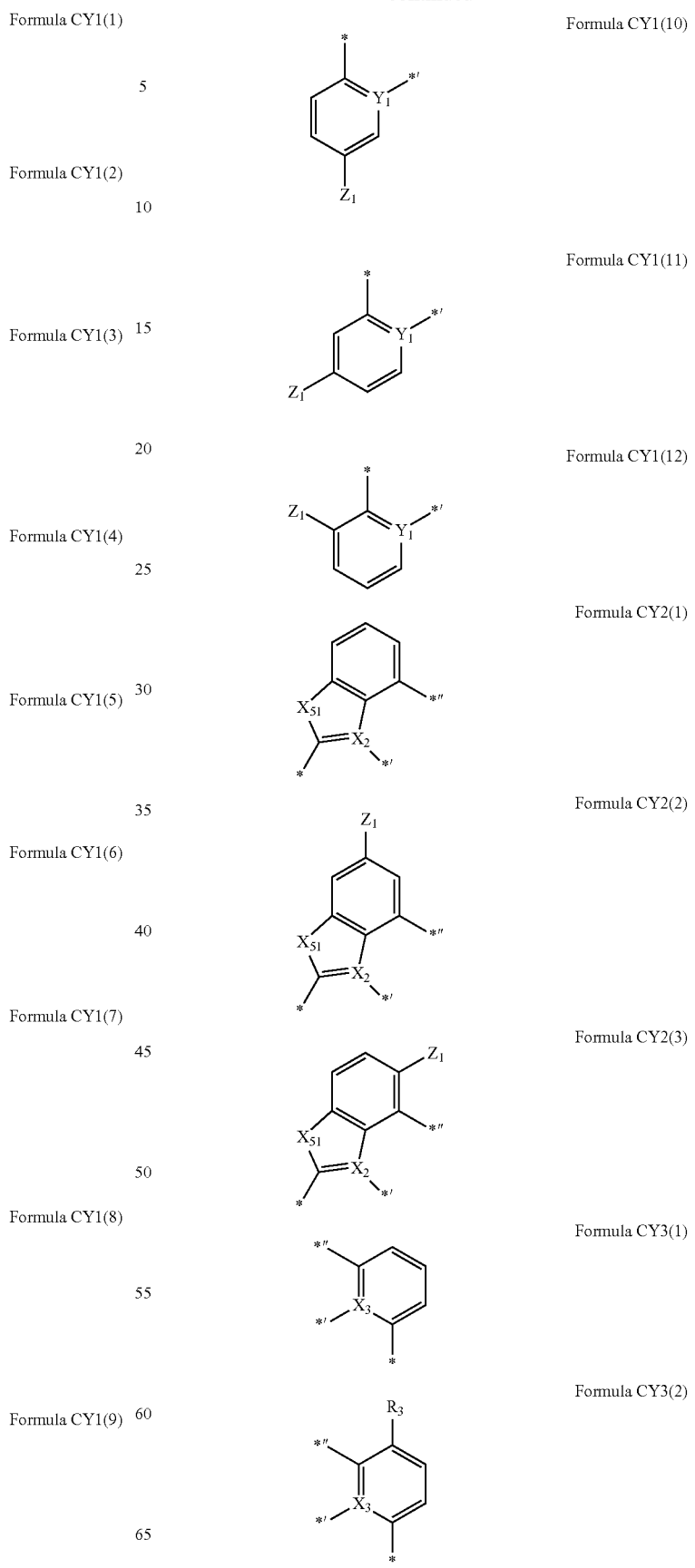

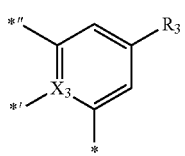
Formula CY3(3)
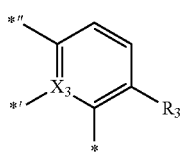
Formula CY3(4)
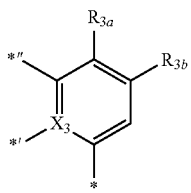
Formula CY3(5)
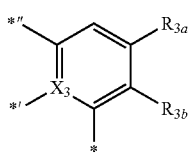
Formula CY3(6)
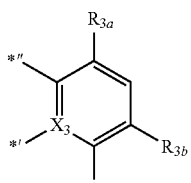
Formula CY3(7)
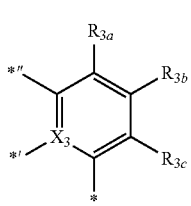
Formula CY3(8)
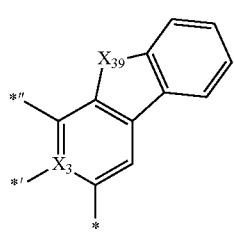
Formula CY3(9)
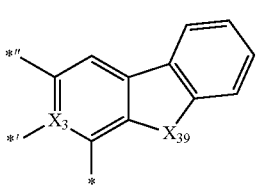
Formula CY3(10)
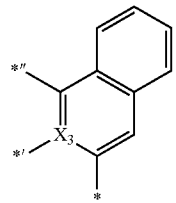
Formula CY3(11)
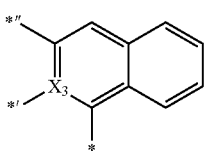
Formula CY3(12)
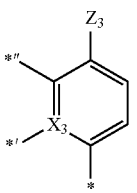
Formula CY3(13)
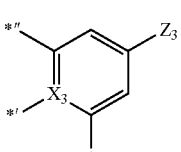
Formula CY3(14)
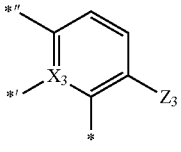
Formula CY3(15)
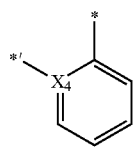
Formula CY4(1)
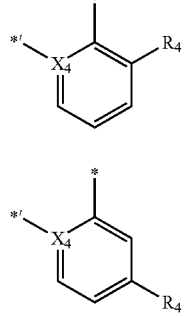
Formula CY4(2)
Formula CY4(3)
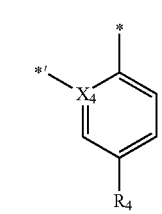
Formula CY4(4)

-continued

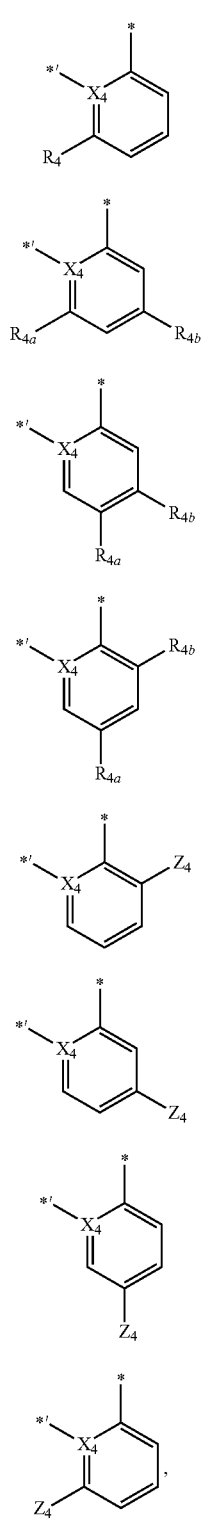

Formula CY4(5)
Formula CY4(6)
Formula CY4(7)
Formula CY4(8)
Formula CY4(9)
Formula CY4(10)
Formula CY4(11)
Formula CY4(12)

wherein, in Formulae CY1(1) to CY1(12), CY2(1) to CY2(3), CY3(1) to CY3(15), and CY4(1) to CY4(12), $Y_1$, $R_1$, $Z_1$, $X_2$, $Z_2$, $X_3$, $R_3$, $Z_3$, $X_4$, $R_4$, and $Z_4$ are each independently the same as described in claim 1, $R_{1a}$ and $R_{1b}$ are each independently the same as described in connection with $R_1$ in claim 1, $R_{3a}$ to $R_{3c}$ are each independently the same as described in connection with $R_3$ in claim 1, $Z_{4a}$ and $Z_{4b}$ are each independently the same as described in connection with $Z_4$ in claim 1, $X_{51}$ is O, S, $N[(L_7)_{b7}\text{-}(R_7)_{c7}]$, $C[(L_7)_{b7}\text{-}(R_7)_{c7}][(L_8)_{b8}\text{-}(R_8)_{c8}]$, $Si[(L_7)_{b7}\text{-}(R_7)_{c7}][(L_8)_{b8}\text{-}(R_8)_{c8}]$, or $C(=O)$, $L_7$, $L_8$, b7, b8, $R_7$, $R_8$, c7, and c8 are each independently the same as described in claim 1, $X_{39}$ is $C(R_{39a})(R_{39b})$, $N[(L_{39})_{b39}\text{-}(R_{39})_{c39}]$, O, S, or $Si(R_{39a})(R_{39b})$, $L_{39}$ is the same as described in connection with $L_3$ in claim 1, b39 and c39 are each independently the same as described in connection with b3 and c3 in claim 1, $R_{39a}$ and $R_{39b}$ are each independently the same as described in connection with $R_3$ in claim 1, $R_1$, $R_{1a}$, $R_{1b}$, $R_3$, $R_{3a}$ to $R_{3c}$, $R_4$, $R_{4a}$, and $R_{4b}$ are not hydrogen, and \*, \*', and \*" each indicate a binding site to a neighboring atom.

14. The organometallic compound of claim 13, wherein the organometallic compound satisfies at least one of Condition 1 to Condition 4:

Condition 1
a moiety represented by

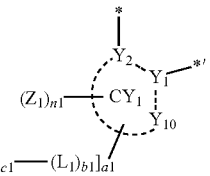

in Formula 1 is selected from groups represented by Formulae CY1(9) to CY1(12),

Condition 2
a moiety represented by

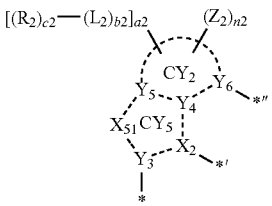

in Formula 1 is selected from groups represented by Formulae CY2(2) and CY2(3),

Condition 3
a moiety represented by

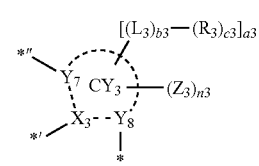

in Formula 1 is selected from groups represented by Formulae CY3(13) to CY3(15), and Condition 4
a moiety represented by
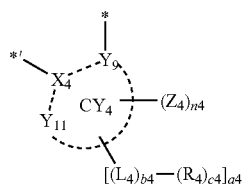
in Formula 1 is selected from groups represented by Formulae CY4(9) to CY4(12).
15. An organometallic compound of Compounds 1-101 to 1-112 and 1-201 to 1-228:
1-101
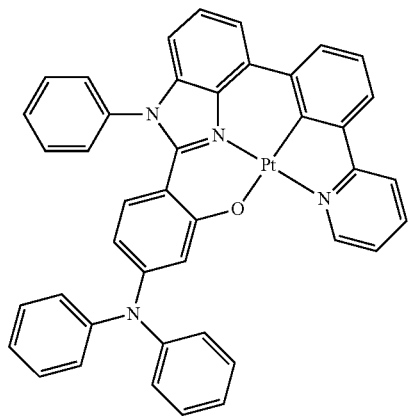
1-102
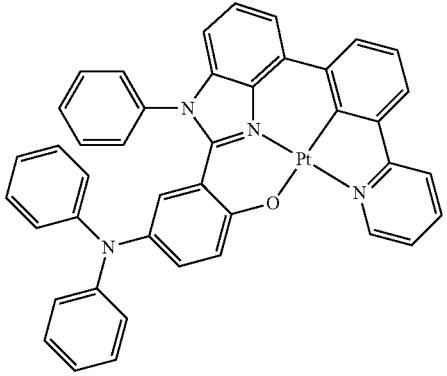
1-103
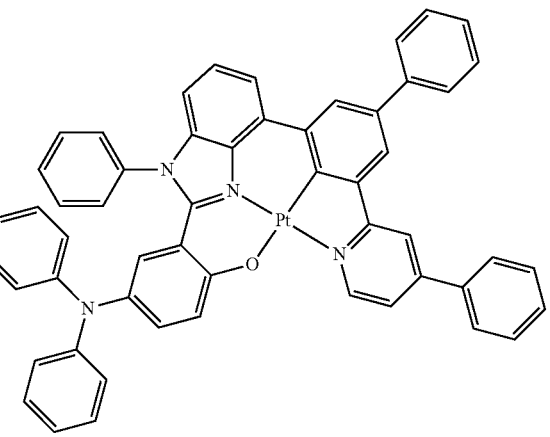
1-104
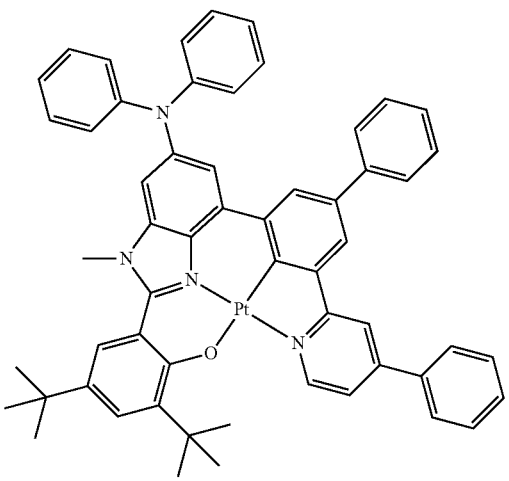
1-105
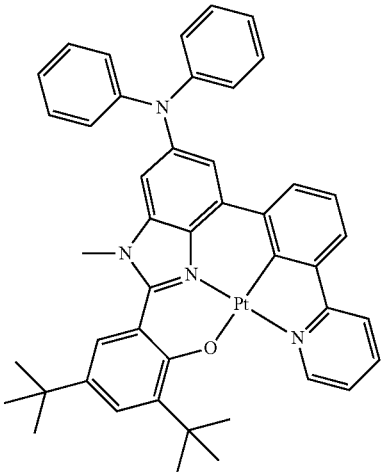
1-106
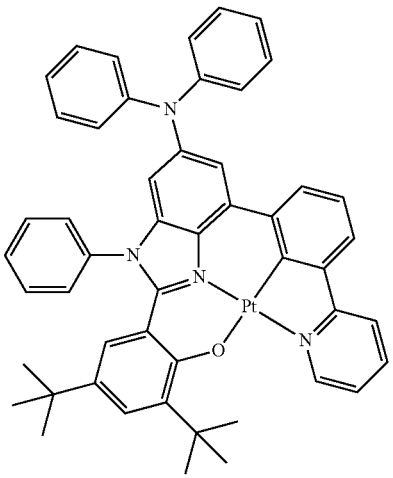

-continued
1-107
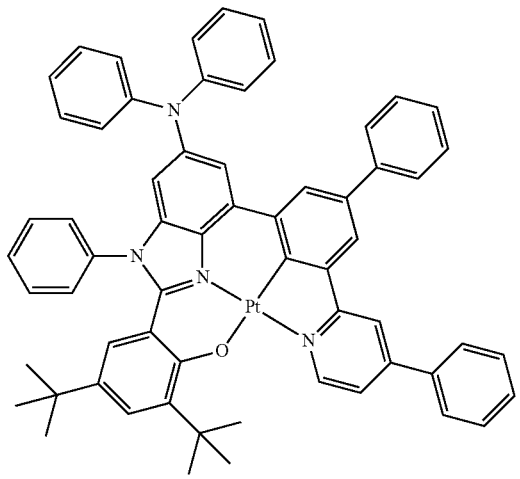
1-108
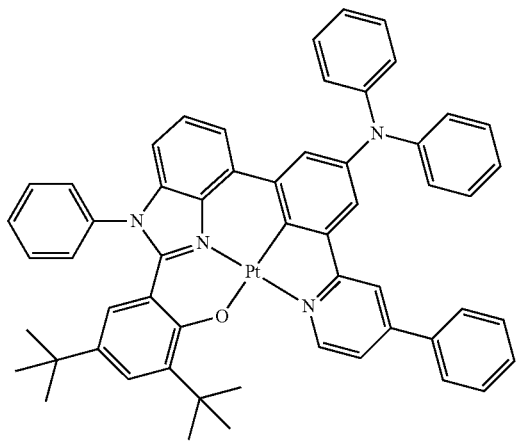
1-109
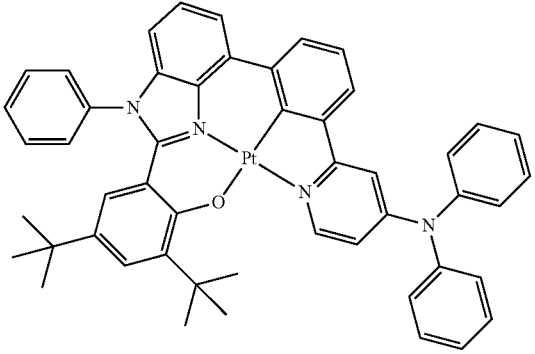
-continued
1-110
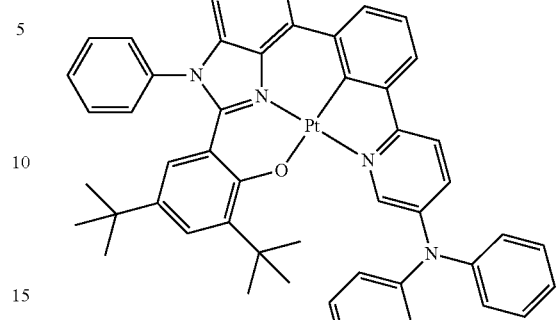
1-111
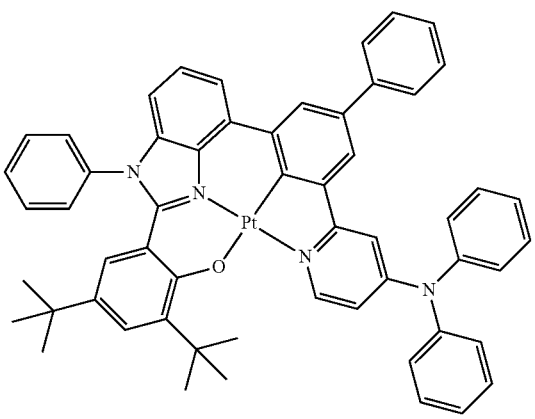
1-112
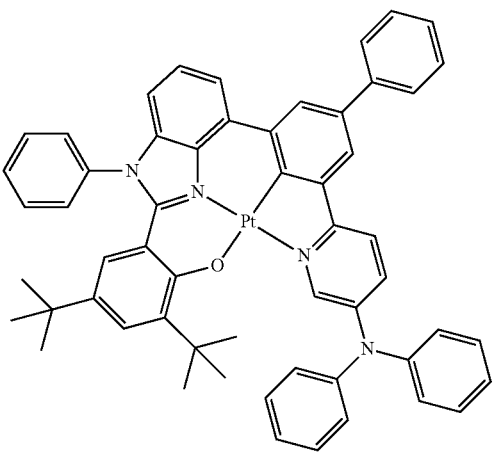

1-201
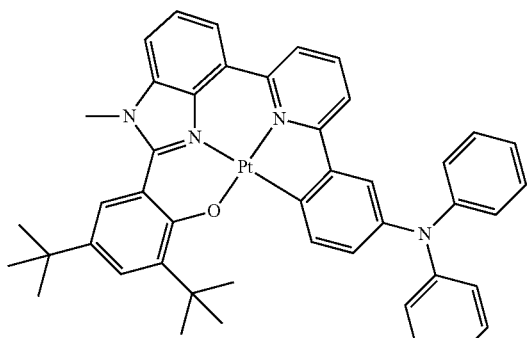
1-202
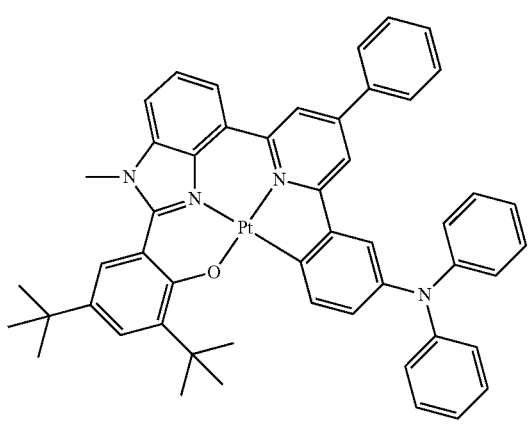
1-203
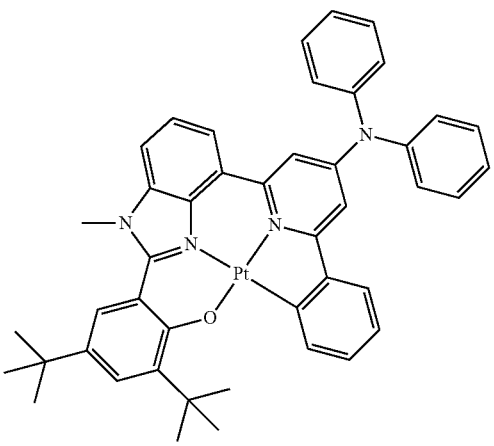
1-204
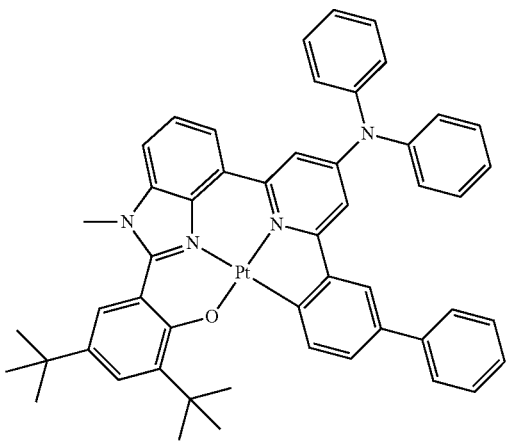
1-205
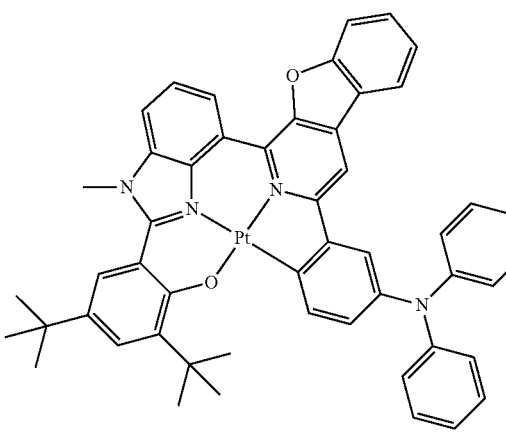
1-206
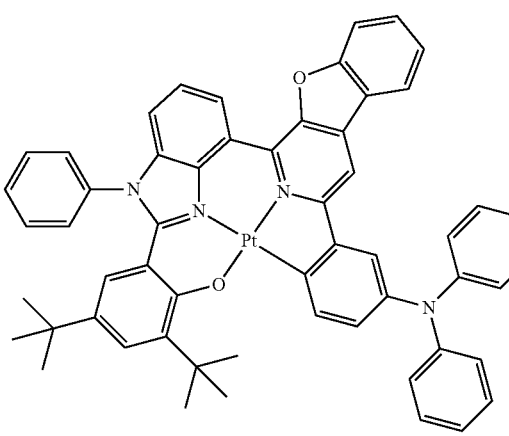

1-207
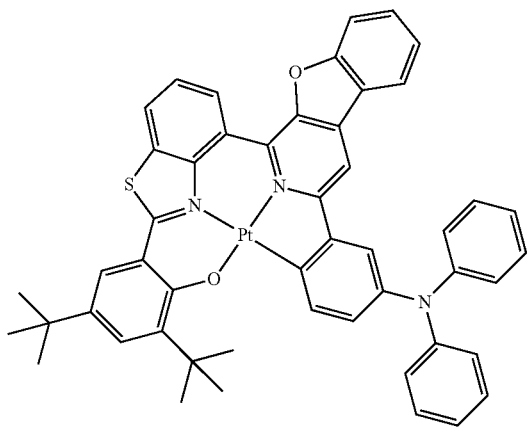
1-208
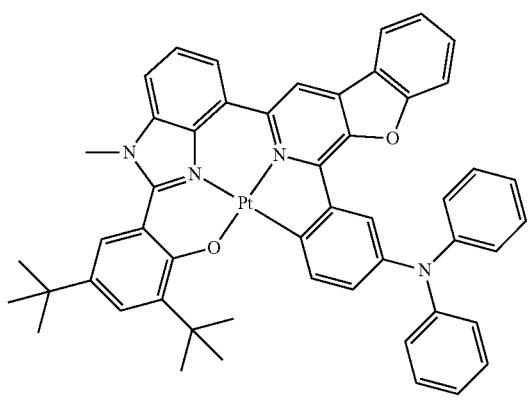
1-209
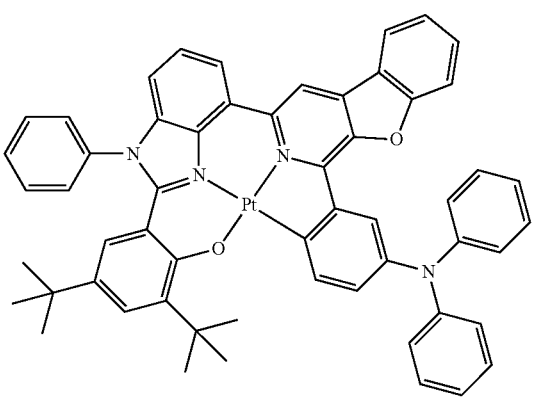
1-210
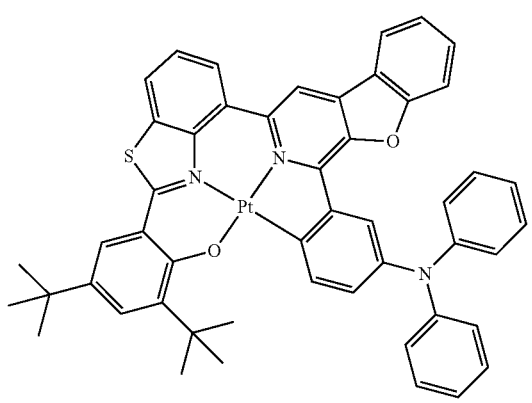
1-211
1-212
1-213

1-214
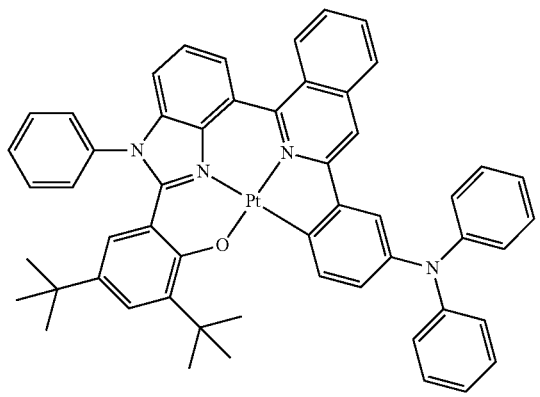
1-215
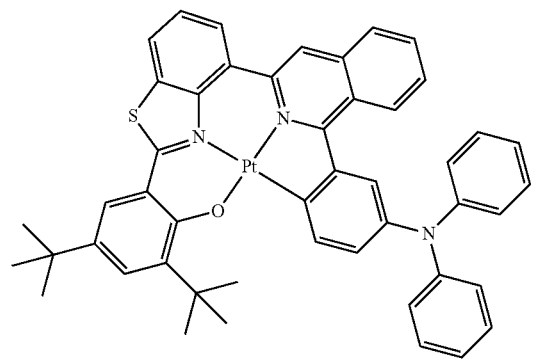
1-216
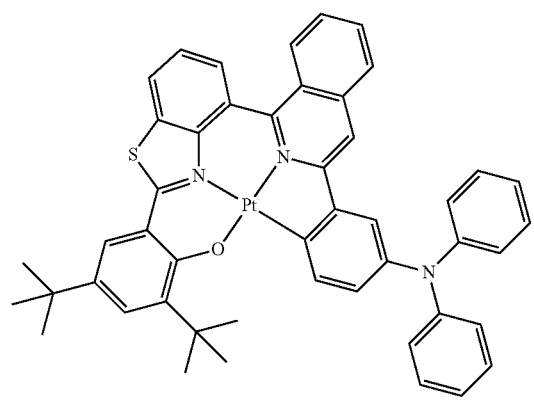
1-217
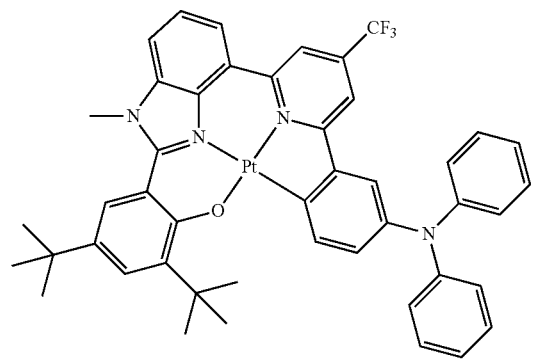
1-218
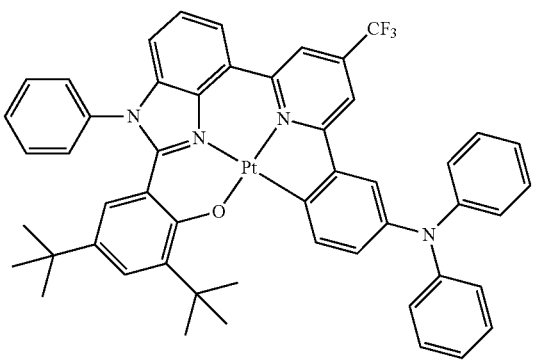
1-219
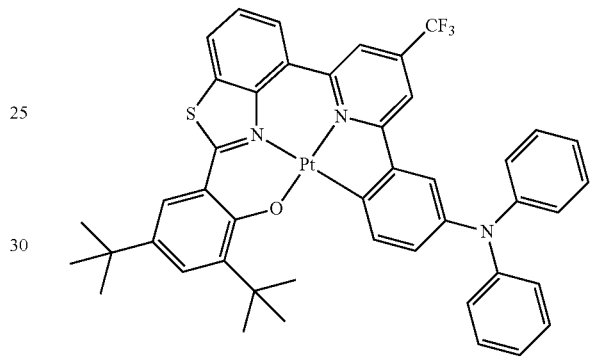
1-220
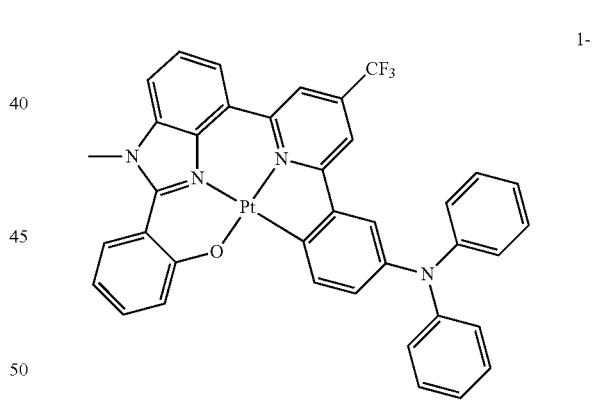
1-221
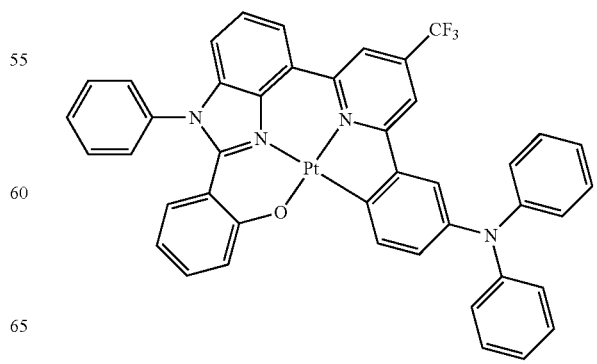

1-222
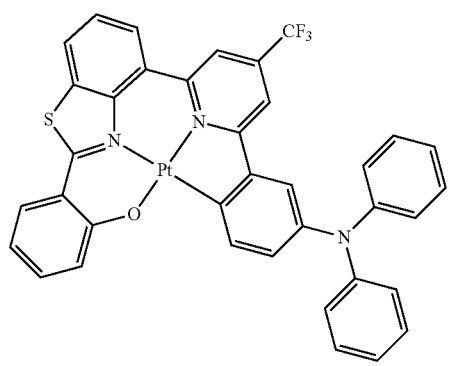
1-223
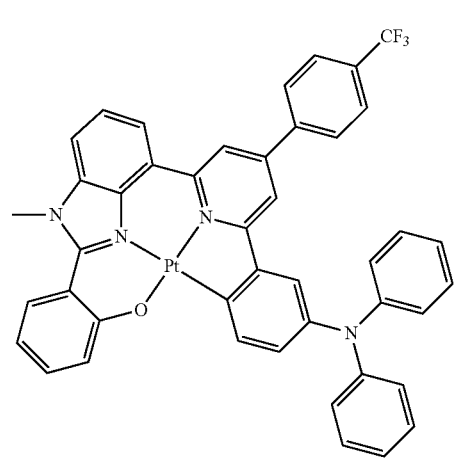
1-224
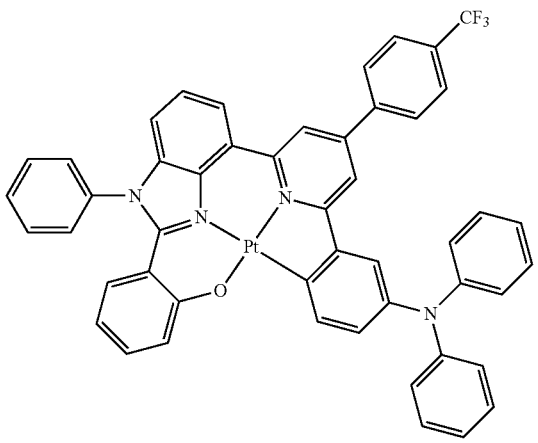
1-225
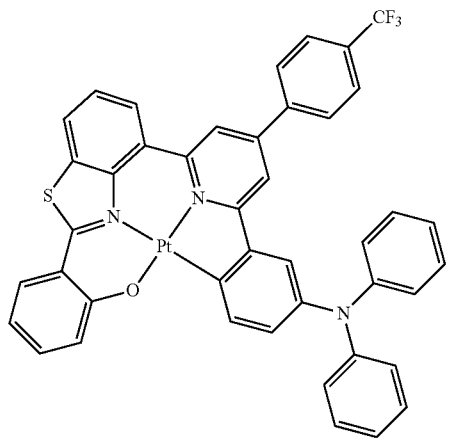
1-226
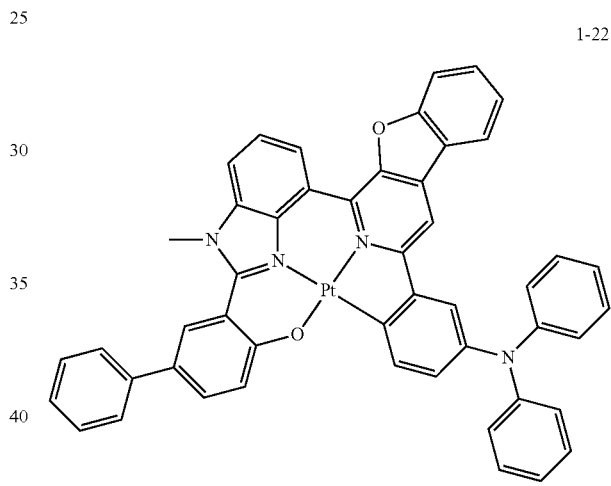
1-227
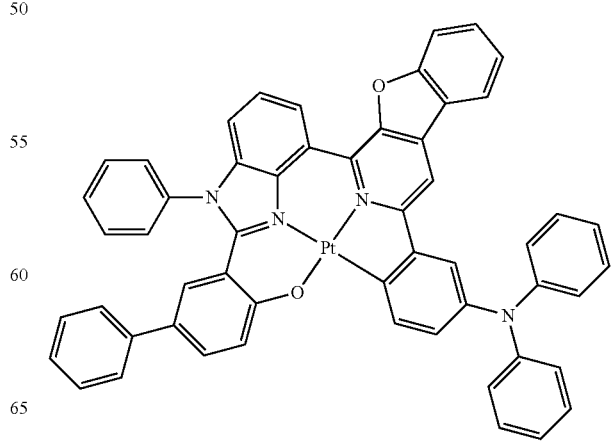

-continued 1-228

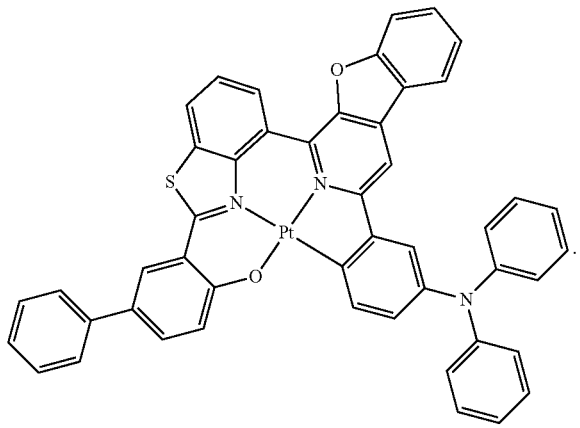

16. An organic light-emitting device comprising:
a first electrode;
a second electrode; and
an organic layer that is disposed between the first electrode and the second electrode, wherein the organic layer comprises an emission layer, and
wherein the organic layer comprises at least one organometallic compound of claim 1.

17. The organic light-emitting device of claim 16, wherein the first electrode is an anode,
the second electrode is a cathode, and
the organic layer further comprises a hole transport region disposed between the first electrode and the emission layer, and an electron transport region disposed between the emission layer and the second electrode,
wherein the hole transport region comprises a hole injection layer, a hole transport layer, an electron blocking layer, or any combination thereof, and
wherein the electron transport region comprises a hole blocking layer, an electron transport layer, an electron injection layer, or any combination thereof.

18. The organic light-emitting device of claim 16, wherein the emission layer comprises the organometallic compound.

19. The organic light-emitting device of claim 18, wherein the emission layer further comprises a host, and
an amount of the host is larger than an amount of the organometallic compound.

20. A diagnostic composition comprising at least one organometallic compound of claim 1.

* * * * *